United States Patent
Nishikawa et al.

(10) Patent No.: US 6,643,302 B1
(45) Date of Patent: Nov. 4, 2003

(54) COOLING DEVICE AND SURFACE EMITTING DEVICE COMPRISING SAME

(75) Inventors: Yuji Nishikawa, Yamanashi (JP); Hiroshi Takigawa, Isehara (JP)

(73) Assignee: Fanuc Ltd., Yamanashi (JP)

( * ) Notice: Subject to any disclaimer, the term of this patent is extended or adjusted under 35 U.S.C. 154(b) by 336 days.

(21) Appl. No.: 09/627,095

(22) Filed: Jul. 27, 2000

(30) Foreign Application Priority Data

Jul. 30, 1999 (JP) .......................................... 11-217007

(51) Int. Cl.[7] ................................................ H01S 3/04
(52) U.S. Cl. ............................ 372/35; 372/34; 372/36
(58) Field of Search ............................. 372/34, 35, 36, 372/69, 70, 75; 361/704

(56) References Cited

U.S. PATENT DOCUMENTS

| | | | |
|---|---|---|---|
| 4,494,171 A | * | 1/1985 | Bland et al. ................. 361/368 |
| 5,099,488 A | | 3/1992 | Abrabi et al. |
| 5,105,429 A | * | 4/1992 | Mundinger et al. ........... 372/34 |
| 5,105,430 A | * | 4/1992 | Mundinger et al. ........... 372/35 |
| 5,125,451 A | * | 6/1992 | Matthews ................... 165/80.4 |
| 5,727,618 A | * | 3/1998 | Mundinger et al. ......... 165/80.4 |
| 5,903,583 A | * | 5/1999 | Ullman et al. ................. 372/35 |
| 6,097,744 A | * | 8/2000 | Takigawa et al. ............. 372/34 |
| 6,192,596 B1 | * | 2/2001 | Bennett et al. ................. 34/76 |

FOREIGN PATENT DOCUMENTS

DE 43 15580 A1 11/1994 ........... H01S/3/043

OTHER PUBLICATIONS

Endriz, John G., et al., "High Power Diode Laser Arrays," IEEE J. of Quantum Elec., vol. 28, No. 4, Apr. 1992.

* cited by examiner

Primary Examiner—Paul Ip
Assistant Examiner—Phillip Nguyen
(74) Attorney, Agent, or Firm—Staas & Halsey LLP

(57) ABSTRACT

A cooling device is provided wherein are stacked cooling units on which laser diode arrays are mounted, comprising intake openings provided such that they pass through first portions in the cooling units in order to conduct cooling liquid about the peripheries of each of the laser diode arrays, outlet openings provided such that they pass through second portions of the cooling units in order to discharge to the outside of the cooling device the cooling liquid that has cooled each of the laser diode arrays, and inflow openings that pass through third portions in the cooling units, and are connected to the intake openings, and through which cooling liquid is supplied from the outside.

16 Claims, 38 Drawing Sheets

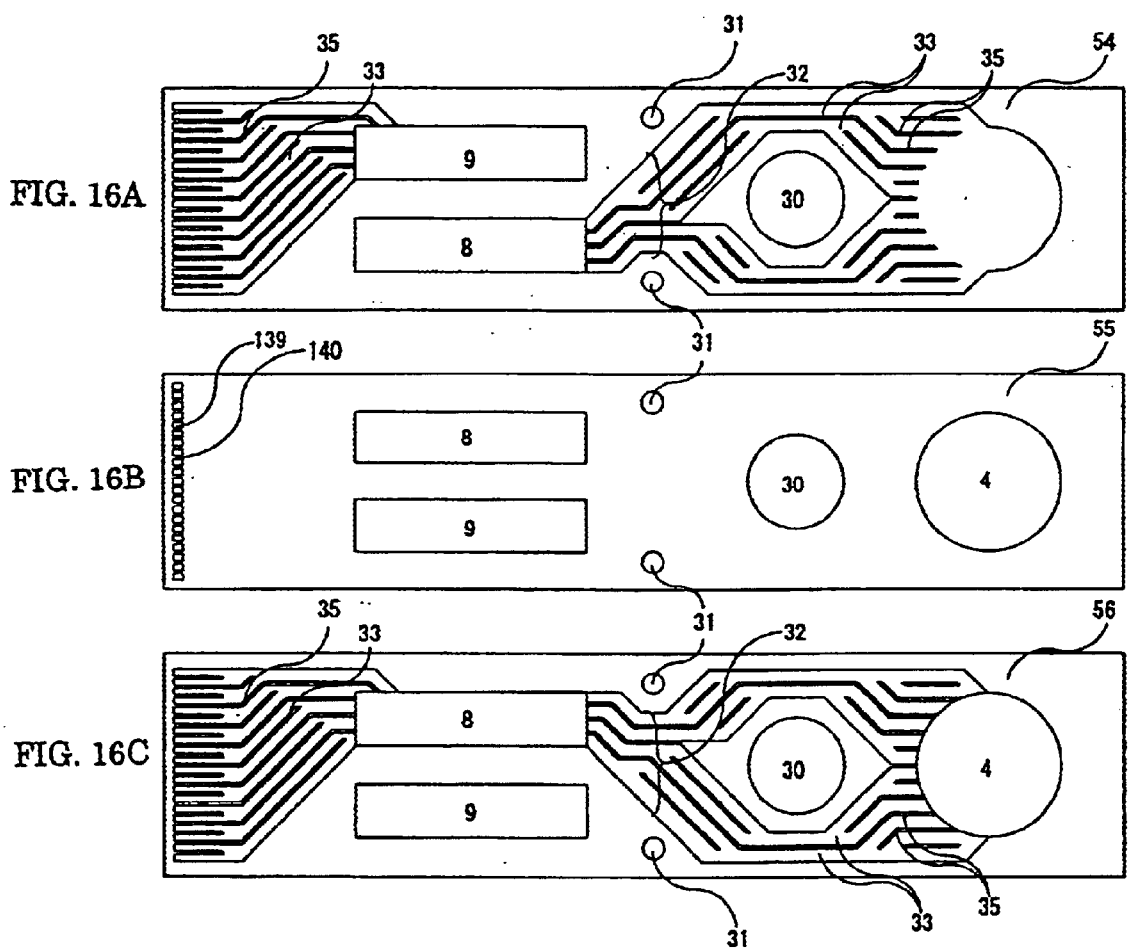

US 6,643,302 B1

COOLING DEVICE AND SURFACE EMITTING DEVICE COMPRISING SAME

BACKGROUND OF THE INVENTION

1. Field of the Invention

This invention relates to a cooling device, and more particularly to a cooling device for cooling laser diode arrays that release large quantities of heat and to a surface emitting device, configured from laser diode arrays, which comprises that cooling device.

2. Description of the Related Art

One application for the laser diode array is seen in light sources for exciting high-output solid lasers. In general, in such a high-output solid laser, when a high average output at the kW level is sought, it is necessary (a) that continuous laser light having a high intensity of 100 W/cm$^2$ or greater be generated in the laser diode array used as the excitation light source, and (b) that a large emitting surface area of several tens of cm$^2$ be available. Given the constraints of realizing a large light emitting surface area, a cooling device is indispensable in order both to release heat generated at a density of 100 to 200 W/cm$^2$ and to control the rise in temperature of the laser diode array.

In order for surface emitting light sources configured from such high-output laser diode arrays to be widely used in this field, it is very important that the cost per unit of light output be kept down.

FIG. 1A is a diagram of a surface emitting device 118 comprising a plurality of conventional one-dimensional laser diode arrays (hereinafter called laser bars), while FIG. 1B represents the configuration of the main parts of such a cooling device 119 for that surface emitting device.

As diagrammed in FIG. 1B, the heat generated by a laser bar 22 is conducted by a laser bar support plate 120, from there passes through an insulating plate 121 and a heat sink 122, and is discharged after heat exchange with a cooling liquid 123. For that reason, the thermal resistance between the laser bar 22 and the cooling liquid 123 will inevitably become comparatively high, so that the temperature of the laser bar 22 readily rises due to heat generation.

However, with a surface emitting device 118 that employs a cooling device 119 structured so that it cools the back surface of a two-dimensional laser diode array configured from a plurality of such laser bars 22, a configuration that makes almost the entire surface a light emitting surface is possible, as seen from the light emitting surface side, as diagrammed in FIG. 1A, wherefore, when an attempt is made to deploy an even larger plurality of these surface emitting devices to configure a surface emitting light source having a larger light emitting surface area, there are restrictions such as the degree of layout freedom being low and it being difficult to realize a surface emitting light source having few non-emitting parts.

FIG. 2 gives an exploded view representing the configuration of another type of a surface emitting device 124 comprising a plurality of conventional laser bars 22. As diagrammed in FIG. 2, each of the plurality of laser bars 22 is thermally connected to a separate cooling unit 125. The cooling liquid is made to flow into the cooling units 125 from a cooling liquid induction port (not visible in FIG. 2) that is connected to an intake opening 8 provided commonly for each of the cooling units 125, passes more or less directly below the positions where the laser bars 22 are deployed, and is then discharged from a cooling liquid discharge port 17 that is connected to an outlet opening 9 provided commonly for each of the cooling units 125. Hence the thermal resistance between the laser bars 22 and the cooling liquid can be made lower, and it becomes possible to hold down temperature rises in the laser bars 22 due to heat generation to a low level.

However, with a surface emitting device 124 wherein cooling devices are employed that have a structure that cools with cooling liquid immediately below the individual laser bars 22 in this manner, the non-emitting areas as seen from the light emitting surface side become great because of the deployment, on the outside of the stacked plurality of cooling devices, of an induction pipeline 14 for inducting the cooling liquid in from the intake opening and a discharge pipeline 16 for discharging the cooling liquid from the outlet opening, and the deployment of a tightening bolt 20 to prevent leakage of cooling liquid from between the cooling units 125 and 125. For that reason, when an attempt is made to deploy an even larger plurality of these surface emitting devices to configure a surface emitting light source having a larger light emitting surface area, there are restrictions such as the degree of layout freedom being low and it being difficult to realize a surface emitting light source having few non-emitting parts.

In FIG. 2, the intervals in the cooling device are represented as being wider than at the time of actual use, in the interest of making the configuration easy to understand, and the diagram shows neither the sealing material used to prevent the cooling liquid from leaking out from between the cooling units 125 and 125 nor the wiring connection board connecting to an electrode on the side of the laser bars not connected to the cooling devices.

FIG. 3 provides an exploded view of an example configuration of the cooling device diagrammed in FIG. 2. As diagrammed in FIG. 3, the cooling unit 125 is made up of a first thin plate 126, a second thin plate 127, a third thin plate 128, a fourth thin plate 129, and a fifth thin plate 130, stacked sequentially from the top.

A cooling liquid intake opening 8 and outlet opening 9 are formed in the first thin plate 126.

In the second thin plate 127, an outlet opening 8 is formed in a position corresponding to the outlet opening 9 in the first thin plate 126. A cooling liquid flow channel 131 is also formed therein, extending from a position corresponding to the intake opening 8 of the first thin plate 126 such that the width thereof widens as the front end surface 12 is approached. Microchannels 133 are also formed therein, near a front end surface 12, along that front end surface 12.

In the third thin plate 128, an intake opening 8 and an outlet opening 9 are formed at positions corresponding to the cooling liquid intake opening 8 and outlet opening 9 of the first thin plate 126. A slit 132 is also formed therein, near the front end surface 12, along that front end surface 12.

In the fourth thin plate 129, an intake opening 8 is formed at a position corresponding to the intake opening 8 of the third thin plate 128. A cooling liquid passage 131 is also formed so as to extend from a position corresponding to the outlet opening 9 of the third thin plate 126 towards the front end surface 12 while increasing the width thereof.

In the fifth thin plate 130, an intake opening 8 and an outlet opening 9 are formed at positions corresponding to the cooling liquid intake opening 8 and outlet opening 9 of the first thin plate 126.

The first to fifth thin plates 126 to 130 described above, respectively, are made of a highly thermally conductive material such as copper, for example, and are mutually stacked together. Cooling liquid inducted from the intake openings 8 passes through the microchannels 133 in the second thin plate and is discharged from the outlet openings 9. When this occurs, the laser bar (not shown) deployed along the front end surface 12 of the fifth thin plate 130 is cooled. In the microchannels 133, very fine flow channels, having a width of 20 μm or so, are formed, by laser processing or the like, in order to prevent the heat exchanging efficiency from falling due to a cooling liquid boundary layer.

FIG. 4 is an exploded view of the configuration of a cooling device disclosed in Japanese Patent Application Laid-Open No. 209531/1998. This cooling device is a different type from that diagrammed in FIG. 3 which is for cooling one one-dimensional laser diode array.

As diagrammed in FIG. 4, the cooling device 134 is configured by three plate-form members 135, 136, and 137 which are made of a material such as copper which exhibits high thermal conductivity. On the lower surface of the plate-form member 135 on the upper side (that is, the surface facing the plate-form member 136 on the inside) are formed grooves like the pattern of grooves 33 formed on the upper surface of the plate-form member 137 on the lower side (that is, the surface facing the plate-form member 136 on the inside).

The grooves 33 described above, which are formed on the lower surface of the plate-form member 135 on the upper side and on the upper surface of the plate-form member 137 on the lower side configure cooling water channels 138. Ridges 35 that divide the grooves 33 from adjacent grooves 33 on the lower surface of the plate-form member 135 on the upper side are connected thermally and mechanically to the plate-form member 136 in the middle. In the plate-form member 136 in the middle, instead of the slit 132 diagrammed in FIG. 3, a plurality of very small through holes 139 that are mutually independent is formed, and bridges 140 between those very small through holes 139 and 139 contribute both to thermal conductivity and to the prevention of deformity in this middle plate-form member 136.

Because of the structure described above, with the plate-form member 135 on the upper side and the plate-form member 136 on the inside, the thermal connection between the three plate-form members 135, 136, and 137 is improved. Accordingly, by efficiently dispersing the heat generated by the laser bar 22 within the wide scope of this cooling device 134, not only is outstanding cooling performance achieved, but the mechanical strength of the cooling device 134 is also improved.

With the cooling device 134 described in the foregoing, the process steps for forming the plate-form members can be performed by chemical etching, wherewith many process steps can be done simultaneously, and many cooling devices can also be assembled simultaneously, so low-cost manufacturing is possible.

With the cooling device 134, as described in the foregoing, cooling devices exhibiting outstanding cooling performance can be realized at low cost. However, even in surface emitting devices using this cooling device 134, more non-emitting areas develop, as seen from the light emitting surface side, just as with the surface emitting device diagrammed in FIG. 2. That being so, when an attempt is made to deploy an even larger plurality of these surface emitting devices to configure a surface emitting light source having a larger light emitting surface area, because the degree of layout freedom is low, there are restrictions such as that it is difficult to realize a surface emitting light source having few non-emitting parts.

In the surface emitting device comprising the cooling device 119 diagrammed in FIG. 1B described earlier, on the other hand, it is possible to make the configuration one wherein almost the entire surface is a light-emitting surface, seen from the light-emitting surface side, as in the surface emitting device 118 diagrammed in FIG. 1A. That being so, when an attempt is made to deploy an even larger plurality of these surface emitting devices 118 to configure a surface emitting light source having a larger light emitting surface area, the degree of layout freedom is high, wherefore there is a benefit in being able to make a surface emitting light source having few non-emitting parts.

On the other hand, however, the heat generated by the laser bar 22 is conducted through the bar support plate 120, from there passes through the insulating plate 121 and heat sink plate 122, and is discharged after heat exchange with the cooling liquid 123, wherefore the thermal resistance between the laser bar 22 and the cooling liquid 123 inevitably becomes higher. As a result, there is a limitation on the electrical current that can be input into the laser bar 22, and it becomes very difficult to raise the light output per laser bar 22.

Thereupon, when the thickness of the bar support plate 120 is made thicker in an attempt to lower the thermal resistance, even if only slightly, in order to raise the light output per laser bar 22, the laser bar 22 pitch becomes greater, and, as a consequence, the light output intensity that is the light output per unit light emitting surface area in the surface emitting device is still kept low, so there is still a problem.

Furthermore, when the electric current input is increased and the light output is set high in order to avoid this problem even if only to a slight extent, problems arise in that the laser bar temperature becomes higher, the speed of laser bar property deterioration rises, and reliability declines.

In the surface emitting device comprising the cooling device 119 diagrammed in FIG. 1B, moreover, an assembly operation is necessary to densely implant the bar support plates 120 to which the laser bars 22 are bonded in the insulating plate by soldering or the like. This is not an efficient operation, so the assembly requires considerable time, which pushes costs up. This is a problem.

In the surface emitting device comprising the cooling device 119 diagrammed in FIG. 1B described earlier, furthermore, it is very difficult to preliminarily inspect and select the individual laser bars 22 in their actual working condition, and the operation of changing out some laser bars 22 whenever their characteristics deteriorate after they are assembled into the surface emitting device is also very difficult, causing surface emitting device yield to decline and costs to be higher. These are problems.

In the surface emitting device 124 comprising a cooling device wherein a plurality of the cooling units 125 diagrammed in FIG. 2 and described earlier, on the other hand, the laser bars 22 are thermally connected to the individual cooling units 125, respectively, wherefore the cooling liquid can be made to flow more or less directly below the positions where the laser bars 22 are deployed. Accordingly, if improvements are made so that the heat exchange between the cooling liquid and the inner walls of the water channels inside the cooling units near the laser bars 22 is done efficiently, it becomes possible to keep down the heat resistance between the laser bar 22 and the cooling liquid, thereby holding temperature rises in the laser bars 22 due to heat generation down to a low level.

That being so, as based on this surface emitting device 124, even in a condition wherein multiple laser bars 22 are deployed with a comparatively small pitch, the current input can be increased and the light output per laser bar 22 increased, without sacrificing the reliability of the laser bars 22, as a consequence whereof the advantage is gained of being able to realize a surface emitting device that exhibits high light output intensity. On the down side, however, as diagrammed in FIG. 2, the non-emitting areas as seen from the light emitting surface side become great because of the deployment, on the outside of the stacked plurality of cooling units 125, of a pipeline for inducting the cooling liquid in the intake opening 8 and a pipeline for discharging the cooling liquid from the outlet opening 9, and the deployment of a tightening bolt 20 to prevent leakage of cooling liquid from between the cooling units 125 and 125. As a consequence, when an attempt is made to deploy an even larger plurality of these surface emitting devices to configure a surface emitting light source having a larger light emitting surface area, the degree of layout freedom will be low and, depending on the shape of the surface emitting light source required, it will be difficult to realize a surface emitting light source having few non-emitting parts, which is a problem.

The size of the light-emitting surface in the direction perpendicular to the direction in which the cooling units are stacked can be made large by deploying a plurality of the surface emitting devices diagrammed in FIG. 2 adjacent to each other in that direction. When an attempt is made to make the size of the light-emitting surface larger in the direction in which the cooling units are stacked, however, a plurality of the surface emitting devices diagrammed in FIG. 2 cannot be deployed proximately in that direction, whereupon a wide non-light-emitting part develops, and a problem arises in that the solid laser medium can no longer be uniformly excited.

In this case, it is possible to increase the number of stacked cooling units, and to some extent make the size of the light-emitting surface in the direction in which the cooling units are stacked larger. However, the upper limit on the number of cooling units that can be stacked is normally about 30. When an attempt is made to stack a greater number than that, problems are encountered in that it becomes very difficult to evenly supply the cooling liquid to the cooling units, and assembly also becomes difficult.

Furthermore, when, in the surface emitting device 124 comprising the cooling device diagrammed in FIG. 2, cooling units are used which have the microchannels 133 so that the heat exchange between the cooling liquid and the inner walls of the water channels inside the cooling units near the laser bars can be done efficiently, as in the cooling unit 125 diagrammed in FIG. 3 described earlier, problems arise in that it is very difficult to form the very fine structures of the microchannels 133 by conventional chemical etching, whereupon laser processing is used, wherefore it is necessary to process the thin plates 126 to 130 one plate at a time, and processing costs escalate.

A minimum of five of the thin plates configuring the cooling unit 125 are necessary. However, when many thin plates are stacked together in this manner, problems arise in that the yield declines when bonding these together in an airtight structure so that the cooling liquid will not leak, and the cost of manufacturing the surface emitting device increases.

In more specific terms, because the thin plates are made of copper, they are readily deformed by the heat and pressure brought to bear on them during processing, particularly when joining them together by diffusion welding or the like.

The parts corresponding to the adjacent copper thin plates that cover the cooling liquid flow channels cut out by laser beam are particularly susceptible to being crushed, and similar deformation readily occurs in the cooling unit front end surface 12 of the thin plate 128 wherein the slot 132 is formed. Furthermore, such deformations in the cooling unit 125 distort the laser bar 22 mounted thereon and, as a result, cause the laser bar characteristics to deteriorate.

When the cooling device 134 diagrammed in FIG. 4, noted earlier, is used instead of the cooling unit 125 diagrammed in FIG. 3, the thermal connection among the three plate-form members 135 to 137 described earlier is improved. This is due to the following two reasons.

(a) The ridges 35 forming the grooves 33 configuring the cooling water channels 138 on the plate-form member 137 on the lower side are connected thermally and mechanically to the plate-form member 136 on the inside that is deployed on the upper side of that plate-form member 137.

(b) In the plate-form member 136 on the inside, as noted above, multiple very small through holes 139 which are mutually independent are provided instead of the slit, and the bridges 140 between those very small through holes 139 contribute both to thermal conductivity and to the prevention of deformity in the plate-form member 136.

With the cooling device 134 diagrammed in FIG. 4, moreover, by efficiently diffusing the heat generated by the laser bar 22 within the wide scope of the cooling unit 134, outstanding cooling performance is realized, even without using the microchannels 133, and the mechanical strength of the cooling unit 134 is enhanced.

With the cooling unit 134 described above, furthermore, the process steps for forming the plate-form members described above can by done by chemical etching wherewith many such processes can be done simultaneously, and many cooling units can also be assembled simultaneously, wherefore low-cost manufacturing is possible.

Thus, with the cooling unit 134 described in the foregoing, a cooling unit can be realized that exhibits outstanding cooling performance at low cost, whereupon almost all of the problems associated with the cooling unit 125 diagrammed in FIG. 3 are resolved. Nevertheless, even in this surface emitting device in which this cooling unit 134 is used, the non-light-emitting area as seen from the light-emitting surface side increases in a similar manner to FIG. 2, and, when an attempt is made to deploy an even larger plurality of these surface emitting devices to configure a surface emitting light source having a larger light emitting surface area, there are restrictions, due to the fact that the degree of layout freedom is low, such as that it will in some cases be difficult to realize a surface emitting light source having few non-emitting parts.

OBJECT AND SUMMARY OF THE INVENTION

An object of the present invention is to provide a cooling device that has high cooling capacity and also facilitates a large degree of freedom in the layout of the objects to be cooled, and is also to provide together with a surface emitting device made up of a plurality of laser diode arrays comprising that cooling device.

A more specific object thereof, in cases where the objects to be cooled are laser diode arrays, is to realize, at low cost, a large-scale surface emitting light source that exhibits high light output intensity per laser diode array as a consequence of there being few non-light-emitting parts as seen from the light-emitting surface side, and of the thermal resistance between the laser diode arrays and the cooling liquid being low.

In order to achieve the objects stated above, the cooling device according to the present invention is a cooling device that is formed by stacking up cooling units to which objects to be cooled are mounted, comprising: a first cooling liquid supply passage deployed so as to pass through first portions of the cooling units in order to conduct the cooling liquid about the periphery of each of the objects to be cooled; a cooling liquid discharge passage deployed so as to pass through second portions of the cooling units in order to discharge the cooling liquid that has cooled each of the objects to be cooled to the outside of the cooling device; and a second cooling liquid supply passage that passes through third portions of the cooling units, and is connected to the first cooling liquid supply passage, wherewith cooling liquid is supplied from the outside.

The cooling device according to the present invention is configured as described above, wherefore the degree of freedom in the layout of the objects to be cooled can be increased while maintaining the cooling capacity relative to the objects to be cooled. Here, each of the cooling units noted above can be made to be such that it comprises a primary cooling unit that has two holes provided therein that open respectively to the first cooling liquid supply passage and the cooling liquid discharge passage, and a secondary cooling unit that has at least three holes provided therein that open, respectively, to the first cooling liquid supply passage, the cooling liquid discharge passage, and the second cooling liquid supply passage.

The secondary cooling units, furthermore, can be made such that they connect the first cooling liquid supply passage and the second cooling liquid supply passage, and also comprise a plurality of flow channels divided by ridges. Thus, by forming a plurality of flow channels divided by ridges, cooling units deployed adjacently to each other are supported by the ridges, wherefore the deformation thereof can be prevented.

The cooling device described in the foregoing can also be made such as to comprise pressure bonding means for pressure bonding the stacked cooling units.

By such means, cooling liquid can be prevented from leaking from between the cooling units. A belt that securely tightens the stacked cooling units can be made the pressure bonding means noted above.

If the cooling units are securely tightened together by a belt or belts as described above, not only can the cooling unit structure be simplified, but the widths of the first and second cooling liquid supply passages and cooling liquid discharge passage described earlier can be made wider, so that pressure loss can be reduced.

The cooling device described in the foregoing can also be made such that, in addition to a plurality of cooling units being deployed so that they are lined up, a cooling liquid induction pipeline is also provided which is connected to all of the second cooling liquid supply passages contained in the cooling units that are deployed so that they are lined up.

The cooling device described in the foregoing can also be made such that a second cooling liquid discharge passage is provided that discharges the cooling liquid to the outside of the cooling device, being connected to the cooling liquid discharge passage and also passing through fourth portions of the cooling units.

The cooling device described in the foregoing can also be made such that the cooling units comprise a first cooling unit wherein are provided two holes that open, respectively, to the first cooling liquid supply passage and the cooling liquid discharge passage, a second cooling unit wherein are provided at least three holes that open, respectively, to the first cooling liquid supply passage, the cooling liquid discharge passage, and the second cooling liquid supply passage, and a third cooling unit wherein are provided at least three holes that open, respectively, to the first cooling liquid supply passage, the second cooling liquid supply passage, and the second cooling liquid discharge passage that is connected to the cooling liquid discharge passage described earlier.

The cooling device described in the foregoing can also be made such that, in addition to a plurality of cooling units being deployed so that they are lined up, a cooling liquid discharge pipeline is also provided which is connected to all of the second cooling liquid discharge passages contained in the cooling units that are deployed so that they are lined up.

If the configuration is made in this way, the transfer of cooling liquid between the cooling device and the outside can be effected easily.

In order to achieve the objects stated above, furthermore, the surface emitting device according to the present invention is a surface emitting device wherein laser diode arrays mounted to cooling units are stacked up, comprising: a first cooling liquid supply passage deployed so as to pass through first portions of the cooling units in order to conduct the cooling liquid about the periphery of each of the laser diode arrays; a cooling liquid discharge passage deployed so as to pass through second portions of the cooling units in order to discharge the cooling liquid that has cooled each of the laser diode arrays to the outside of the surface emitting device; and a second cooling liquid supply passage that passes through third portions of the cooling units, and is connected to the first cooling liquid supply passage, wherewith cooling liquid is supplied from the outside.

The surface emitting device according to the present invention is configured as described in the foregoing, wherefore a surface emitting device can be obtained wherein laser diode arrays are deployed in higher density.

Here, the surface emitting device described above can be made to comprise a belt or belts for securely tightening the stacked cooling units.

Also, the surface emitting device described above can be made to comprise also a lens or lenses held by the belt or belts noted above, deployed facing the surface formed by the stacked laser diode arrays.

With the configuration described above, a high-output surface emitting device can be obtained which generates the desired light.

Based on the present invention, cooling devices can be realized which have high cooling capacity and allow a great degree of freedom in deploying the objects to be cooled. When those objects to be cooled are laser diode arrays, a surface emitting device can be obtained which has high light output intensity and little non-light-emitting area as viewed from the light-emitting surface formed by the laser diode arrays.

As based on the present invention, moreover, while effecting a structure wherein there are few non-light-emitting parts as viewed from the light-emitting surface side, as noted above, cooling liquid can be supplied from the back side so that cooling liquid can be supplied as far as immediately below all of the laser diode arrays. Accordingly, a surface emitting device can be obtained which exhibits uniform light emission intensity, wherewith the occurrence of light emission intensity irregularity induced by laser diode array temperature differences caused by differences in cooling capacity can be suppressed.

Also, if the flow channels formed in the second cooling unit become too wide, the mechanical strength of the cooling unit will decline, so that deformations will arise, such as the cavity portion inside the flow channels being crushed during the process of joining the cooling units together wherein pressure is applied and the temperature is raised, for example. That will lead to the flow channels becoming blocked or to cooling liquid leakage, and the assembly yield will decline. That being so, the multiple flow channels are divided by the ridges to prevent cooling unit deformation, and it thereby becomes possible to fabricate highly reliable cooling units having good mechanical strength with good production yield.

Also, by configuring the cooling units of electrically conductive materials having a coefficient of thermal conductivity of 1.5 W/cm/K or greater, it becomes possible to efficiently discharge the heat generated by the objects to be cooled into the cooling liquid, and outstanding cooling performance can be realized. All of the cooling units stacked up can be fabricated from the same material, moreover, making it possible to unify the fabrication processes and to reduce fabrication costs.

Also, by additionally providing pressure bonding means for pressure bonding the stacked cooling units, the cooling liquid can be inducted as far as immediately below the objects to be cooled, and a cooling device that exhibits very high cooling performance can be obtained, even without using a tightening bolt to prevent cooling liquid leakage. That being so, by providing such a cooling device as this, in cases where the objects to be cooled are laser diode arrays, surface emitting devices can be obtained which exhibit high light output intensity, having little non-light-emitting area as seen from the light-emitting surface side.

By using a belt or belts that securely tightens the cooling units as the pressure bonding means, it becomes possible to tighten the cooling units across a broad width, whereupon, not only is the problem of cooling unit warping eliminated, but, when such cooling units are used, surface emitting devices can be obtained wherein the non-light-emitting surface area is even smaller as seen from the light-emitting surface. It is also then unnecessary to provide holes in the cooling units for a tightening bolt, the overall length of the cooling units can be made short, and cooling unit fabrication costs can be reduced.

Also, the belt or belts noted above can also be used as an outer protective container for protecting the laser diode arrays. While reducing the danger of inadvertently damaging the laser diode arrays during maintenance, etc., a surface emitting device can be realized which, inclusive of the outer protective container, has few non-light-emitting parts as seen from the light-emitting surface. And, as compared to loading the surface emitting device inside a separately prepared outer protective container, surface emitting devices equipped with outer protective containers can be obtained at lower cost.

Also, by using the belt described in the foregoing that serves also as an outer protective container to hold a lens or lenses for collimating the laser beams from the laser diode arrays and converting them to parallel light, etc., the lens or lenses can be deployed with good precision, without making the overall device size large, and low-cost surface emitting devices can be obtained.

Also, by having a plurality of cooling units deployed so that they are lined up, and further providing a cooling liquid induction pipeline that is connected to all of the second cooling liquid supply passages, a cooling device is obtained wherewith the cooling liquid can be inducted from the outside without increasing the number of pipelines. By so doing, many of the cooling devices described above can be arranged and devices wherein the objects to be cooled are highly integrated can be easily fabricated.

BRIEF DESCRIPTION OF THE DRAWINGS

Other objects and characteristics of the present invention described in the foregoing should become clear from the descriptions of the embodiments which follow, with reference to the attached drawings.

FIGS. 16A to 16C, respectively, are plans of the three plate-form members used in a large cooling unit for configuring a cooling device relating to a third embodiment of the present invention;

DETAILED DESCRIPTION OF THE PREFERRED EMBODIMENTS

Embodiments of the present invention are now described in detail, with reference to the drawings. Identical or equivalent components are indicated by the same symbol.

First Embodiment

A first embodiment of the present invention is now described with reference to FIGS. 5 to 13.

Figure 5:
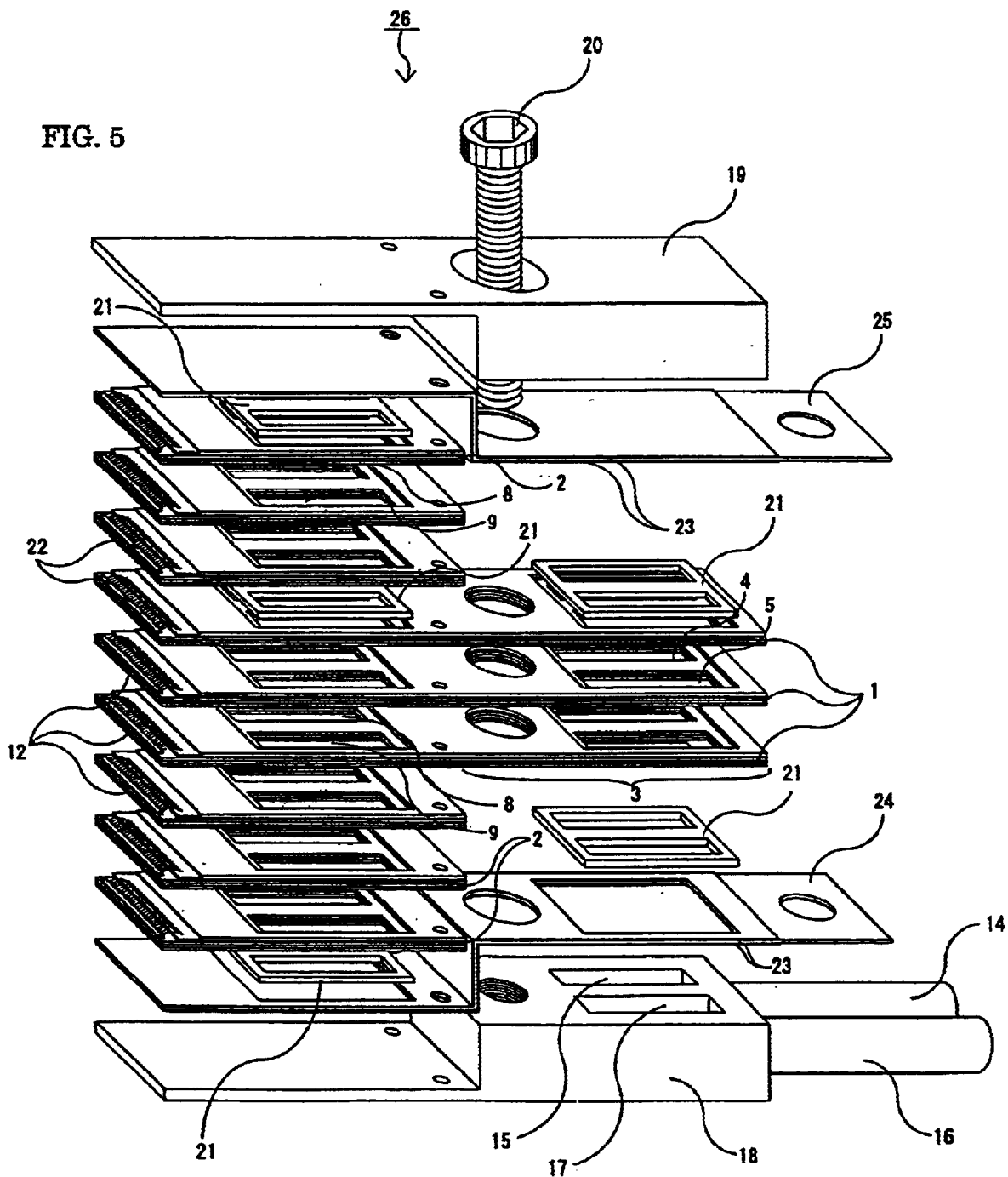
FIG. 5 is an exploded view of the configuration of a surface emitting device comprising a cooling device relating to a first embodiment of the present invention.
Figure 6:
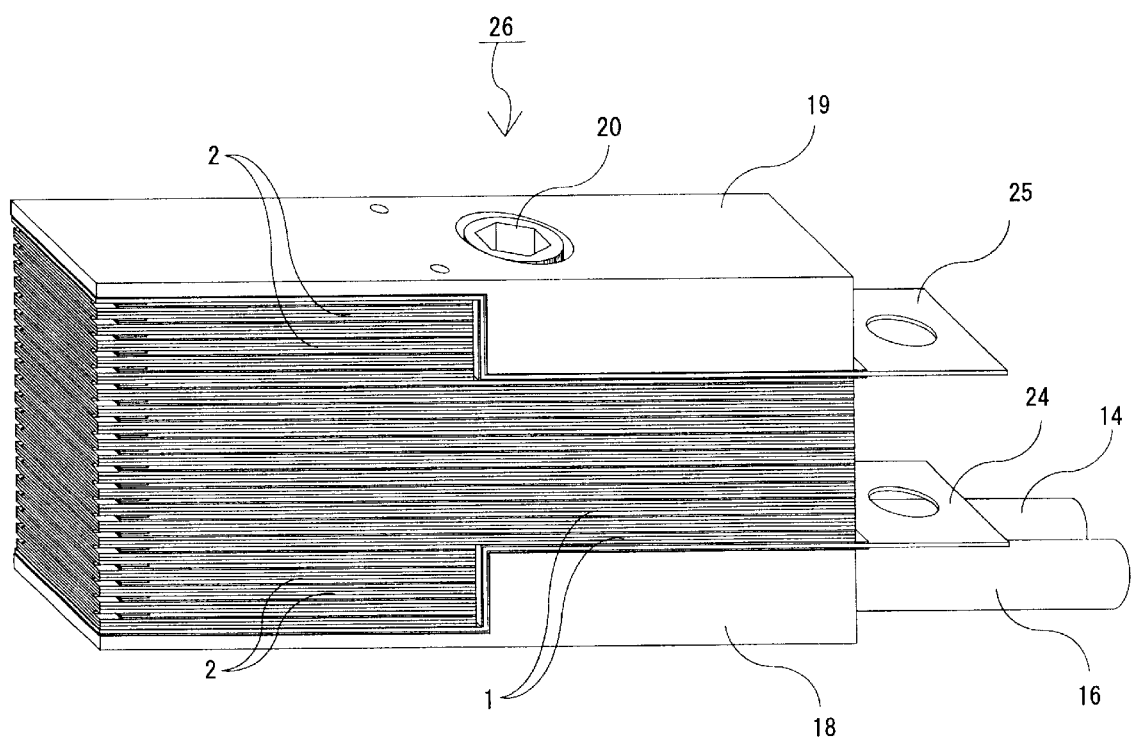
FIG. 6 is a diagonal view of the surface emitting device diagrammed in FIG. 5 after assembly.
Figure 7:
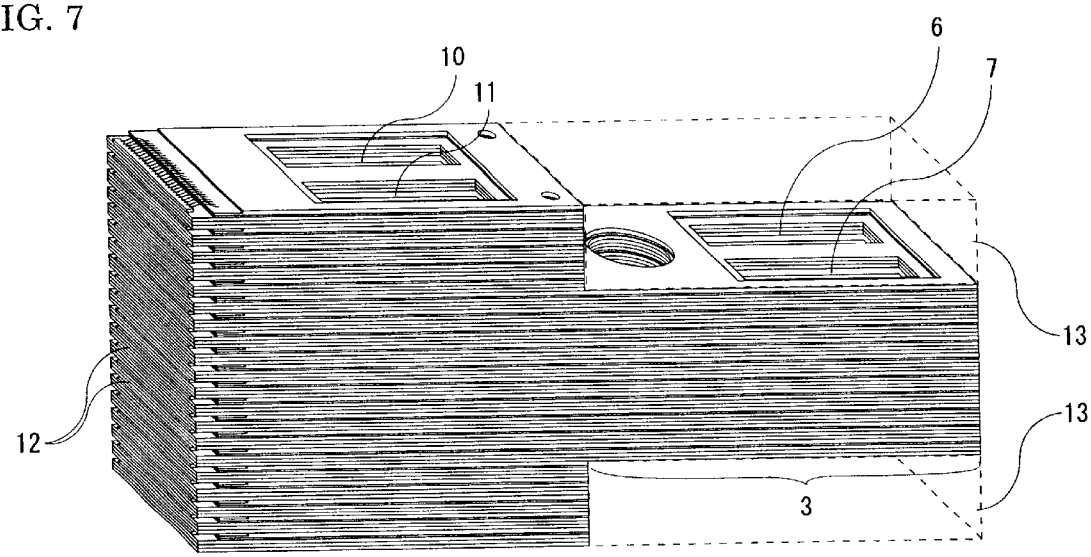
FIG. 7 is a partial view of the surface emitting device diagrammed in FIG. 6.

FIG. 5 is an exploded view representing the configuration of a surface emitting device that comprises a cooling device relating to this embodiment. FIG. 6 is a diagonal view of that surface emitting device after it has been assembled. And FIG. 7 is a partial diagram of the same surface emitting device.

The cooling device is configured by stacking together two types of cooling unit having differing sizes (lengths), that is, a large cooling unit 1 and a small cooling unit 2. Each of the cooling units comprises a stack structure made by stacking together a plurality of plate-form members. Cooling liquid flows inside the stack structure, and thereby cools a laser bars that is mounted on the stack structure along the front end surface of the stack structure.

When the large cooling units 1 and the small cooling units 2 are stacked together with the front end surfaces to which the laser bars 22 are mounted aligned, due to the differences in length between the two types, there is an additional area 3 in the large cooling units that protrude in the direction opposite the front end surface. In this additional area 3 are provided an inflow opening 4 and an outflow opening 5 for the cooling liquid. A plurality of the large cooling units 1 is stacked up continuously, wherefore the inflow openings 4 and outflow openings 5 formed in the additional areas 3 of the large cooling units connect vertically with each other to form an inflow passage 6 and an outflow passage 7 (cf. FIG. 7).

Also, in both the large cooling units 1 and the small cooling units 2, at positions that mutually correspond when they are stacked together with the respective front end surfaces thereof aligned, are provided intake openings 8 and outlet openings 9. Accordingly, when a plurality of cooling units 1 and 2 are stacked together continuously with their respective front end surfaces aligned, the intake openings 8 and outlet openings 9 of the stacked cooling units 1 and 2 connect vertically with each other to form an intake passage 10 and the outlet opening 9 (cf. FIG. 7).

Furthermore, when the large cooling units 1 and the small cooling units 2 are stacked together with their respective front end surfaces 12 aligned, extra spaces 13 will be produced at the back end, above and below, due to the difference in length of the large cooling unit 1 and the small cooling unit 2, as indicated by the dotted lines in FIG. 7. In those upper and lower extra spaces 13 are deployed first and second tightening parts 18 and 19, as diagrammed in FIG. 5 and FIG. 6.

In the first tightening part 18 are formed a cooling liquid induction port 15 and a cooling liquid discharge port 17. When this first tightening part 18 is placed in the extra space 13, the cooling liquid induction port 15 and the cooling liquid discharge port 17, respectively, face the inflow openings 4 and the outflow openings 5 in the large cooling units 1. The cooling liquid induction port 15, furthermore, is connected to an induction pipeline 14 that is for inducting cooling liquid from a cooling liquid supply unit (not shown). And the cooling liquid discharge port 17 is connected to a discharge pipeline 16 that is for returning the cooling liquid back to the cooling liquid supply unit.

By narrowing the interval between the first tightening part 18 and the second tightening part 19 by turning a tightening bolt 20, the gaps between the cooling units are reduced. Elastic spacer members 21 are also interposed between the cooling units in a measure to prevent cooling liquid leakage from between the stacked cooling units.

In FIG. 5, the elastic spacer members 21 are diagrammed as only deployed at the positions of some of the intake openings 8 and outlet openings 9 and some of the inflow openings 4 and outflow openings 5, but this is to make the diagram easier to understand, and in actual practice they are deployed at the positions of all of the intake openings 8 and outlet openings 9 and all of the inflow openings 4 and outflow openings 5. In FIG. 5, moreover, the numbers of the large cooling units 1 and small cooling units 2 are diagrammed as being fewer than in actual practice to keep the diagram from becoming too complex.

In the large cooling units 1 described above, the inflow openings 4 and intake openings 8 are connected by inflow water passages 32 (cf. FIG. 8C and FIG. 9B) provided inside the large cooling units 1, while the outflow openings 5 and the outlet openings 9 are connected by outflow water passages 34 (cf. FIG. 8C and FIG. 9B) provided in the large cooling units 1.

For both the large cooling units 1 and the small cooling units 2, cooling liquid intakes connecting to the cooling water passages provided inside the cooling units are provided on the sides of the intake openings 8, while cooling liquid outlets connecting to those cooling water passages provided inside the cooling units are provided on the sides of the outlet openings 9, and the cooling water passages extend to positions roughly immediately below the laser bars 22 mounted along the front end surfaces of the cooling units.

Due to the configuration described above, the cooling liquid supplied from the cooling liquid supply unit through the induction pipeline 14 passes through the cooling liquid induction port 15 and flows into the inflow passage 6 that is the aggregate of the inflow openings 4, further passes through the inflow water passages 33 provided inside the large cooling units 1, and flows into the intake passage 10 that is the aggregate of the intake openings 8.

Thus the cooling liquid enters into the cooling water passages inside the cooling units from the cooling liquid intakes in all of the cooling units, captures the heat generated by the laser bars 22, then leaves by the cooling liquid outlets and is again collected at the outlet passage 11 that is the aggregate of the outlet openings 9. The cooling liquid collected in the outlet passage 11 passes through the outflow water passages provided inside the large cooling units 1, flows into the outflow passage 7 that is the aggregate of the outflow openings 5, passes through the cooling liquid discharge port 17, is discharged into the discharge pipeline 16, and is returned to the cooling liquid supply unit.

Figure 12A:
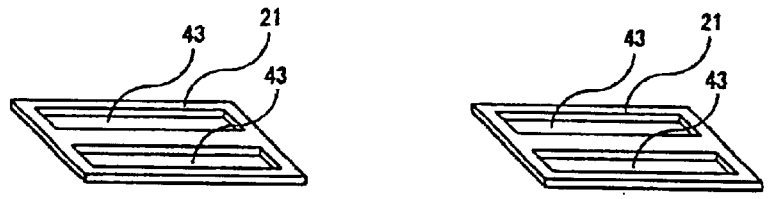
FIGS. 12A to 12D provide an exploded view of the configuration of light-emitting element components formed by mounting (a) laser bar(s) or connecting metal plate(s) to the large cooling device diagrammed in FIG. 8D.
Figure 12B:
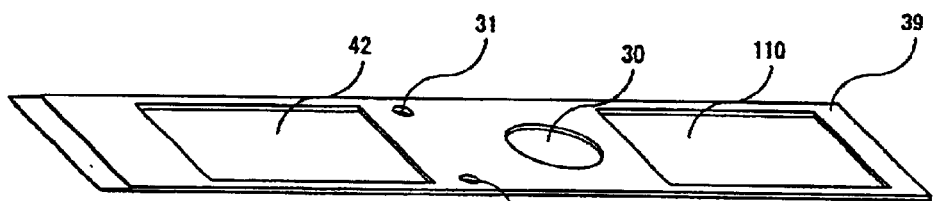
Figure 12E:
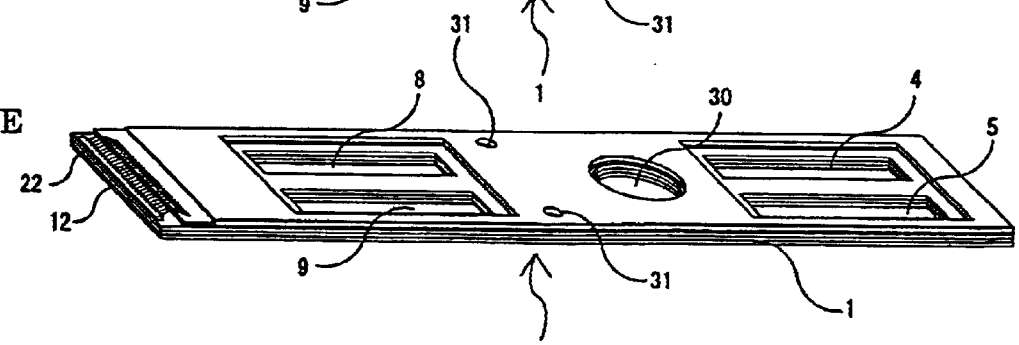
FIG. 12E is a diagonal view of the light-emitting element components diagrammed in FIGS. 12A to 12D after assembly.
Figure 13A:
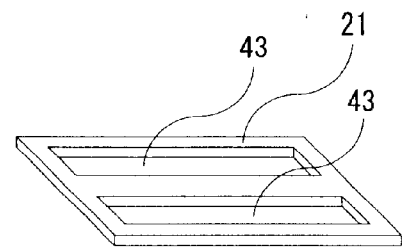
FIGS. 13A to 13D provide an exploded view of the configuration of light-emitting element components formed by mounting a laser bar and connecting metal plate to the small cooling device diagrammed in FIG. 10D.
Figure 13B:
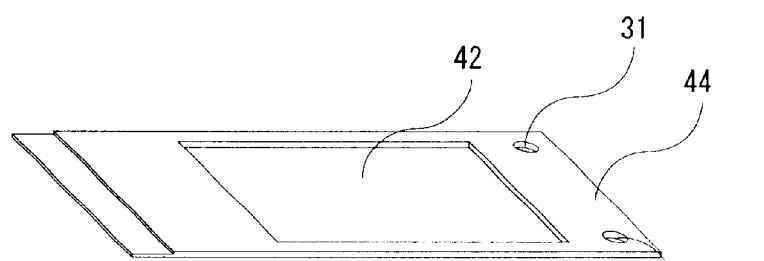

On top of the cooling units, connecting metal plates 39 and 44 are deployed so as to sandwich patterned insulating tapes 40 and 45 having a bonding agent applied to both sides thereof (cf. FIG. 12B and FIG. 13B). Electrodes of the laser bars 22 on the side opposite from those joined to the cooling units are electrically connected by bonding wire wiring or the like to the connecting metal plates 39 and 44 (cf. FIG. 12E and FIG. 13E). At the back ends of the outermost cooling units, as diagrammed in FIG. 5, insulative thin plates 23 are sandwiched between the tightening parts 18 and 19, and a positive electrode terminal plate 24 and negative electrode terminal plate 25 are provided. By passing an electric current between these electrode terminal plates 24 and 25, it becomes possible to input current to all of the laser bars in a condition wherein many of the laser bars 22 are connected in series, and the surface emitting device 26 is formed.

Figures 8A, 8B, 8C, 8D:
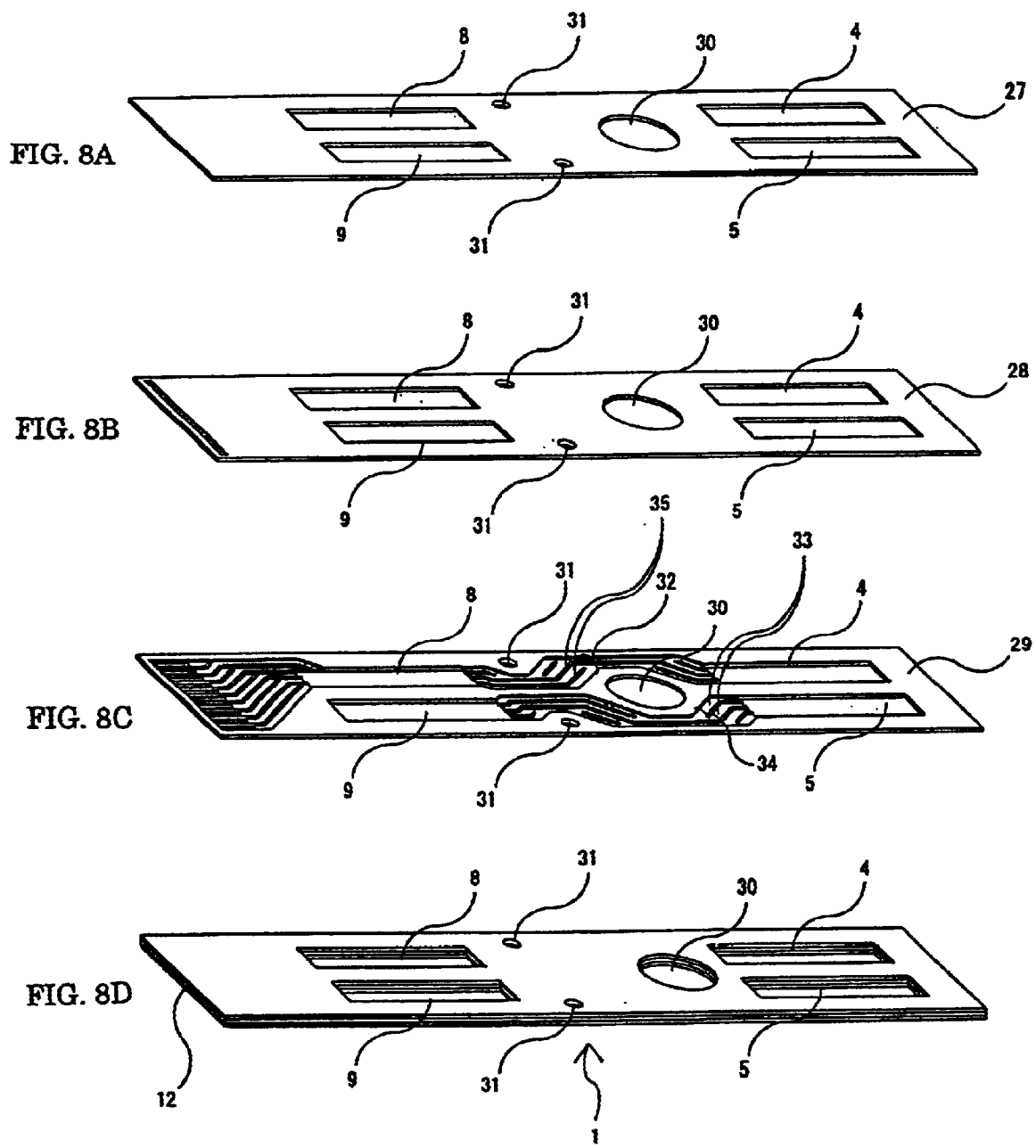
FIGS. 8A to 8C provide an exploded view showing the shapes of each of the three plate-form members configuring a large cooling unit used in the cooling device diagrammed in FIG. 5.
FIG. 8D is a diagonal view of the large cooling unit assembled from the plate-form members diagrammed in FIGS. 8A to 8C.

The configuration of the large cooling unit 1 is now described using FIGS. 8A to 8D. FIGS. 8A to 8C provide an exploded view of the configuration of the large cooling liquid 1, while FIG. 8D is a diagonal diagram of that large cooling unit in its assembled state.

The large cooling unit 1 is formed by stacking up three plate-form members 27, 28, and 29 that are made of a metal having a high coefficient of thermal conductivity, such as copper or a copper alloy or the like, which typically has a coefficient of thermal conductivity of 1.5 W/cm/K or greater. In each of these plate-form members, namely in the first plate-form member 27 (FIG. 8A), the second plate-form member 28 (FIG. 8B), and the third plate-form member 29 (FIG. 8C), respectively, are formed an inflow opening 4, an outflow opening 5, an intake opening 8, an outlet opening 9, a tightening bolt hole 30, and a guide pin hole 31.

The first, second, and third plate-form member 27, 28, and 29, respectively, typically have a thickness of 250 $\mu$m.

Between the inflow opening 4 and the intake opening 8 and between the outflow opening 5 and the outlet opening 9, respectively, in the third plate-form member 29, are formed grooves 33 that function as inflow water passages 32 and grooves 33 that function as outflow water passages 34. These inflow water passages 32 and outflow water passages 34 typically have a depth of 139 μm, a width of 400 to 700 μm, and a pitch of 550 to 850 μm.

The grooves 33 formed in the first and second plate-form members 28 and 29 are demarcated between ridges 35 and ridges 35, and, at places in the inflow water passages 32 and the outflow water passages 34 where it is necessary to alter the overall widths of the individual water passages due to the presence of the tightening bolt hole 30 or the like, the grooves 33 branch so that the groove width does not greatly change.

Figure 10A:
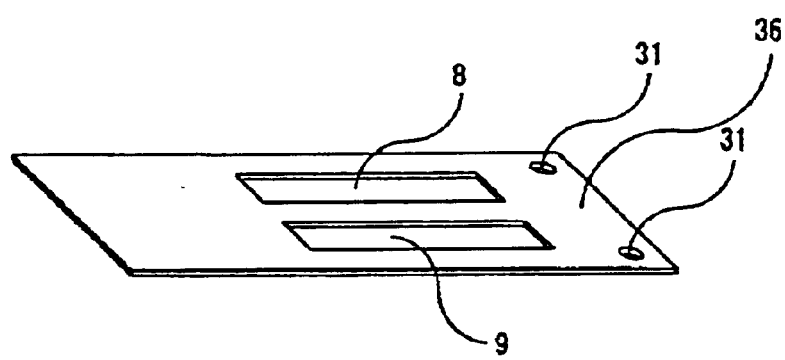
FIGS. 10A to 10C provide an exploded view showing the shapes of each of the three plate-form members configuring a small cooling unit used in the cooling device diagrammed in FIG. 5.
Figure 10B:
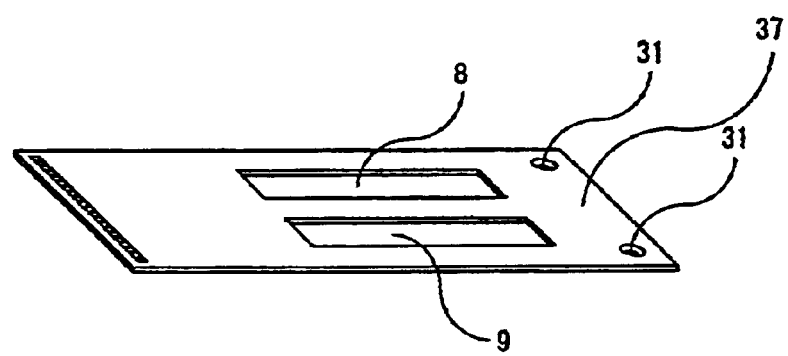
Figure 10C:
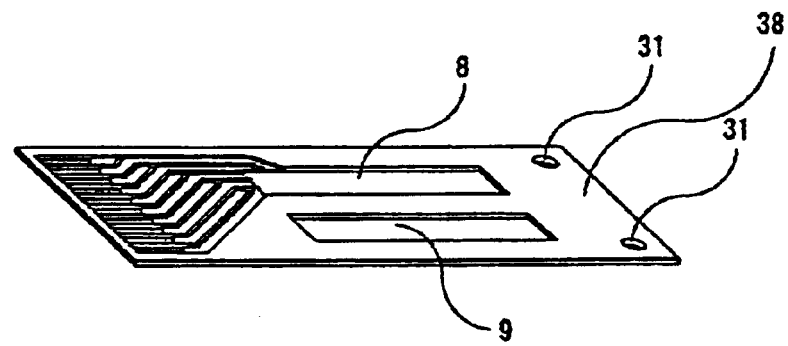

The small cooling unit 2 also, as diagrammed in FIGS. 10A to 10C, is formed by stacking three plate-form members 36, 37, and 38. The structure of these plate-form members 36, 37, and 38 is the same as that of the three plate-form members 27, 28, and 29 configuring the large cooling unit from the front end surface to the center, including the intake openings 8 and the outlet openings 9.

On the third plate-form member 29 diagrammed in FIG. 8C, the second plate-form member 28 diagrammed in FIG. 8B is placed, and on the second plate-form member 28 is placed the first plate-form member 27 diagrammed in FIG. 8A, whereupon the large cooling unit 1 diagrammed in FIG. 8D is formed. When this is done, the inflow openings 4 and the intake openings 8 are connected by the inflow water passages 32, and the outflow openings 5 and the outlet openings 9 are connected by the outflow water passages 34.

The first plate-form member 27 may be given the same structure as the third plate-form member 29 (that is, made so that the same pattern of grooves 32 is formed thereon as that formed on the upper surface of the third plate-form member 29). In that case, by turning one of the third plate-form members 29 over and deploying it on the second plate-form member 28, and deploying the other third plate-form member 29 below the second plate-form member 28, the large cooling unit 1 is formed. Hence the large cooling unit 1 can be configured with only two types of plate-form member.

Figure 9A:
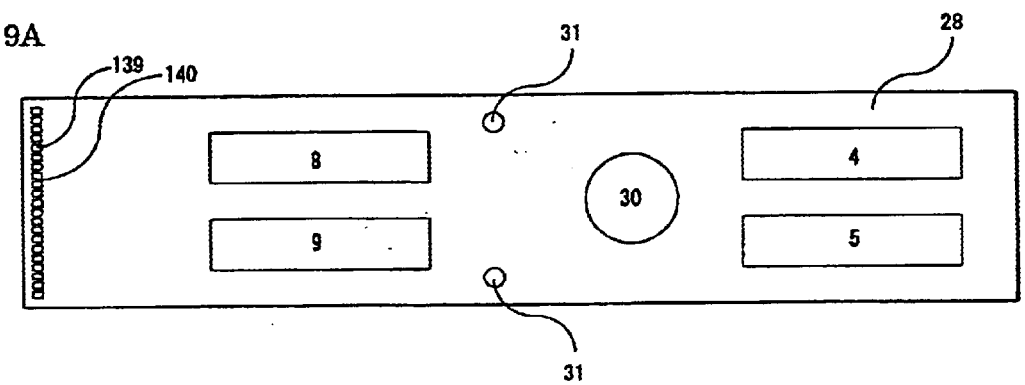
FIGS. 9A and 9B are plans of the plate-form members diagrammed in FIGS. 8B and 8C (and in FIG. 8A)
Figure 9B:
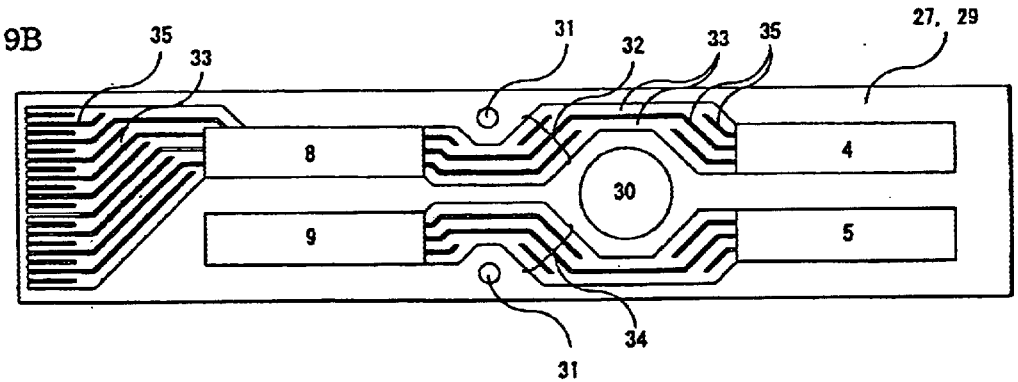

That being so, two types of plate-form member are now described, for the case where the large cooling unit 1 is configured using those two types of plate-form member, making reference to the plans in FIG. 9A and FIG. 9B. FIG. 9A is a plan of the second plate-form member 28 diagrammed in FIG. 8, while FIG. 9B is a plan of the first plate-form member 27 (and of the third plate-form member 29 having the same structure) diagrammed in FIG. 8.

Figure 10D:
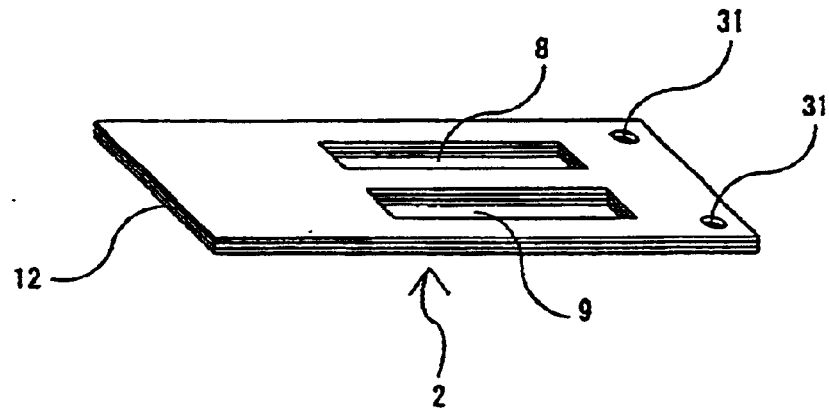
FIG. 10D is a diagonal view of the small cooling unit assembled from the plate-form members diagrammed in FIGS. 10A to 10C.

Next, the structure of the small cooling unit 2 is described using FIGS. 10A to 10D. FIGS. 10A to 10C provide an exploded view of the configuration of the small cooling unit 2, while FIG. 10D is a diagonal diagram of that small cooling unit 2 in its assembled state.

The small cooling unit 2 is formed by stacking up three plate-form members 36, 37, and 38 that are made of a metal having a high coefficient of thermal conductivity, such as copper or a copper alloy or the like, which typically has a coefficient of thermal conductivity of 1.5 W/cm/K or greater. In each of these first, second, and third plate-form members 36, 37, and 38 are formed intake openings 8, outlet openings 9, and guide pin holes 31.

Figure 4:
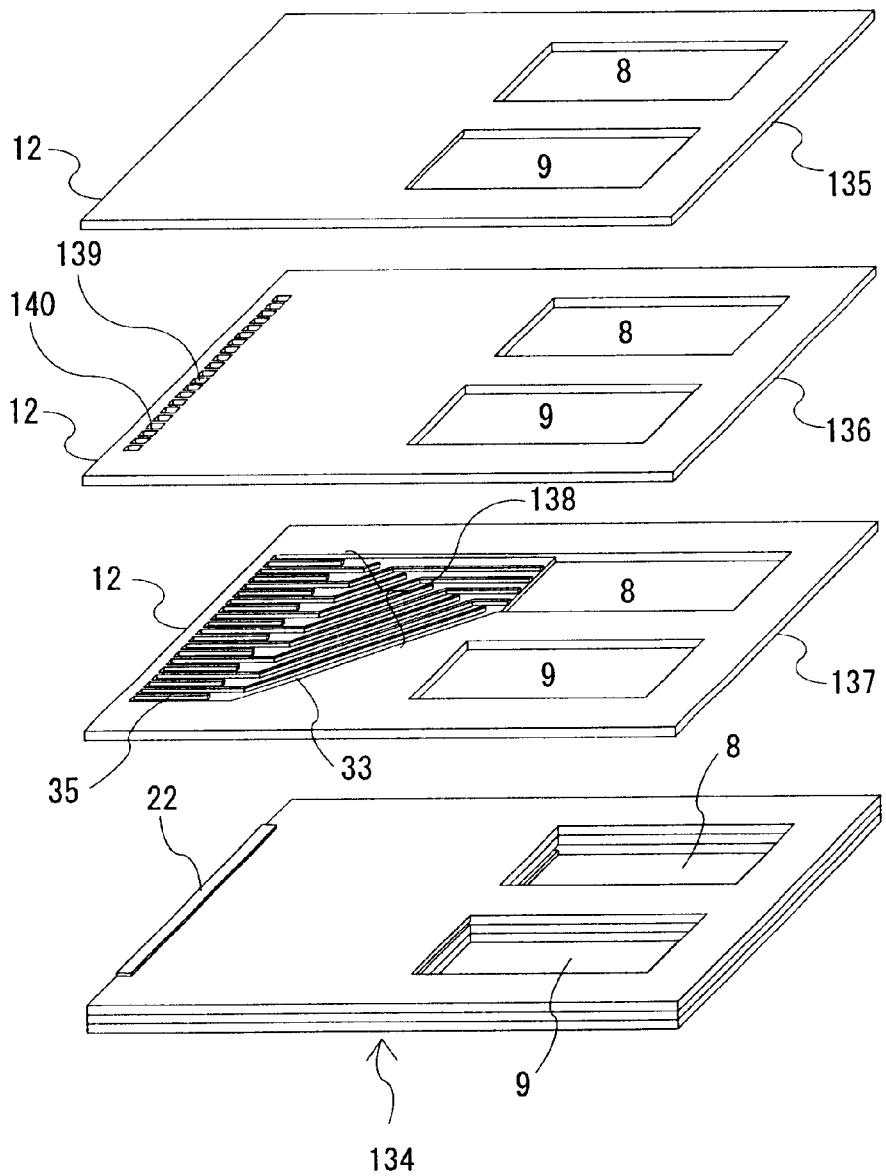
FIG. 4 is an exploded view of the configuration of a cooling unit different from that diagrammed in FIG. 3, for cooling one one-dimensional laser diode array.

When the small cooling unit diagrammed in FIG. 10D is compared against the conventional cooling unit example disclosed in Japanese Patent Application Laid-Open No. 209531/1998 and diagrammed in FIG. 4, the aspect ratios of the plate-form members differ between the two, and the latter (FIG. 4) differs from the former (FIG. 10D) in that it has no guide pin holes 31 formed in the plate-form members. Otherwise, the two have the same structure.

The guide pin holes 31 are formed in the plate-form members in order to stack cooling units of different length so that they line up. And the aspect ratio of the plate-form members is changed from the conventional example diagrammed in FIG. 4 in order to reduce the lateral width of the cooling unit so that it approaches the length of the laser bars which typically have a length of 1 cm, in order to diminish the non-light-emitting parts, as seen from the light-emitting surface, and in order to extend the length of the cooling unit, in conjunction therewith, so that the surface areas of the intake openings and outlet openings are not reduced.

The small cooling unit 2 can also, as the large cooling unit 1, be configured with only two types of plate-form member.

Figure 11A:
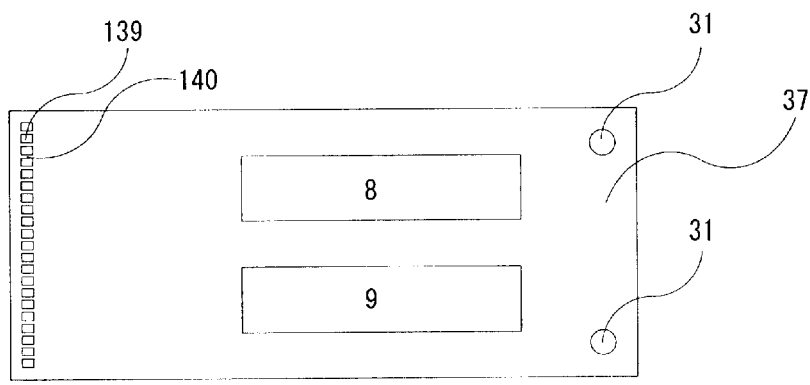
FIGS. 11A and 11B are plans of the plate-form members diagrammed in FIGS. 10B and 10C (and in FIG. 10A)
Figure 11B:
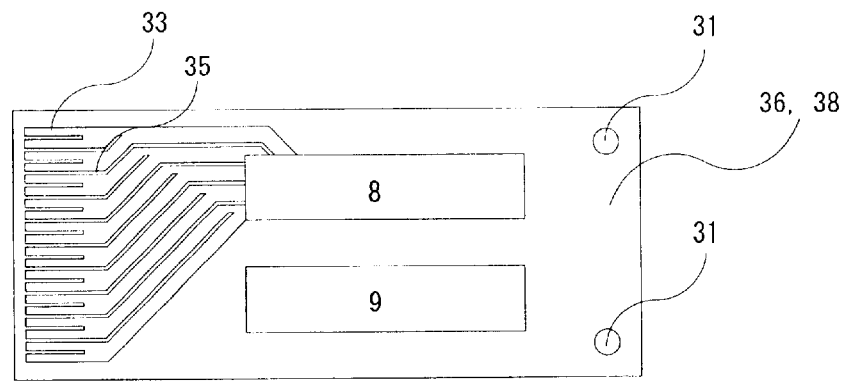

That being so, two types of plate-form member are now described, for the case where the small cooling unit 2 is configured using those two types of plate-form member, making reference to the plans in FIG. 11A and FIG. 11B. FIG. 11A is a plan of the second plate-form member 38 diagrammed in FIG. 10B, while FIG. 11B is a plan of the first plate-form member 36 (and of the third plate-form member 38 having the same structure) diagrammed in FIG. 10A.

FIGS. 12A to 12D provide an exploded view that represents the configuration of a light emitting element component 41 (laser bar module) formed by mounting the laser bars 22, connecting metal plate 39, and patterned tape 40, etc., to the large cooling unit 1 diagrammed in FIG. 8D. FIG. 12E is a diagonal view of that light emitting element component 41 in its assembled state (with the elastic spacer members 21 omitted, however).

In FIGS. 12A to 12D, the connecting metal plate 39 is bonded onto the cooling unit 1 by the patterned insulating tape 40 which has a bonding agent applied to both sides thereof. Those electrodes of the laser bars 22 joined to the cooling unit 1 and those on the opposite side are electrically connected to the connecting metal plate 39 by bonding wire wiring or the like.

Accordingly, the lower surface of the large cooling unit 1 and the upper surface of the connecting metal plate 39 function as current terminals for passing electric currents to the laser bars 22. When a plurality of these light emitting element components 41 is stacked together, it becomes possible to supply current to all of the laser bars in a condition wherein many laser bars 22 are connected in series, and the surface emitting device 26 diagrammed in FIG. 6 is formed.

In the connecting metal plate 39 and the patterned insulating tape 40 are formed outflow/inflow openings 110 and outlet/inlet openings 42 in addition to the tightening bolt holes 30 and guide pin holes 31. The outflow/inflow openings 110 are formed in areas corresponding to the inflow openings 4 and the outflow openings 5 and the vicinities thereof, while the outlet/inlet openings 42 are formed in areas corresponding to the intake openings 8 and the outlet openings 9 and the vicinities thereof.

Figure 12C:
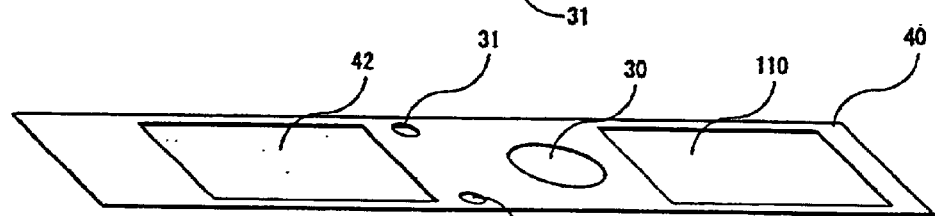
Figure 12D:
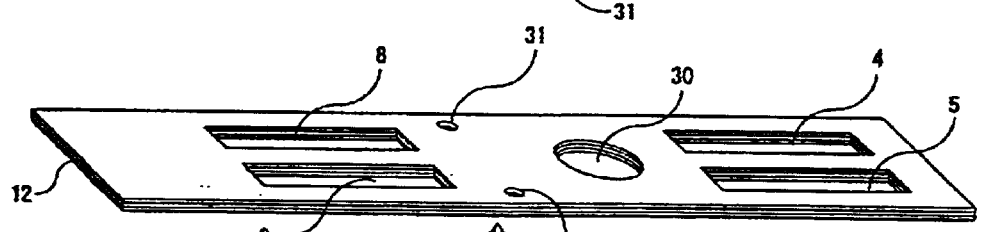

When the patterned insulating tape 40 diagrammed in FIG. 12C and then the connecting metal plate 39 diagrammed in FIG. 12B are mounted on the large cooling unit 1 diagrammed in FIG. 12D, concavities are formed respectively at the sites of the outlet/inlet openings 42 and outflow/inflow openings 110 thereof. Thereupon, elastic spacer members 21 are deployed in each of those concavities so that they are nicely accommodated inside those concavities.

In order to pass cooling liquid through the elastic spacer members 21, water passing openings 43 are formed respectively in parts corresponding to the inflow openings 4, outflow openings 5, intake openings 8, and outlet openings 9 of the cooling unit 1. The thickness of the elastic spacer members 21 is slightly thicker than the sum of the thicknesses of the connecting metal plate 39 and the patterned insulating tape 40. When the cooling units 1 are stacked and the stack structure is compressed in the direction of stacking, electrical connection is effected between the cooling units, and cooling liquid is kept from leaking.

FIGS. 13A to 13D provide an exploded view that represents the configuration of a light emitting element component 46 (laser bar module) having the laser bars 22, connecting metal plate 44, and patterned tape 45, etc., mounted to the small cooling unit 2 diagrammed in FIG. 10D. FIG. 13E is a diagonal view of that light emitting element component 46 in its assembled state (with the elastic spacer members 21 omitted, however).

In FIGS. 13A to 13D, the functions of the connecting metal plate 44 and the patterned insulating tape 45 are the same as the functions of the connecting metal plate 39 and the patterned insulating tape 40 used in the large cooling unit 1 diagrammed in FIG. 12B and FIG. 12C. The connecting metal plate 44 and the patterned insulating tape 45 have outlet/inlet openings 42 formed therein in addition to the guide pin holes 31. These outlet/inlet openings 42 are formed in areas corresponding to the intake openings 8 and outlet openings 9, and the vicinities thereof, in the small cooling unit 2.

Figure 13C:
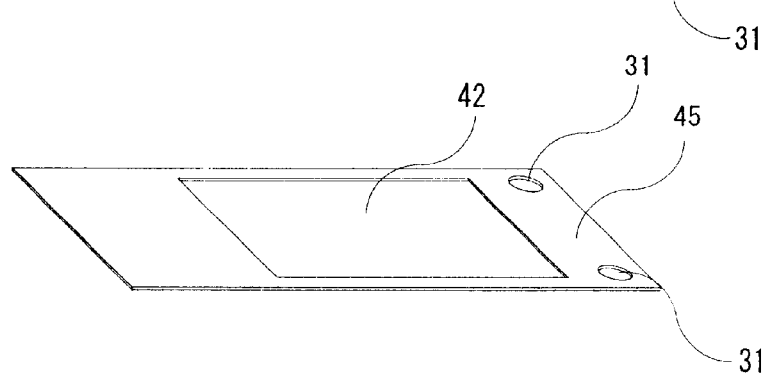
Figure 13D:
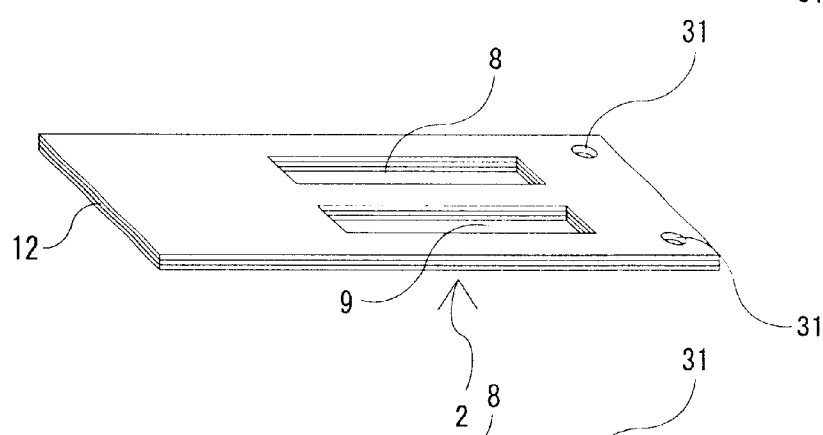
Figure 13E:
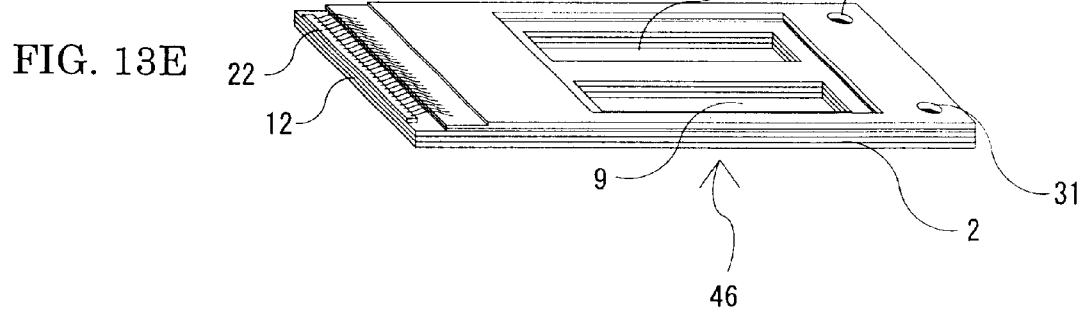
FIG. 13E is a diagonal view of the light-emitting element components diagrammed in FIGS. 13A to 13D after assembly.

When the patterned insulating tape 45 diagrammed in FIG. 13C and then the connecting metal plate 44 diagrammed in FIG. 13B are mounted on the small cooling unit 2 diagrammed in FIG. 13D, concavities are formed respectively at the sites of the outlet/inlet openings 42 thereof. Thereupon, elastic spacer members 21 are deployed in each of those concavities so that they are nicely accommodated inside those concavities.

In order to pass cooling liquid through the elastic spacer members 21, water passing openings 43 are formed respectively in parts corresponding to the intake openings 8 and outlet openings 9 of the cooling unit 2. The thickness of the elastic spacer members 21 is slightly thicker than the sum of the thicknesses of the connecting metal plate 44 and the patterned insulating tape 45. When the cooling units are stacked and the stack structure is compressed in the direction of stacking, electrical connection is effected between the cooling units 1, and cooling liquid is kept from leaking.

Also, the thicknesses of the connecting metal plate 39 mounted to the large cooling unit 1 and of the connecting metal plate 44 mounted to the small cooling unit 2 are made the same, and the thicknesses of the patterned insulating tape 40 mounted to the large cooling unit 1 and of the patterned insulating tape 45 mounted to the small cooling unit 2 are made the same. By so doing, it becomes possible to use elastic spacer members 21 of the same structure for both the large cooling unit 1 and the small cooling unit 2, and it also becomes possible to stack light emitting element components 41 comprising the large cooling units 1 and light emitting element components 46 comprising the small cooling units 2 with the same pitch. FIG. 5 to FIG. 7 diagram the stacking of the large cooling units 1 and the small cooling units 2, but what are actually stacked are the light emitting element components 41 comprising the large cooling units 1 (cf. FIG. 12E) and the light emitting element components 46 comprising the small cooling units 2 (cf. FIG. 13E).

With the surface emitting device 26 according to this embodiment as described in the foregoing, by using a cooling device wherein cooling units of different size are stacked, cooling liquid is supplied from the back side, and supplying the cooling liquid to immediately below all of the laser bars is made possible, even with a structure having few non-light-emitting parts as seen from the light-emitting surface side.

Second Embodiment

A second embodiment of the present invention is now described with reference to FIGS. 14 to 15C.

Figure 14:
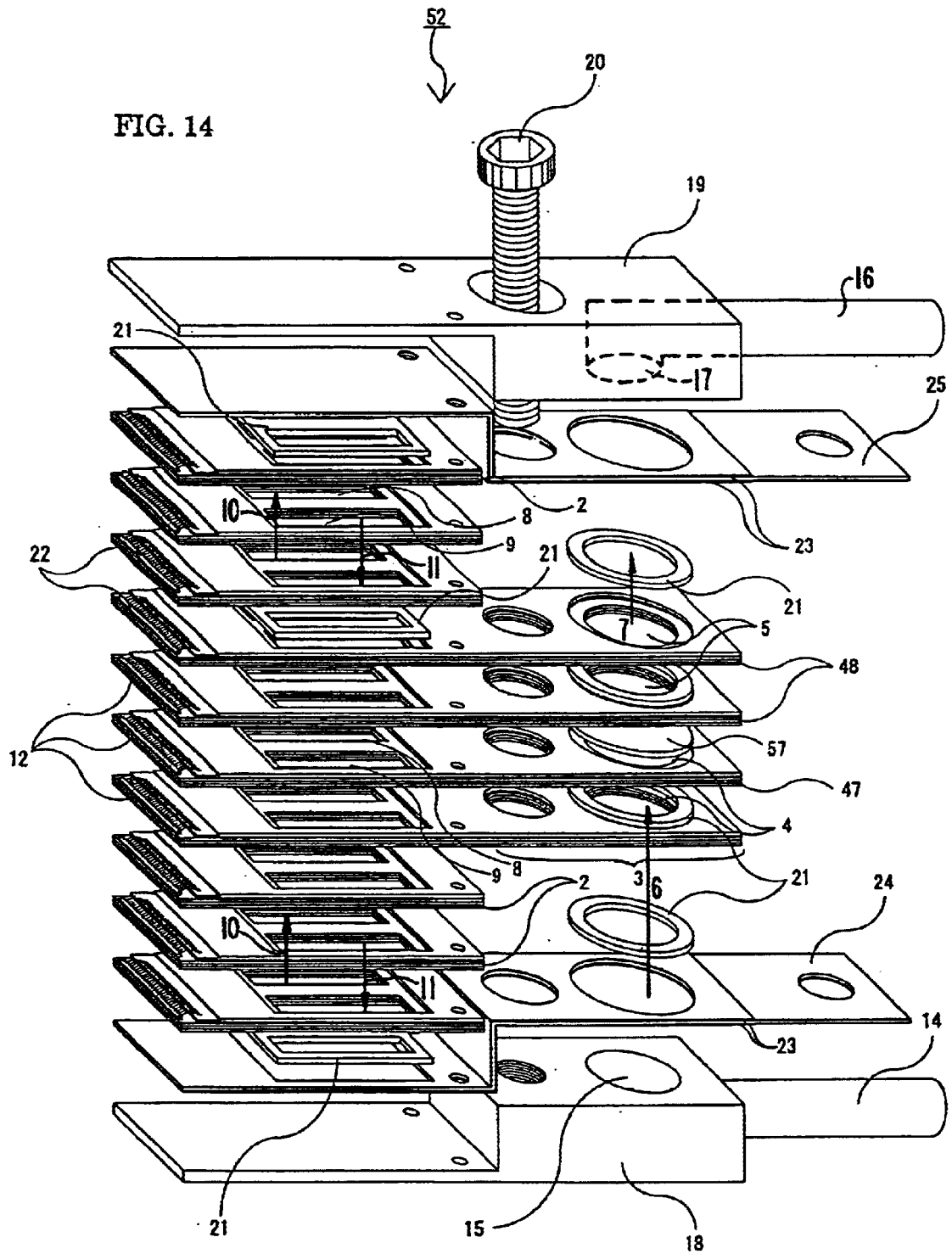
FIG. 14 is an exploded view of the configuration of a surface emitting device comprising a cooling device relating to a second embodiment of the present invention.

FIG. 14 is an exploded view that represents the configuration of a surface emitting device that comprises a cooling device related to this embodiment.

The surface emitting device diagrammed in FIG. 14 employs two types of large cooling unit having structures that differ from that of the large cooling unit 1 of the first embodiment (namely, a first type large cooling unit 47 and a second type large cooling unit 48), and a small cooling unit 2 having the same structure as the small cooling unit 2 of the first embodiment.

Furthermore, the large cooling units 47 and 48 and the small cooling units 2 are stacked together so that the front end surfaces on the side where the laser bars 22 are mounted line up, as in the first embodiment. Thereupon, because the large cooling units 47 and 48 are longer than the small cooling units 2, the back ends thereof will protrude and form additional areas 3. In the additional areas 3 of the first type large cooling unit 47 are formed inflow openings 4 for the cooling liquid. When a plurality of the first type large cooling units 47 is stacked continuously, the inflow openings 4 thereof are connected vertically to form an inflow passage 6. In the additional spaces 3 of the second type large cooling units 48, on the other hand, are formed outflow openings 5 for the cooling liquid. When a plurality of the second type large cooling units 48 is stacked continuously, the outflow openings 5 thereof are connected vertically to form an outflow passage 7.

When the large cooling units 47 and 48 and the small cooling units 2 are stacked up with the front end surfaces on the side to which the laser bars 22 are mounted lined up, as described in connection with FIG. 7, extra spaces develop in the back due to the difference in length between the small cooling units 2 and the large cooling units 47 and 48. In these extra spaces are deployed first tightening parts 18 and second tightening parts 19.

In the first tightening part 18 is provided a cooling liquid induction port 15 that is connected to an induction pipeline 14 for inducting cooling liquid from a cooling liquid supply unit (not shown). When this first tightening part 18 is placed in the extra space 13, the cooling liquid induction port 15 thereof faces the inflow openings 4 of the first type large cooling units 47.

In the second tightening part 19 is provided a cooling liquid discharge port 17 that is connected to the discharge pipeline 16 for returning the cooling liquid back to the cooling liquid supply unit noted above. That liquid discharge port 17 cannot be seen in FIG. 14 because the lower surface of the second tightening part 19 is not open to view. When this second tightening part 19 is placed in the extra space 13, the cooling liquid discharge port 17 thereof corresponds to the outflow openings 5 of the second type large cooling units 48.

In FIG. 14, furthermore, as in the case diagrammed in FIG. 5, elastic spacer members 21 are shown deployed only in the positions of some of the intake openings 8 and outlet openings 9 and some of the inflow openings 4 and outflow openings 5. This is to make the diagram easier to understand, however. In actual practice, elastic spacer members 21 are deployed, respectively, in the positions of all of the intake openings 8 and outlet openings 9 and all of the inflow openings 4 and outflow openings 5. In FIG. 14, moreover, the large cooling units 47 and 48 and the small cooling units 2 are shown in fewer numbers than actual in order to keep the diagram from becoming too complex.

The first type large cooling units 47 are deployed on the side of the first tightening part 18 where the cooling liquid induction port 15 is provided, and the inflow openings 4 and intake openings 8 are connected by inflow water passages 32 (cf. FIG. 15A) provided inside the large cooling units 47.

The second type large cooling units 48 are deployed on the side of the second tightening part 19 where the cooling liquid discharge port 17 is provided, and the outflow openings 5 and outlet openings 9 are connected by outflow water passages 34 (cf. FIG. 15A) provided inside the large cooling units.

Based on the configuration described in the foregoing, the cooling liquid that is supplied from the cooling liquid supply unit via the induction pipeline 14 passes through the cooling liquid induction 15 and flows into the inflow passage 6 that is the aggregate of the inflow openings 4, and from there passes through inflow water passages 32 provided inside the first type large cooling units 47 and flows into the intake passage 10 that is the aggregate of the intake openings 8.

For this reason, the cooling liquid, after entering from the cooling liquid intakes of all of the cooling units into the cooling water channels inside the cooling units and capturing the heat generated by the laser bars 22, is then discharged from the cooling liquid outlets and is again collected in the outlet passage 11 that is the aggregate of the outlet openings 9. Thereupon, the cooling liquid collected in the outlet passage 11 passes through the outflow water passages 34 provided inside the second type large cooling units 48, flows into the outflow passage 7 that is the aggregate of the outflow openings 5, passes through the cooling liquid discharge port 17, is discharged into the discharge pipeline 16, and is returned back to the cooling liquid supply unit.

Figures 15A, 15B, 15C:
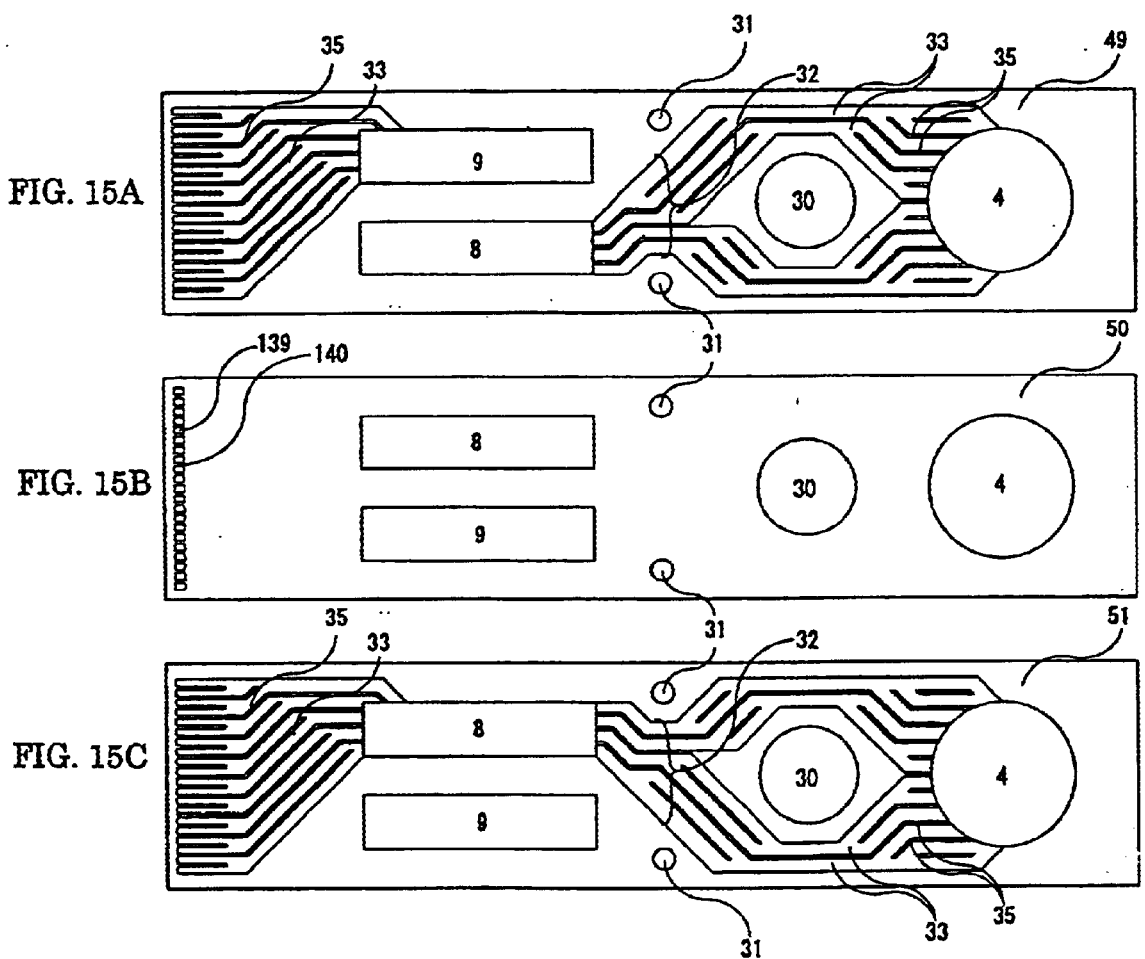
FIGS. 15A to 15C, respectively, are plans of the three plate-form members configuring a large cooling unit used in the cooling device diagrammed in FIG. 14.

The plate-form members 49, 50, and 51 used in the first type large cooling unit 47 are represented by the plans given in FIGS. 15A, 15B, and 15C.

The first plate-form member 49 and the third plate-form member 51, respectively, have shapes in the back portions thereof that exhibit a relationship of linear symmetry. These first and second plate-form members 49 and 51 are deployed, and mutually joined, so that the surfaces thereof wherein are formed the grooves 33 are in contact with the upper and lower surfaces, respectively, of the second plate-form member 50, whereupon the first type large cooling unit 47 is formed. This first type large cooling unit 47 is used so that the first plate-form member 49 is deployed on the upper side thereof.

The second type large cooling unit 48, on the other hand, corresponds to the first type large cooling unit 47, described above, when it has been turned over. That is, the first type large cooling unit 47 can be turned over and used as the second type large cooling unit 48.

The first type large cooling units 47 and the second type large cooling units 48, as in the large cooling units 1 in the first embodiment, are built into a surface emitting device 52 of FIG. 14, in the form of light-emitting element components wherein are mounted laser bars, connecting metal plates, and patterned insulating tapes, etc.

With the surface emitting device 52 relating to this embodiment, as described in the foregoing, it is only necessary to connect one pipeline connecting to the cooling liquid supply unit to each of the tightening parts 18 and 19, thus affording an advantage in that the structures of the tightening parts are easy to fabricate. In addition, the sum of the lengths of the inflow passage 6 and the outflow passage 7 becomes shorter, by which measure the cooling liquid pressure loss in these passages is reduced. It is therefore possible to make the surface area of the inflow openings and outflow openings in the large cooling units smaller, and partition walls are no longer needed for separating the inflow openings and outflow openings in the large cooling units. Hence advantages are realized such as being able to make the overall length of the large cooling unit comparatively shorter.

Figure 38A:
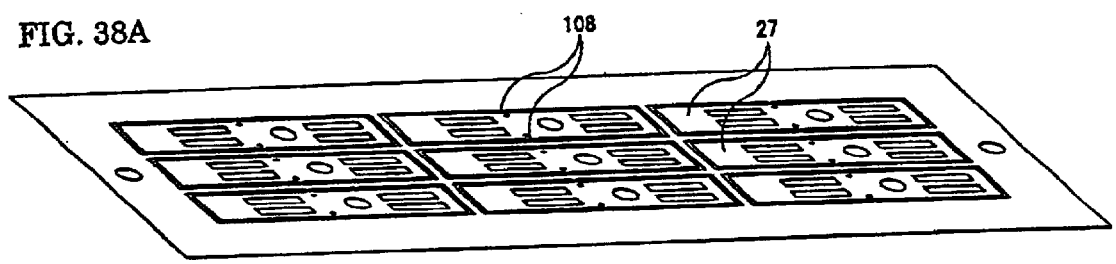
FIGS. 38A to 38C are diagrams of plate-form members during the fabrication process.
Figure 38B:
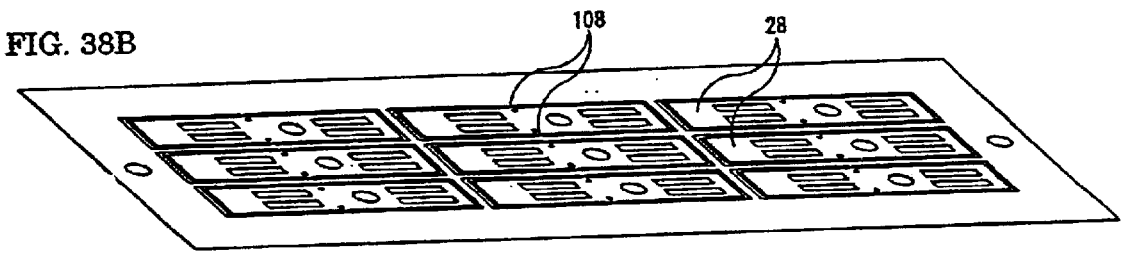
Figure 38C:
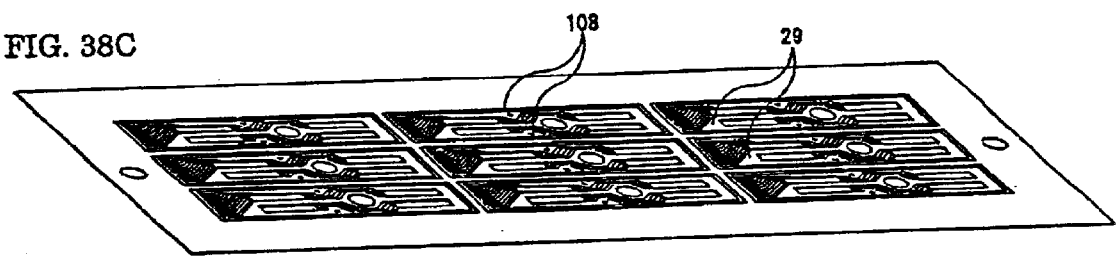
Figure 38D:
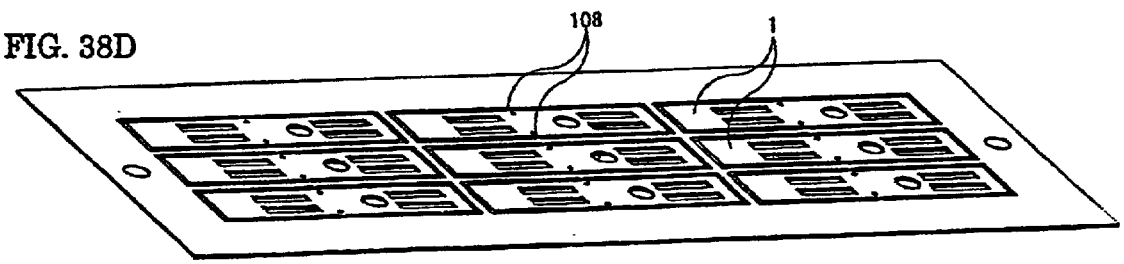
FIG. 38D is a diagram of a cooling unit during the fabrication process, wherein the plate-form members diagrammed in FIGS. 38A to 38C are joined together.

Here, the number of cooling units that can be fabricated at one time is roughly inversely proportional to the surface area of the cooling units (cf. FIG. 38A to 38C), wherefore it is important in the interest of cost reduction to make the overall length of the large cooling units as short as possible.

Third Embodiment

A third embodiment of the present invention is now described with reference to FIGS. 16A to 17.

FIGS. 16A to 16C are plans of plate-form members 54, 55, and 56 used in a large cooling unit 53 for configuring a cooling device relating to this embodiment.

In the first plate-form member 54, as diagrammed in FIG. 16A, no inflow or outflow openings are opened. The second plate-form member 55 and the third plate-form member 56, as diagrammed in FIG. 16B and FIG. 16C, have the same structures, respectively, as the second plate-form member 50 (cf. FIG. 15B) and the third plate-form member 51 in the second embodiment.

In the large cooling unit 53 fabricated by mutually joining these first and third plate-form members 54 and 56 together so that the surfaces thereof whereon the grooves 33 have been formed contact the upper and lower surfaces, respectively, of the second plate-form member 55 (which large cooling unit 53 is hereinafter called a third type large cooling unit), there is no inflow opening 4 or outflow opening 5 that passes all the way through.

Figure 17:
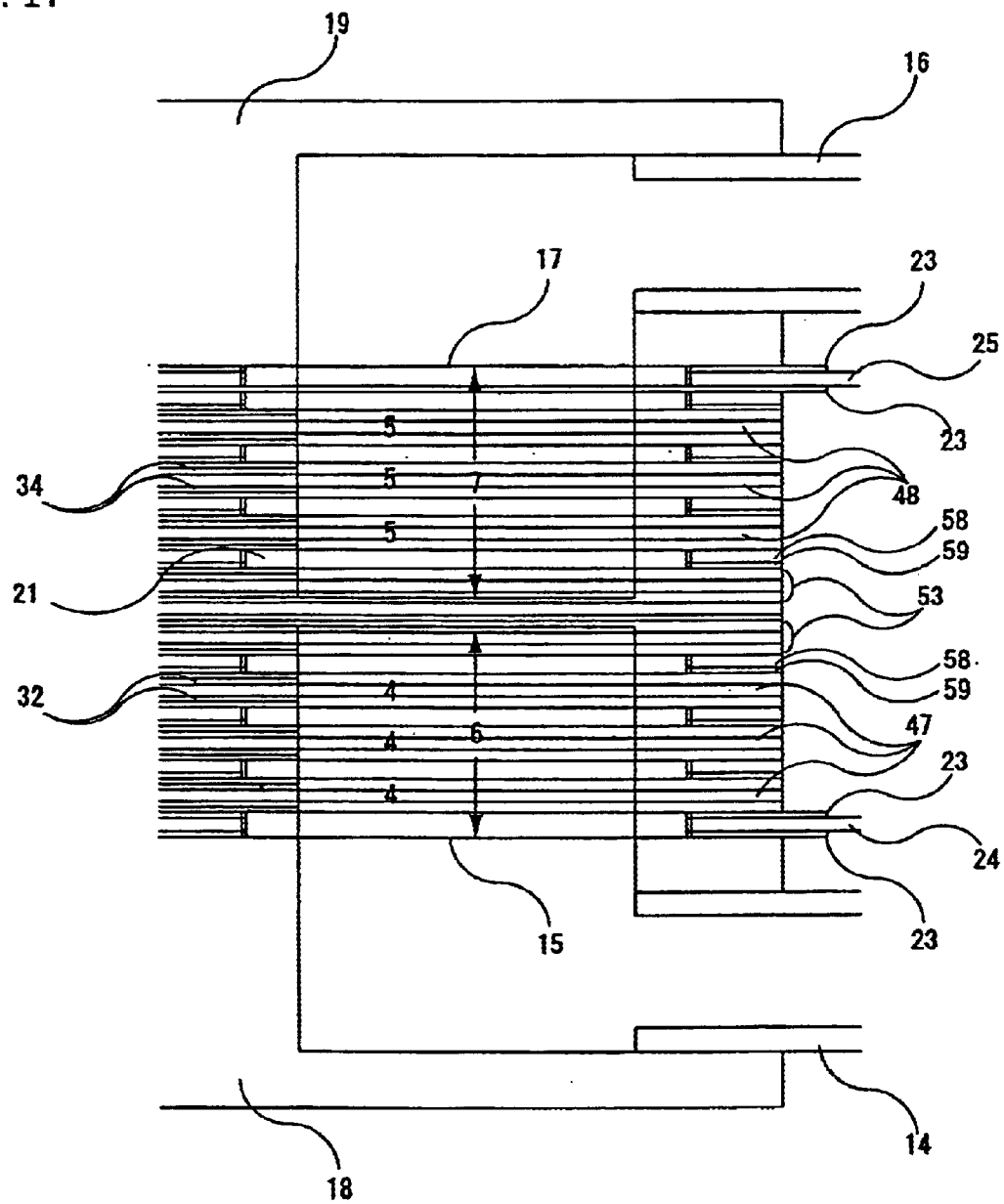
FIG. 17 is a cross-sectional view of the partial configuration of the cooling device relating to the third embodiment of the present invention, and particularly of the vicinities of inflow openings and outflow openings in large stacked cooling units.

FIG. 17, which partially represents the configuration of the cooling device relating to this embodiment, is a cross-section in the vicinity of the inflow openings and outflow openings of the stacked large cooling units.

As diagrammed in FIG. 17, two of the third type large cooling units 53 are stacked and deployed between the first type large cooling unit 47 and the second type large cooling unit 48. In one of those third type large cooling units 53, the first plate-form member 54 configuring the same faces upward, while, in the other of those third type large cooling units 53, the first plate-form member 54 configuring the same faces downward.

In the surface emitting device 52 in the second embodiment diagrammed in FIG. 14, at the very least, the first type large cooling unit 47 and the second type large cooling unit 48 are made identical components that are in a relationship of being turned backwards to each other. In that case, partitioning walls are required to separate the inflow passage 6 from the outflow passage 7. Elastic spacer members 57 having no water passing openings, as in the second embodiment, may be used, but one must worry about such things as deformation in the elastic spacer members 57 due to the difference in cooling liquid pressure on the inflow side and the outflow side. That being so, in this embodiment, it is preferable that a third type large cooling unit 53 be used wherein there is no inflow opening 4 or outflow opening 5 that passes all the way through.

Also, by stacking together and deploying the two third type large cooling units 53 formed by stacking and mutually joining the first, second, and third plate-form members 54, 55, and 56 diagrammed in FIGS. 16A, 16B, and 16C so that the first plate-form member 54 configuring one of them is on the upper side thereof while the first plate-form member 54 configuring the other of them is on the lower side thereof, as diagrammed in FIG. 17, an even greater improvement is made in the structural strength for withstanding cooling liquid pressure differences.

In FIG. 17, moreover, the first, second, and third type large cooling units 47, 48, and 53 are represented in a condition wherein a connecting metal plate 58 and a patterned insulating tape 59 is mounted to each.

With the cooling device relating to this embodiment, as described in the foregoing, the reliability of the surface emitting device 52 in the second embodiment is raised even higher while holding down to a minimum any increase in the number of components which would cause costs to increase.

Fourth Embodiment

A fourth embodiment of the present invention is now described with reference to FIGS. 18A to 18C.

Figure 18A:
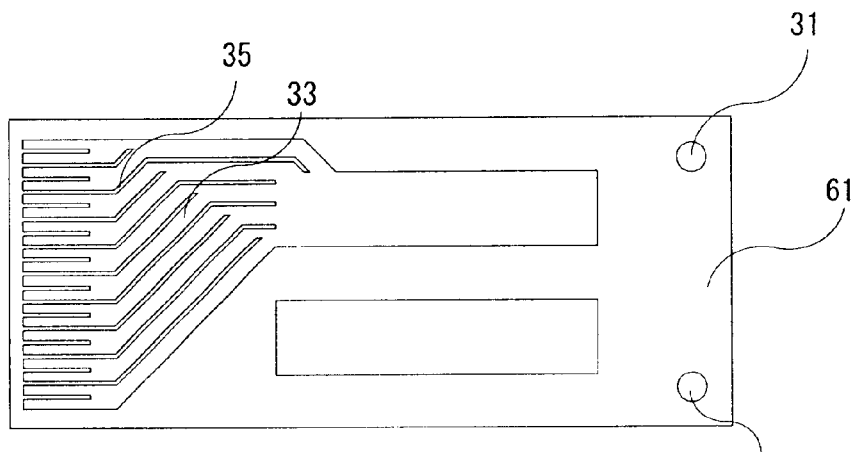
FIGS. 18A to 18C, respectively, are plans of three plate-form members configuring a small cooling unit used in a cooling device relating to a fourth embodiment of the present invention.
Figure 18B:
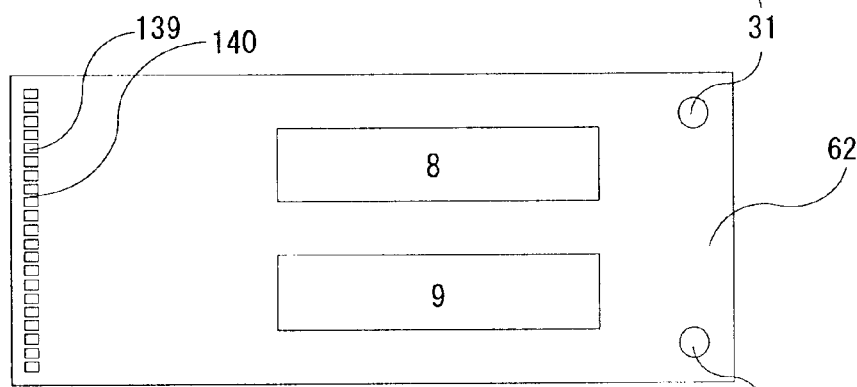
Figure 18C:
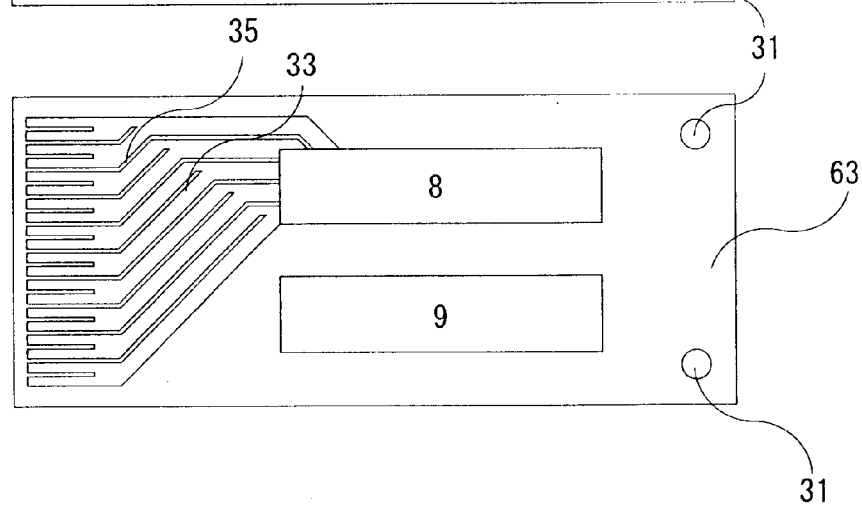

FIGS. 18A, 18B, and 18C are plans of plate-form members 61, 62, and 63, respectively, which configure a small cooling unit 60 that is used in a cooling device based on this embodiment.

In the first plate-form member 61, no inlet opening or outlet opening is opened, as diagrammed in FIG. 18A. The second plate-form member 62, as diagrammed in FIG. 18B, has the same structure as the plate-form member 37 (cf. FIG. 10B) used in the first embodiment. The third plate-form member 63, as diagrammed in FIG. 18C, has the same structure as the plate-form member 38 (cf. FIG. 10C) used in the first embodiment.

In the small cooling unit 60 fabricated by mutually joining these first and third plate-form members 61 and 63 together so that the surfaces thereof whereon the grooves 33 have been formed contact the upper and lower surfaces, respectively, of the second plate-form member 62 (which small cooling unit 60 is hereinafter called a second type of small cooling unit), there is no intake opening 8 or outlet opening 9, respectively, that passes all the way through.

This second type of small cooling unit 60 which has no intake opening 8 or outlet opening 9, respectively, that passes all the way through it, can be used in the surface emitting device 26 (first embodiment) diagrammed in FIG. 5 or in the surface emitting device 52 (second embodiment) diagrammed in FIG. 14 instead of the outermost small cooling unit 2 in the stacked cooling units.

In this embodiment, one second type small cooling unit 60 is deployed, in the lowermost layer of the stacked cooling units, so that the first plate-form member 61 configuring the same is made to be on the lower side, and another second type small cooling unit 60 is deployed, in the uppermost layer of the stacked cooling units, so that the first plate-form member 61 configuring the same is made to be on the upper side. Based on this configuration, leakage of cooling liquid from the intake openings 8 and outlet openings 9 in the stacked cooling units can be prevented more completely, without being influenced by the flatness of components outside of the cooling units such as the negative electrode terminal plate 25.

With the cooling device related to this embodiment, moreover, increases in the number of components, which constitutes a cause of escalating costs, can be held down to a minimum, and the reliability of the surface emitting device 52 in the second embodiment can be raised even higher.

Fifth Embodiment

A fifth embodiment of the present invention is now described with reference to FIGS. 19A to 21E.

Figure 19A:
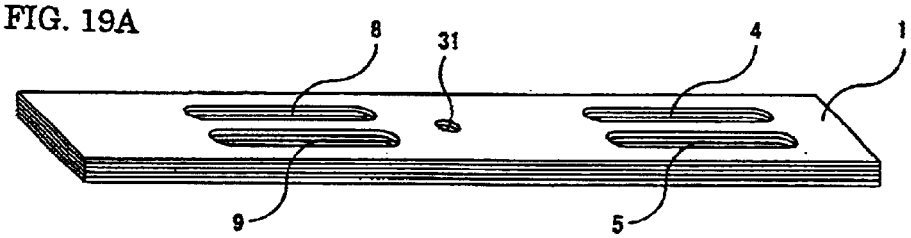
FIGS. 19A and 19B, respectively, are diagonal views of a large cooling unit and a small cooling unit used in a cooling device relating to a fifth embodiment of the present invention.
Figure 19B:
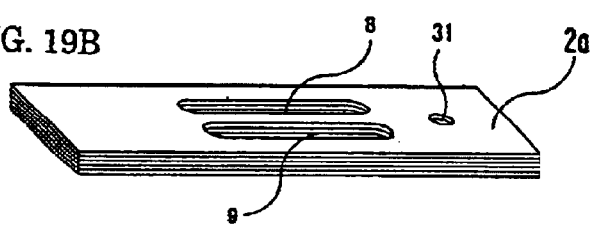
Figure 19C:
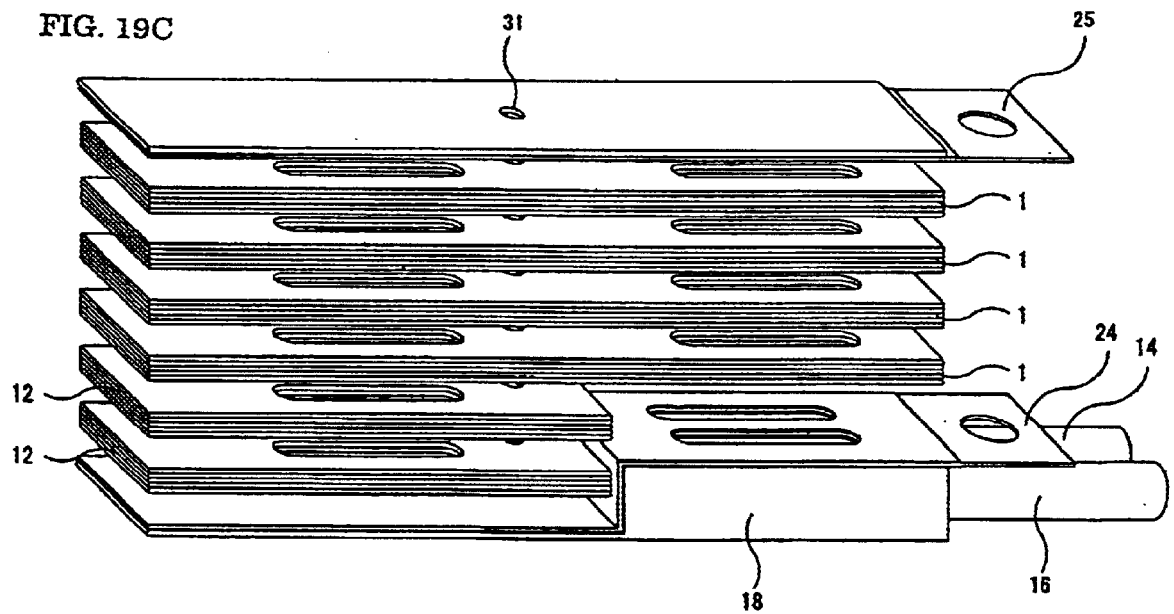
FIG. 19C is a diagonal view of a cooling device that comprises the large cooling unit diagrammed in FIG. 19A and the small cooling unit diagrammed in FIG. 19B.

FIG. 19A is a diagonal view of a large cooling unit 1, while FIG. 19B is a diagonal view of a small cooling unit 12. From this large cooling unit 1 diagrammed in FIG. 19A and small cooling unit 12 diagrammed in FIG. 19B is formed the cooling device diagrammed in FIG. 19C.

The large cooling unit 1 diagrammed in FIG. 19A is configured by five plate-form members 141 to 145, as diagrammed in FIGS. 20A to 20E.

Figure 20A:
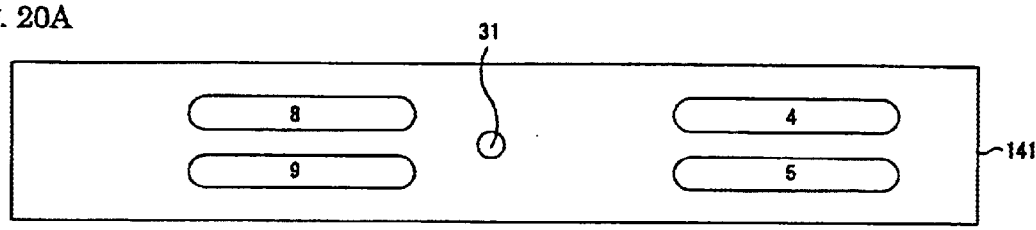
FIGS. 20A to 20D, respectively, are plans of five plate-form members that configure a large cooling unit used in a cooling device relating to the fifth embodiment of the present invention.
Figure 20B:
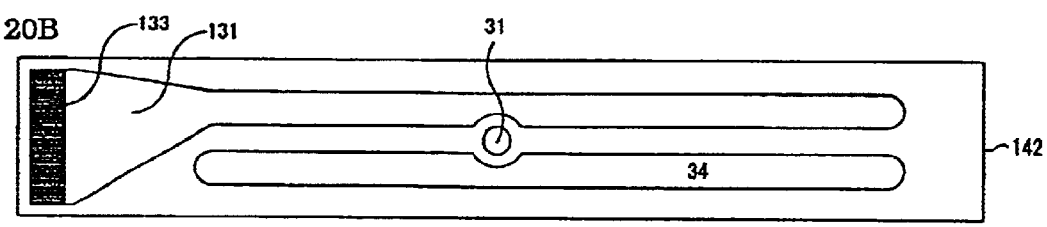
Figure 20C:
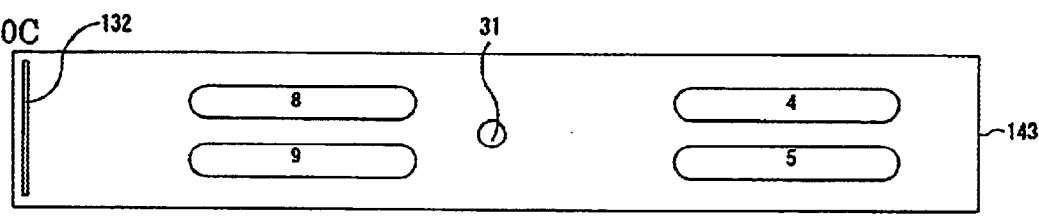
Figure 20D:
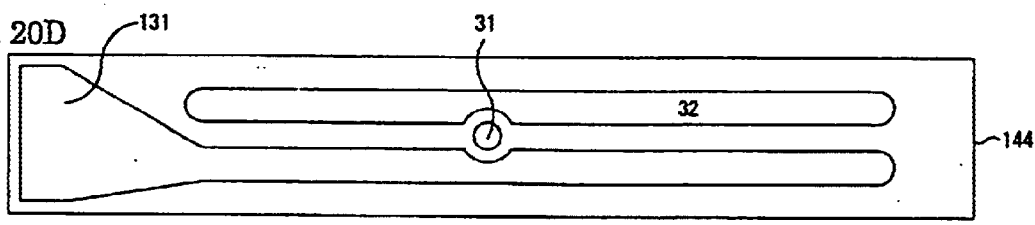
Figure 20E:
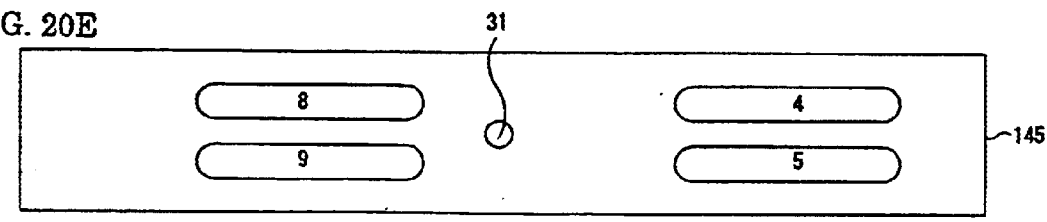
Figure 21A:
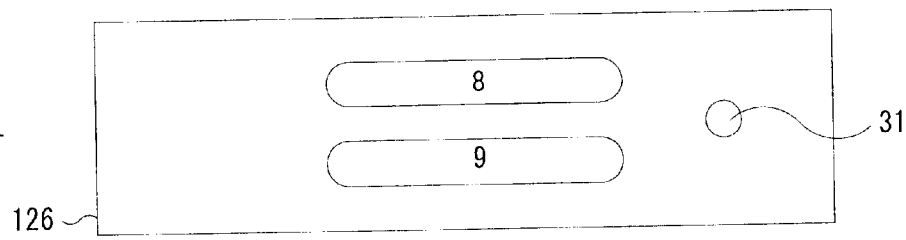
FIGS. 21A to 21D, respectively, are plans of five plate-form members that configure a small cooling unit used in the cooling device relating to the fifth embodiment of the present invention.
Figure 21B:
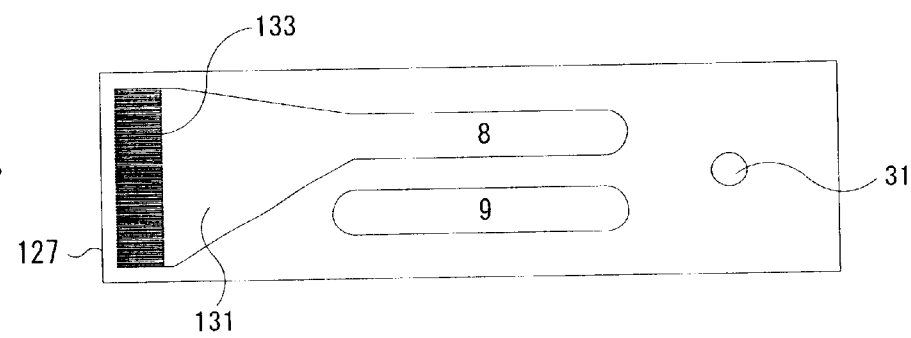
Figure 21C:
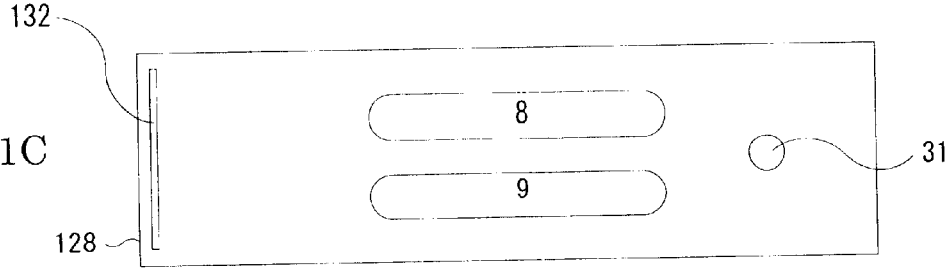
Figure 21D:
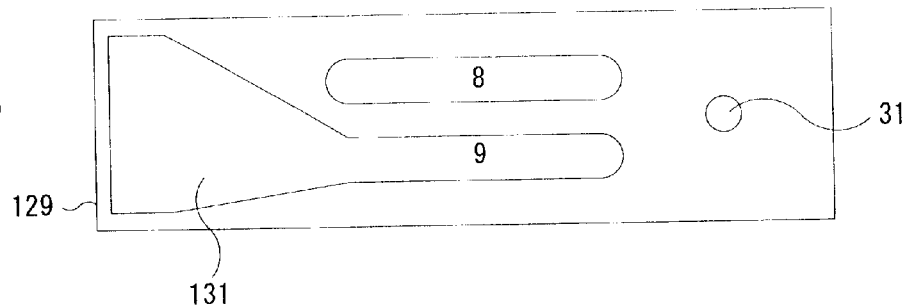
Figure 21E:
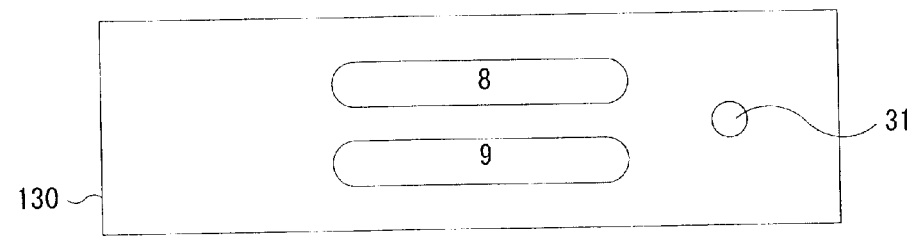

In the first plate-form member 141, as diagrammed in FIG. 20A, a cooling liquid intake opening 8 and outlet opening 9 and an inflow opening 4 and outflow opening 5 are formed.

In the second plate-form member 142 are formed an outflow water passage 34 that connects the outlet opening 9 and the outflow opening 5, a cooling liquid flow channel 131, the width whereof widens as it extends from the intake opening 8 to the front end surface of the cooling unit, which connects the inflow opening 4 and the intake opening 8, and microchannels 133 which are formed along the front end surface of the cooling unit.

In the third plate-form member 143 are formed an intake opening 8 and an outlet opening 9, an inflow opening 4 and an outflow opening 5, and a slit 132 that configures a cooling liquid flow channel corresponding to the front end surface of the cooling unit in the cooling liquid flow channel 131 described above, and which is independent of the intake opening 8 and the outlet opening 9 described above.

In the fourth plate-form member 144 are formed an inflow water passage 32 that connects the intake opening 8 and the inflow opening 4 of the third plate-form member 143, and a cooling liquid flow channel 131, the width whereof narrows as it extends from a site corresponding to the slit 132 in the third plate-form member 143 toward a site corresponding to the outlet opening 9 in the third plate-form member 143, which connects the outlet opening 9 and the outflow opening 5 of the third plate-form member 143.

The fifth plate-form member 145 has the same layout as the first plate-form member 141.

These first to fifth plate-form members 141 to 145 are deployed such that the first plate-form member 141 is deployed at the very top, followed in order therebelow by the second, third, and fourth plate-form member, and then the fifth plate-form member 145 is deployed at the very bottom.

The first to fifth plate-form members 141 to 145, furthermore, are each made of a material such as copper that exhibits a high coefficient of thermal conductivity. When these are stacked together, the cooling liquid inducted into the inflow openings 4 thereof passes through the microchannels 133 and from there is discharged to the outflow openings 5. During that process, the laser bar (not shown) deployed along the front end surface on the plate-form member 145 is cooled by that cooling liquid. In the microchannels 133, moreover, are formed very fine flow channels having widths on the order of 20 μm, by a laser process or the like, for the purpose of checking the decline in heat exchange efficiency induced by a boundary layer of the cooling liquid.

Figure 1A:
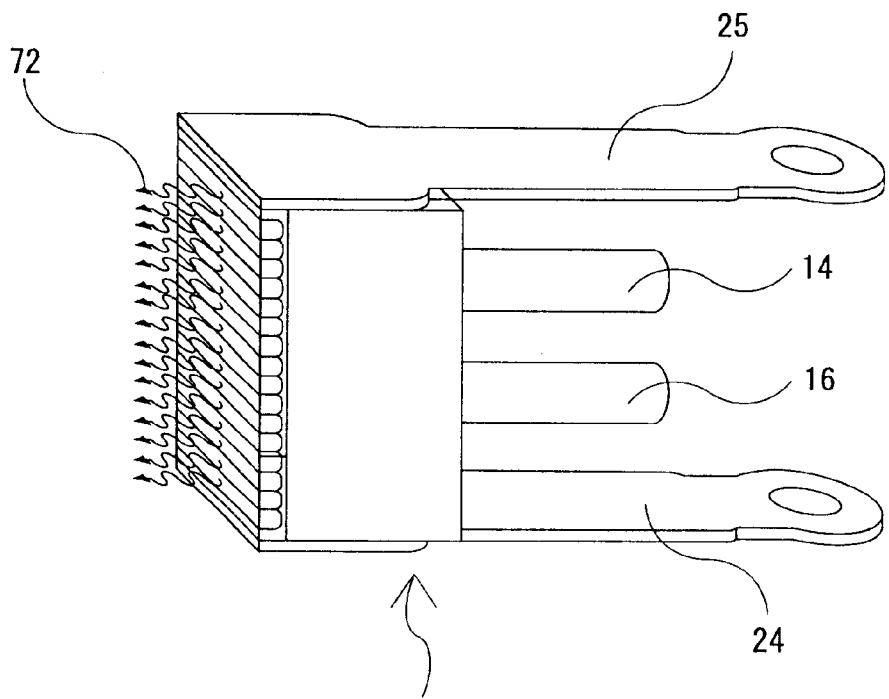
FIG. 1A is a diagram of the configuration of a surface emitting device comprising a plurality of conventional one-dimensional laser diode arrays.
Figure 1B:
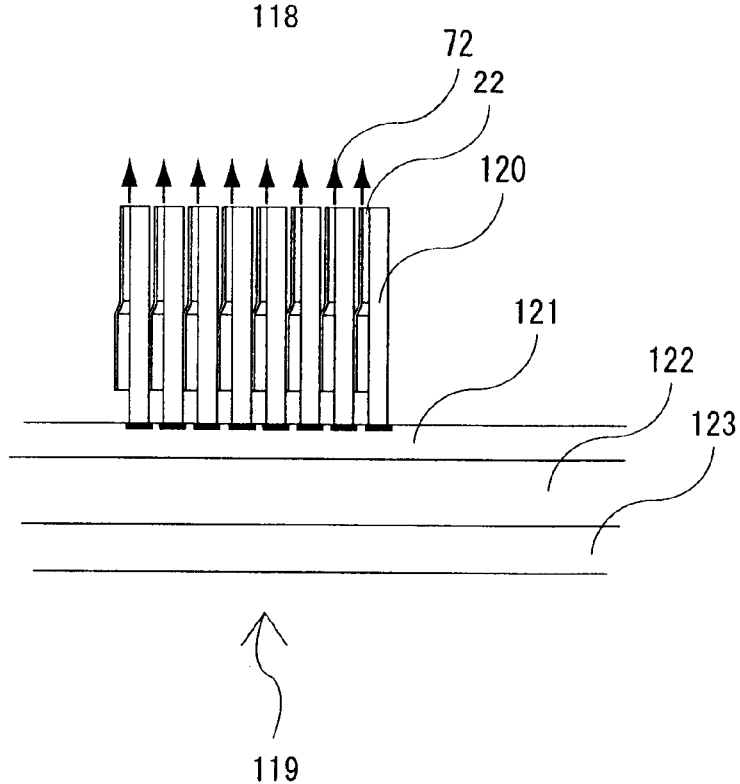
FIG. 1B is a cross-sectional view of the configuration of the main parts of a cooling device for the surface emitting device diagrammed in FIG. 1A.
Figure 2:
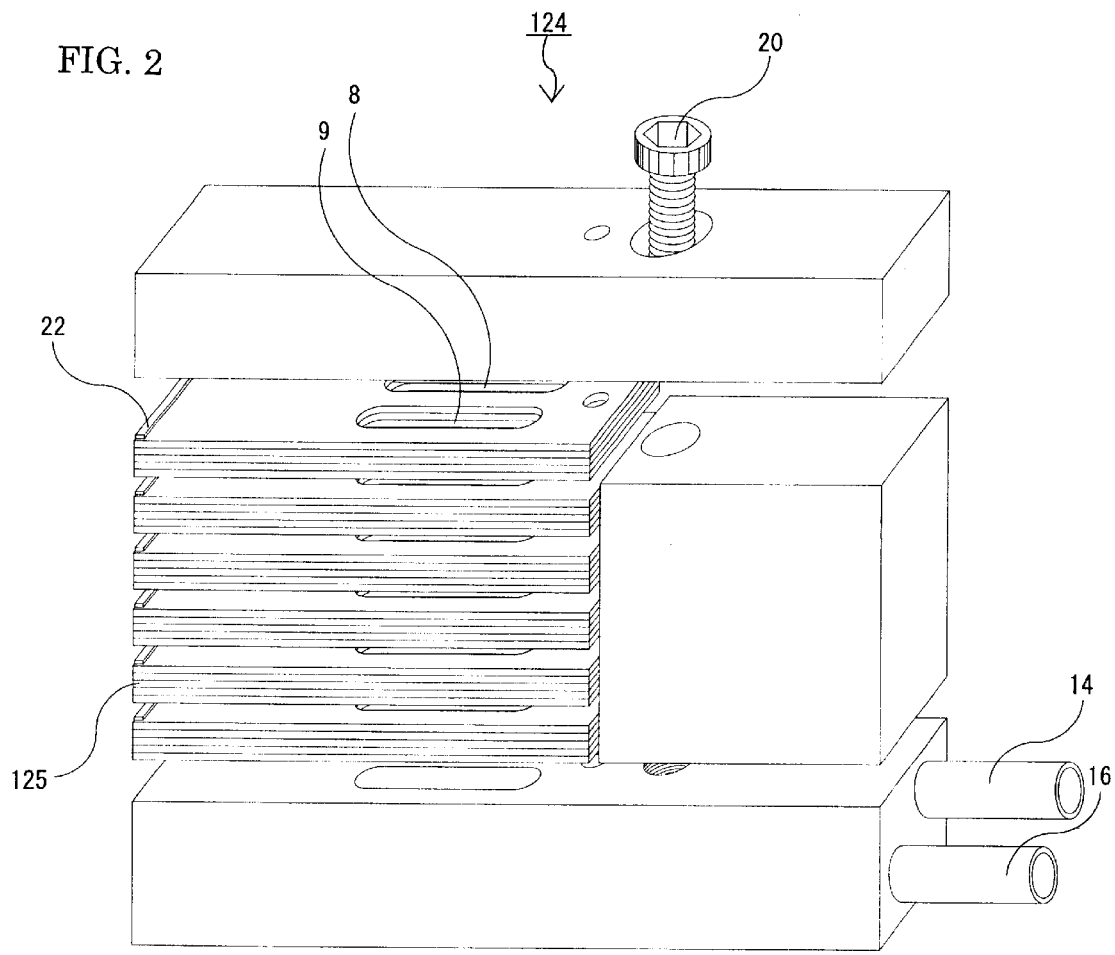
FIG. 2 is an exploded view of the configuration of a surface emitting device comprising a plurality of conventional one-dimensional laser diode arrays different from that diagrammed in FIG. 1A.
Figure 3:
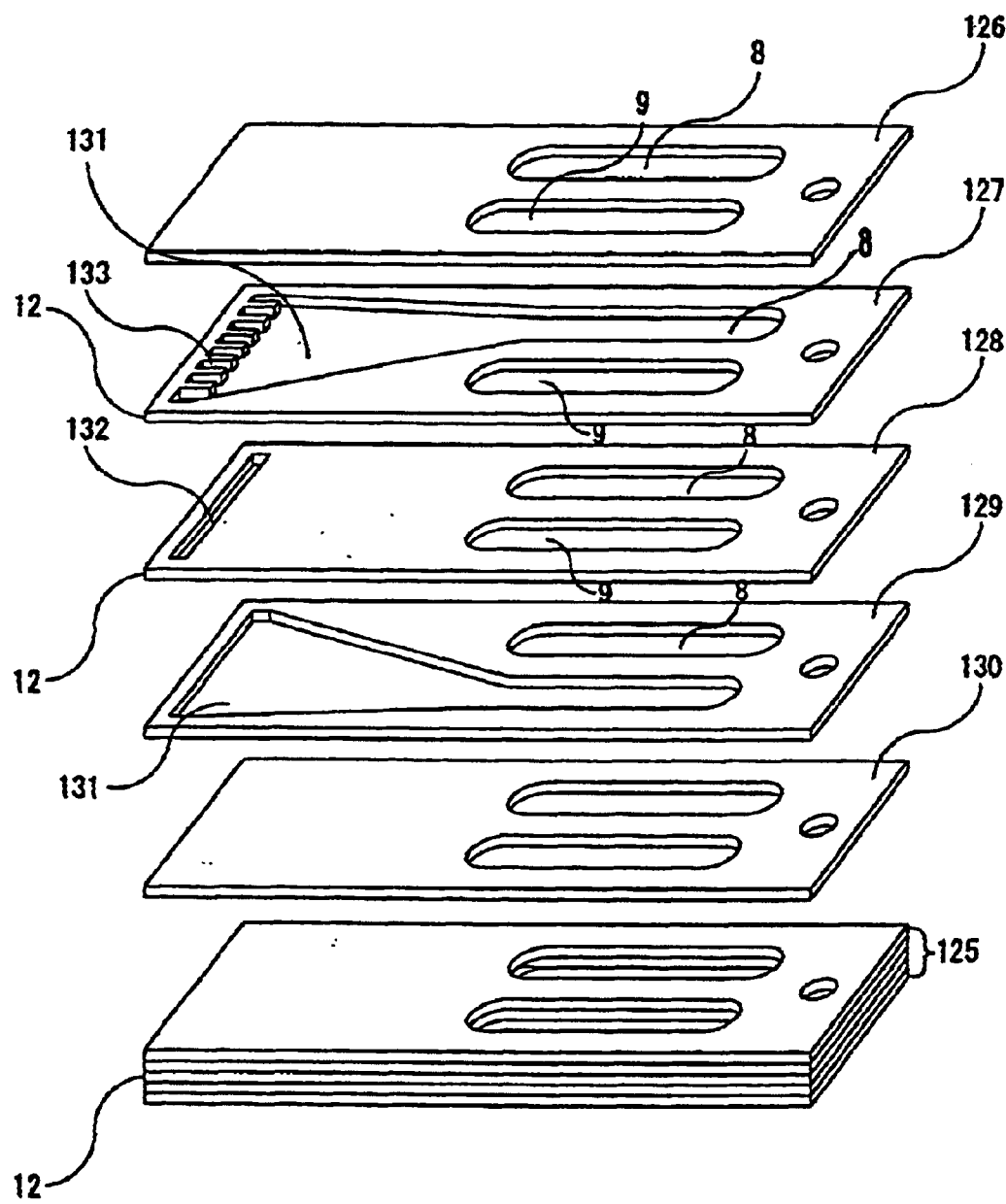
FIG. 3 is an exploded view of the configuration of a cooling unit for cooling one of the one-dimensional laser diode arrays diagrammed in FIG. 2.

The small cooling unit 12 according to this embodiment has the same structure as the cooling unit 125 (conventional example) diagrammed in FIG. 3.

Thus the cooling device relating to this embodiment provides the same benefits as the cooling devices relating to the embodiments described earlier.

Sixth Embodiment

A sixth embodiment of the present invention is now described with reference to FIG. 22.

Figure 22:
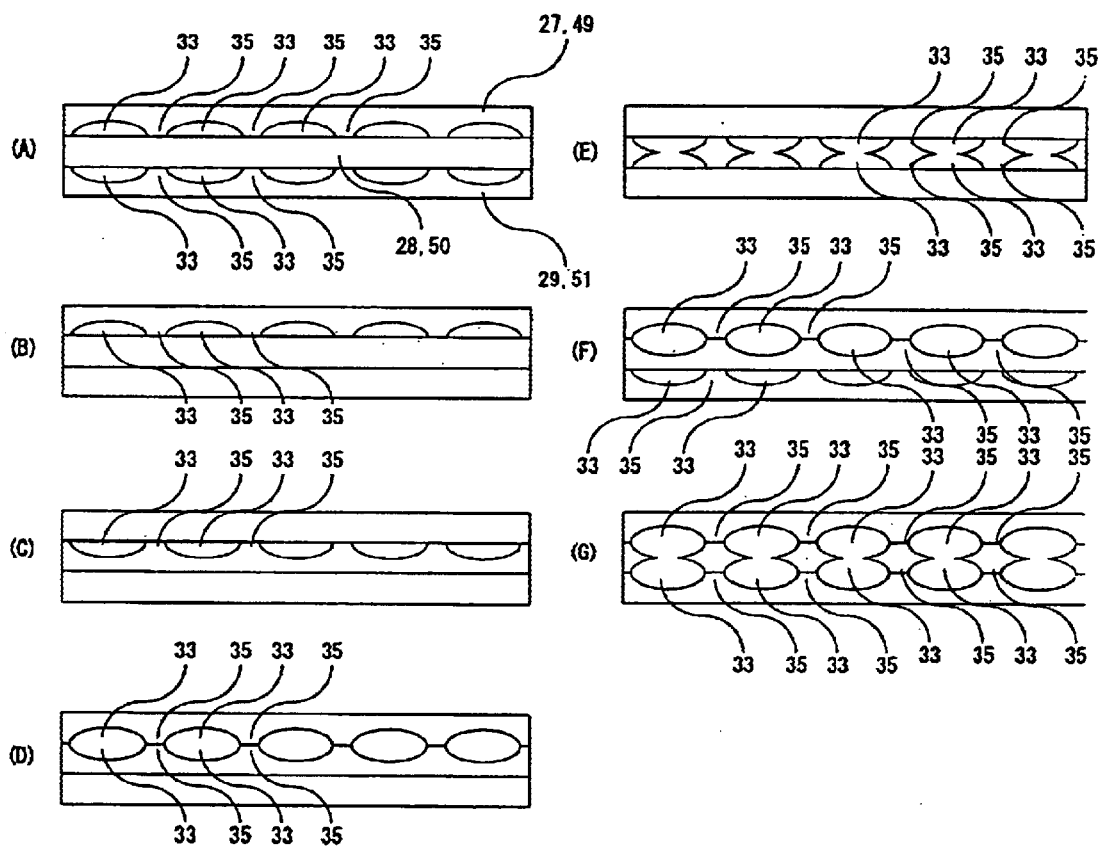
FIG. 22 is a cross-sectional view of a cooling device, and various modification examples thereof, relating to a sixth embodiment of the present invention, which particularly indicates the structures of cross-sections that are perpendicular to an inflow water channel or outflow water channel in a large cooling unit that is a configuring component of the cooling device.

FIG. 22, in (A) to (G), represents various modification examples of a cooling device relating to this embodiment. These diagrams, respectively, are vertical cross-sections for inflow water passages or outflow water passages of large cooling units that are configuring components in a cooling device.

In FIG. 22, at (A), what is indicated is that grooves 33 that function as inflow water passages 32 or outflow water passages 34 in the two plate-form members (either 27 and 49, or 29 and 51) of the three plate-form members that are deployed on the outside, as in the large cooling units 1, 47, and 48 described earlier, are provided between the ridges 35 and 35. Functionally, it is permissible to provide these grooves 33 and ridges 35 only in one of the two plate-form members deployed on the outside, as diagrammed at (B) and (C). However, it is preferable that this be the one wherein the cross-sectional area of the water passages is greater in order to reduce pressure loss in the cooling liquid in the inflow water passages 32 or outflow water passages 34. Alternatively, the same level of water passage cross-sectional area as in (A) can be obtained by configuring as at (D) or (E). Or, alternatively, the grooves 33 can be provided in all three of the plate-form members, increasing the water passage cross-sectional area, as at (F) or (G).

However, when the grooves 33 are formed by etching from both sides of the plate-form members sandwiched in the middle, as in (E) or (G) in FIG. 22, so that the grooves 33 penetrate through the plate-form members, if the grooves 33 are made to penetrate along their entire lengths, it will become impossible to hold the ridges 35 that form the grooves 33, wherefore, the grooves 33 may be formed from both sides only in those portions where the widths of the inflow water passages 32 or outflow water passages 34 have to be made narrow, for example.

Thus, with the cooling device relating to this embodiment, cooling liquid pressure loss in the inflow water passages 32 or outflow water passages 34 inside the large cooling units is reduced, and the flow volume of the cooling liquid supply to the cooling units can easily be increased and the cooling capacity of the cooling devices thus enhanced. As a result, the supply pressure required for the cooling liquid supply unit can be reduced, and the demands for the pipeline from the cooling liquid supply unit to be able to withstand pressures can be moderated, thus contributing to lower costs in the cooling units overall.

Seventh Embodiment

A seventh embodiment of the present invention is now described with reference to FIGS. 23A and 23B.

Figure 23A:
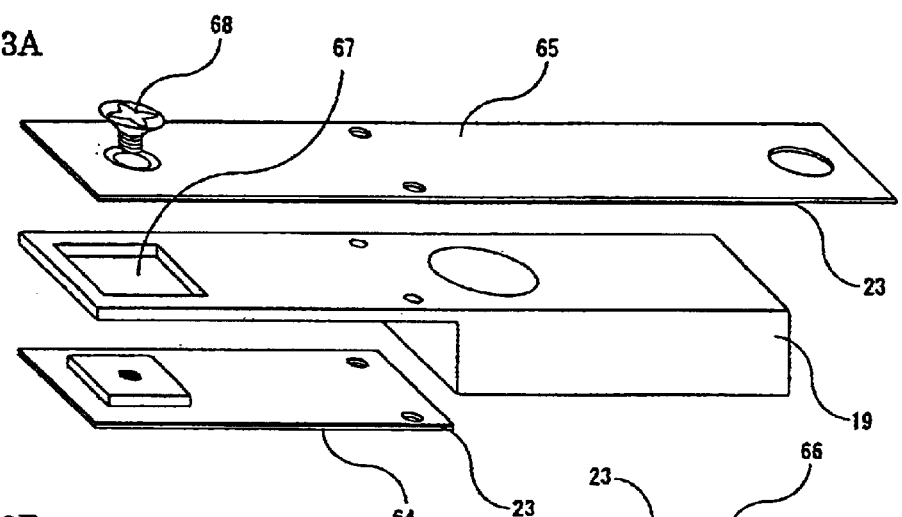
FIGS. 23A and 23B are diagonal views of a surface emitting device, and a modification example thereof, relating to a seventh embodiment of the present invention, which particularly indicates the structures of an electrode terminal plate, and components related thereto, which are configuring components of the surface emitting device.
Figure 23B:
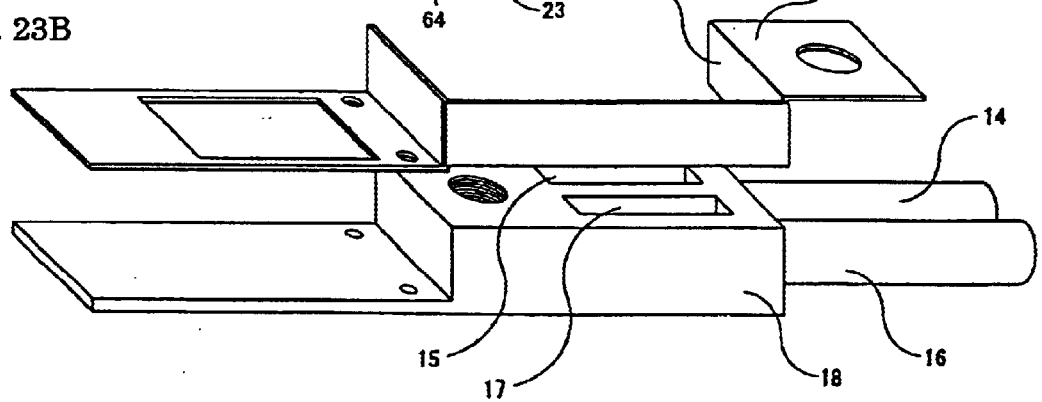

FIGS. 23A and 23B represent a surface emitting device relating to this embodiment. More specifically, these are diagonal views that diagram the structures of the electrode terminal plates that are configuring components of the surface emitting device and of associated components necessary in the invention relating to this embodiment.

In FIG. 23A are diagrammed the structures of negative electrode terminal plates 64 and 65 that are used in place of the negative electrode terminal plate 25 in the surface emitting device 26 diagrammed in FIG. 6. In FIG. 23B, on the other hand, is diagrammed the structure of a positive electrode terminal plate 66 that is used in place of the positive electrode terminal plate 24 of the surface emitting device 26 diagrammed in FIG. 6.

In FIG. 23A, an electrode lead-out through hole 67 is formed in the second tightening part 19, at a site corresponding to an area that is separated some distance from the intake opening 8 and outlet opening 9 of the small cooling unit 2. By connecting the negative electrode terminal plates 65 and 64 with a flathead screw 68, a structure for leading out the electrode terminal is effected. The electrode terminal plate 65 is insulated from the second tightening part 19 by an insulating thin plate 23 that is a insulating adhesive tape or the like.

In FIG. 23B, the structure is such that the electrode terminal is lead out using the side surface of the first tightening part 18, and an insulating thin plate 23 such as insulating adhesive tape or the like is deployed between the positive electrode terminal plate 66 and the first tightening part 18. In this embodiment, furthermore, an example is given wherein the electrode terminal plate structure diagrammed in FIG. 23A is applied to the negative electrode terminal plate, and the electrode terminal plate structure diagrammed in FIG. 23B is applied to the positive electrode terminal plate, but this may be reversed so that the electrode terminal plate structure diagrammed in FIG. 23A is applied to the positive electrode terminal plate and the electrode terminal plate structure diagrammed in FIG. 23B is applied to the negative electrode terminal plate.

In the positive electrode terminal plate 24 diagrammed in FIG. 5, cutouts are formed in order to connect the cooling liquid induction port 15 and the cooling liquid discharge port 17 formed in the first tightening part 18 to the inflow passage 6 and outflow passage 7 so that cooling liquid can flow. For that reason, there will be places in this positive electrode terminal plate 24 where the width becomes very narrow. And, because it is necessary to pass large currents of several tens of amperes to the laser bars, not only is the heat generated at the places in this positive electrode terminal plate 24 where the width becomes very narrow a problem, but the decline in efficiency resulting from wasted power consumption is also a problem. Such problems do not arise, however, with the positive electrode terminal plate 66 diagrammed in FIG. 23B.

Thus, with the surface emitting device relating to this embodiment, it becomes possible to effect lower resistance in the electrode terminal plates by increasing the surface area thereof, and to prevent both declines in reliability resulting from heat generation and declines in light emission efficiency resulting from wasted power consumption.

Eighth Embodiment

An eighth embodiment of the present invention and modification examples thereof are now described with reference to FIGS. 24A to 26B.

Figure 24A:
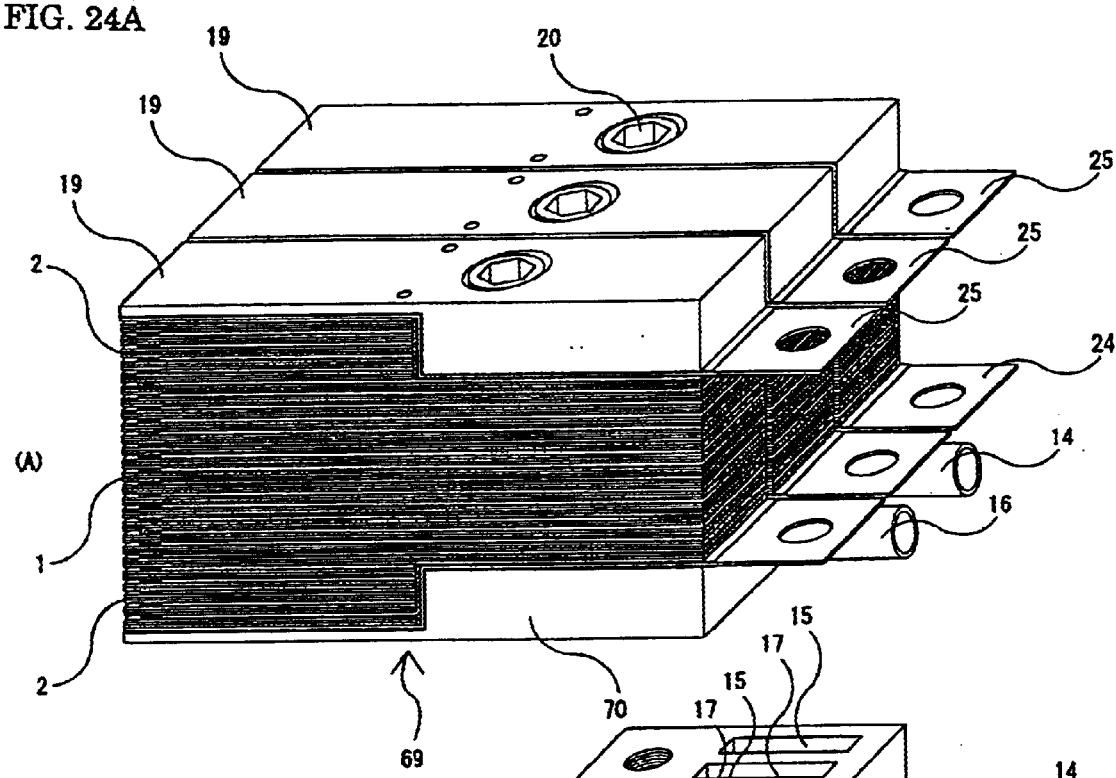
FIG. 24A is a diagonal view of the configuration of a surface emitting device relating to an eighth embodiment of the present invention.
Figure 24B:
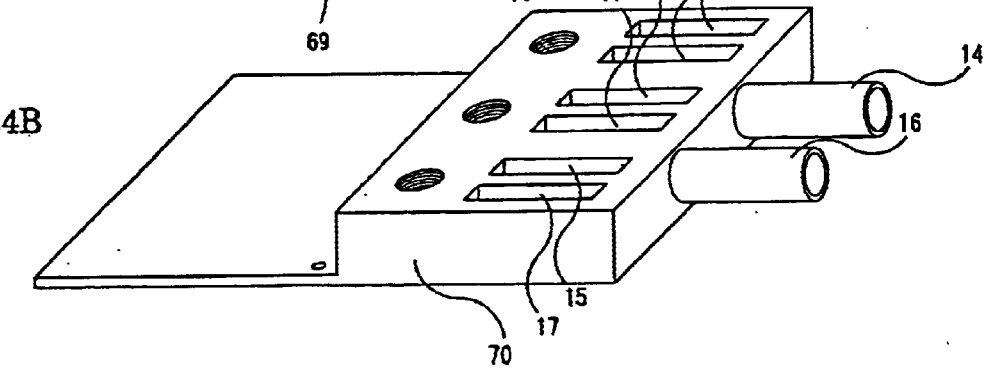
FIG. 24B is a diagonal view of a common tightening component that is one configuring element of the surface emitting device diagrammed in FIG. 24A.

This embodiment is first described using FIGS. 24A and 24B.

FIG. 24A is a diagonal view of an overall surface emitting device 69, while FIG. 24B is a diagonal view of a common tightening part 70 that is a component of the surface emitting device 69. In the surface emitting device 69 diagrammed in FIG. 24A, plural queues (three in FIG. 24A) of combinations of the large cooling units 1 and the small cooling units 2 are arranged in parallel on the common tightening part 70. Accordingly, by implementing this embodiment, a surface emitting device 69 will be realized that is larger in scale than the surface emitting device 26 diagrammed in FIG. 5 wherein a single queue of combinations of the large cooling units 1 and the small cooling units 2 is deployed on the tightening part.

In the common tightening part 70 noted above, multiple pairs of cooling liquid induction ports 15 and cooling liquid discharge ports 17 are provided, as diagrammed in FIG. 24B, in correspondence with the respective inflow passage 6 and outflow passage 7 in each of the queues of combinations of cooling units arranged in parallel. The induction pipeline 14 from the cooling liquid supply unit (not shown) branches inside the common tightening part 70 and connects to each of the cooling liquid induction ports 15, and the discharge pipeline 16 also branches inside the common tightening part 70 and connects to each of the cooling liquid discharge ports 17.

In this common tightening part 70, furthermore, bolt holes are formed to admit tightening bolts 20 for tightening the queues of stacked cooling units, as in the first tightening part 18 diagrammed in FIG. 5. Each of the second tightening parts 19 may basically have the same structure as the second tightening part 19 diagrammed in FIG. 5.

Thus, with the surface emitting device 69 relating to this embodiment, the number of pipelines from the cooling liquid supply unit can be reduced, making it easy to install the surface emitting device and to connect the pipelines.

Figure 25A:
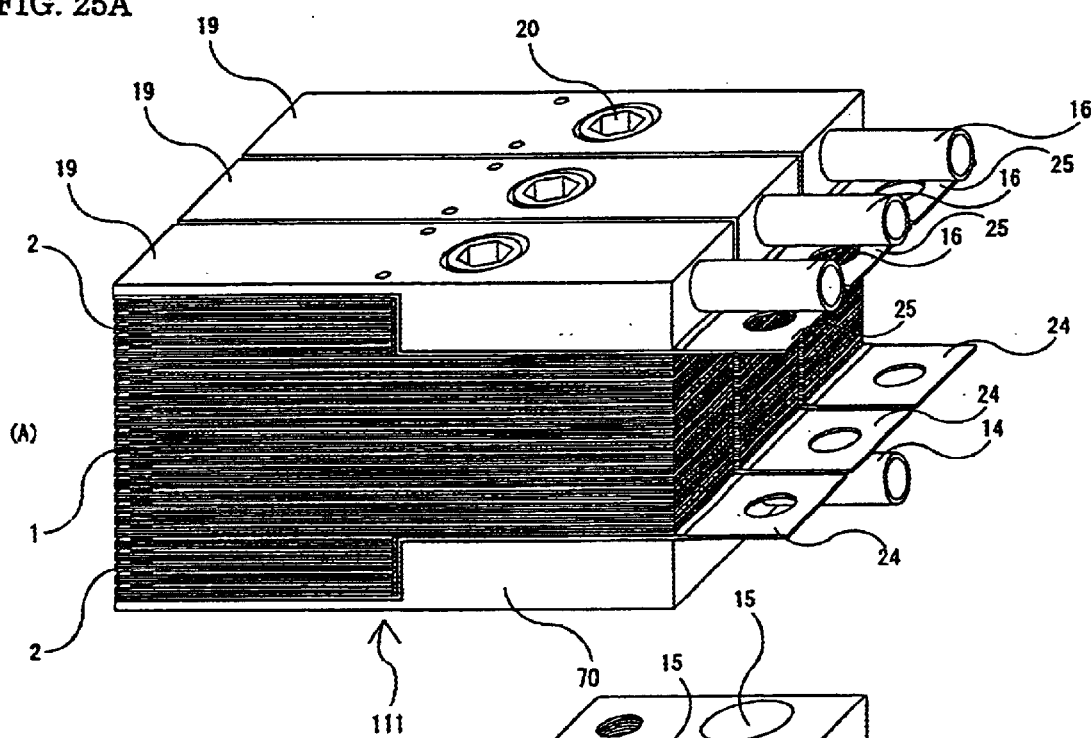
FIGS. 25A and 25B are diagrams of a first modification example of the surface emitting device diagrammed in FIGS. 24A and 24B.
Figure 25B:
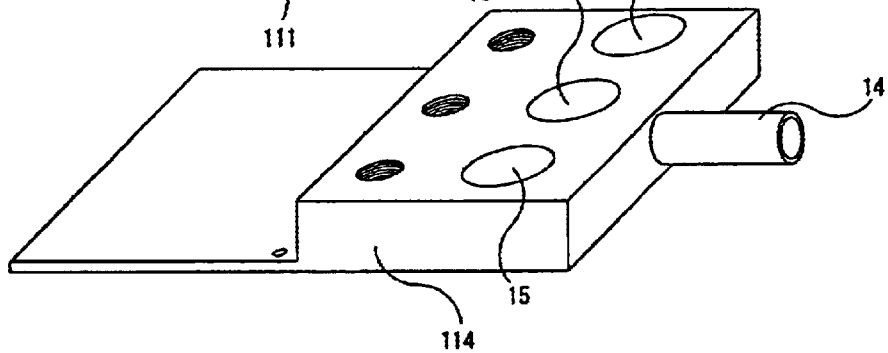

A first modification example of this embodiment is now described using FIGS. 25A and 25B.

FIG. 25A is a diagonal view of an overall surface emitting device 111, while FIG. 25B is a diagonal view of a common tightening part 114 that is a component of the surface emitting device 111. In the surface emitting device 111 diagrammed in FIG. 25A, plural queues (three in FIG. 24A) of combinations of the large cooling units 1 and the small cooling units 2 are arranged in parallel on the common tightening part 114.

In the common tightening part 114 noted above, multiple cooling liquid induction ports 15 are provided, in correspondence with the inflow passage 6 in each of the queues of combinations of cooling units arranged in parallel. The induction pipeline 14 from the cooling liquid supply unit (not shown) branches inside the common tightening part 70 and connects to each of the cooling liquid induction ports 15.

In the common tightening part 114, moreover, bolt holes are formed to admit tightening bolts 20 for tightening the queues of stacked cooling units, as in the first tightening part 18 diagrammed in FIG. 14.

Each of the second tightening parts 19, on the other hand, may basically have the same structure as the second tightening part 19 diagrammed in FIG. 14, and the discharge pipeline 16 to the cooling liquid supply unit (not shown) connects to the cooling liquid discharge port 17.

With the surface emitting device 111 related to this modification example, there ceases to be any need to cause the water passages for connecting the induction pipelines and the cooling liquid induction ports and the water passages for connecting the discharge pipelines and the cooling liquid discharge ports to cross three-dimensionally inside the common tightening part, whereupon the cost of manufacturing the common tightening part can be reduced.

Figure 26A:
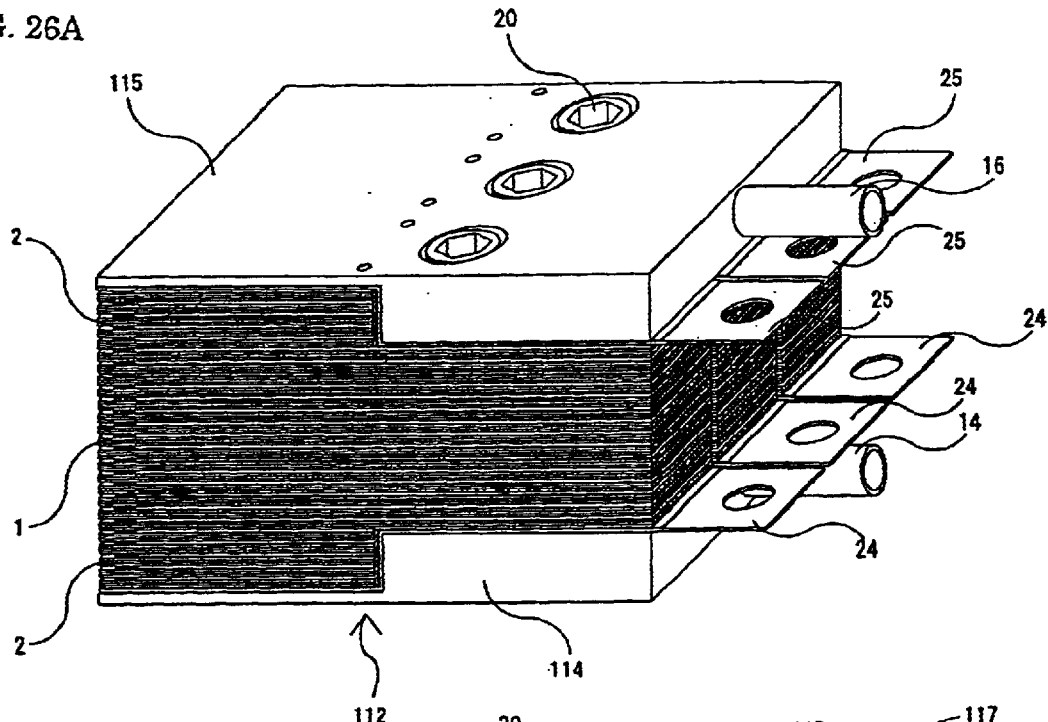
FIGS. 26A and 26B are diagrams of a second modification example of the surface emitting device diagrammed in FIGS. 24A and 24B.

A second modification example of this embodiment is now described using FIG. 26A.

The surface emitting device 112 diagrammed in FIG. 26A has plural queues (three in FIG. 26A) of combinations of the large cooling units 1 and the small cooling units 2 arranged in parallel on the common tightening part 114. The common tightening part 114 diagrammed in FIG. 26A has the same structure as the common tightening part 114 diagrammed in FIG. 25B. The plural queues of cooling units 1 and 2 arranged in parallel have pressure applied thereto, in the direction of stacking, by a second common tightening part 115, so as to prevent cooling liquid leakage.

In the second common tightening part 115, multiple cooling liquid discharge ports 17 are provided, in correspondence with the respective outflow passage 7 in each queue of the multiple queues of cooling units arranged in parallel, and the discharge pipeline 16 connected to the cooling liquid supply unit (not shown) branches inside the second common tightening part 115 and connects to each of the cooling liquid discharge ports 17.

With the surface emitting device 112 relating to this modification example, although it is necessary to match the total thickness of the stacked cooling units 1 and 2 with considerable accuracy in the several queues, the number of pipelines from the cooling liquid supply unit can be the most reduced, without causing the water passages for connecting the induction pipelines and the cooling liquid induction ports and the water passages for connecting the discharge pipelines and the cooling liquid discharge ports to cross three-dimensionally inside the common tightening part.

Figure 26B:
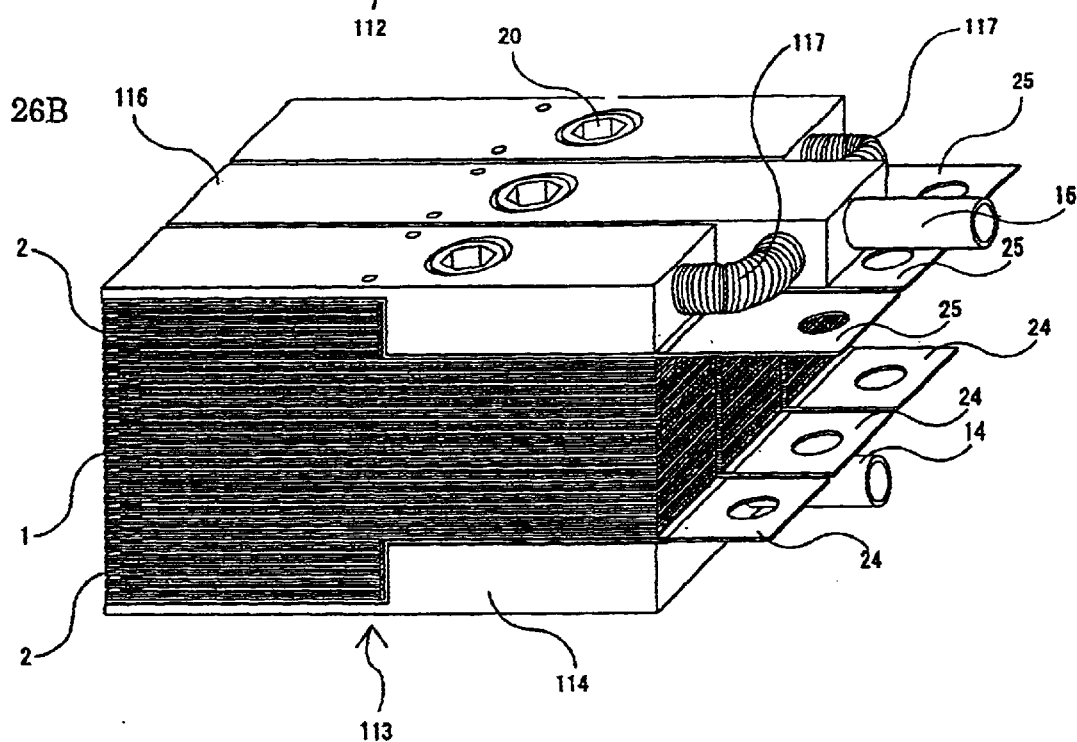

Next, a third modification example of this embodiment is described using FIG. 26B.

The surface emitting device 113 diagrammed in FIG. 26B has plural queues (three in FIG. 26A) of combinations of the large cooling units 1 and the small cooling units 2 arranged in parallel on the common tightening part 114. The common tightening part 114 diagrammed in FIG. 26B has the same structure as the common tightening part 114 diagrammed in FIG. 25B. The plural queues of cooling units 1 and 2 arranged in parallel have pressure applied thereto, in the direction of stacking, by a divided connecting type tightening part 116, so as to prevent cooling liquid leakage.

The divided connecting type tightening part 116 has a structure wherein a plural number of the second tightening parts 19 diagrammed in FIG. 14 are linked. Of the cooling liquid discharge ports, some are directly connected to the discharge pipeline 16 going to the cooling liquid supply unit (not shown), but the others are connected to the discharge pipeline via lines such as bellows 117 which can be deformed within a certain range without being destroyed.

With the surface emitting device 113 related to this modification example, given the configuration described above, the number of pipelines from the cooling liquid supply unit can be the most reduced, without causing the water passages for connecting the induction pipelines and the cooling liquid induction ports and the water passages for connecting the discharge pipelines and the cooling liquid discharge ports to cross three-dimensionally inside the common tightening part, and, in addition, cooling liquid leakage that might well occur when the stacked cooling unit thickness totals do not exactly match can be prevented.

Ninth Embodiment

A ninth embodiment of the present invention and modification examples thereof are now described with reference to FIGS. 27 to 28C.

Figure 27:
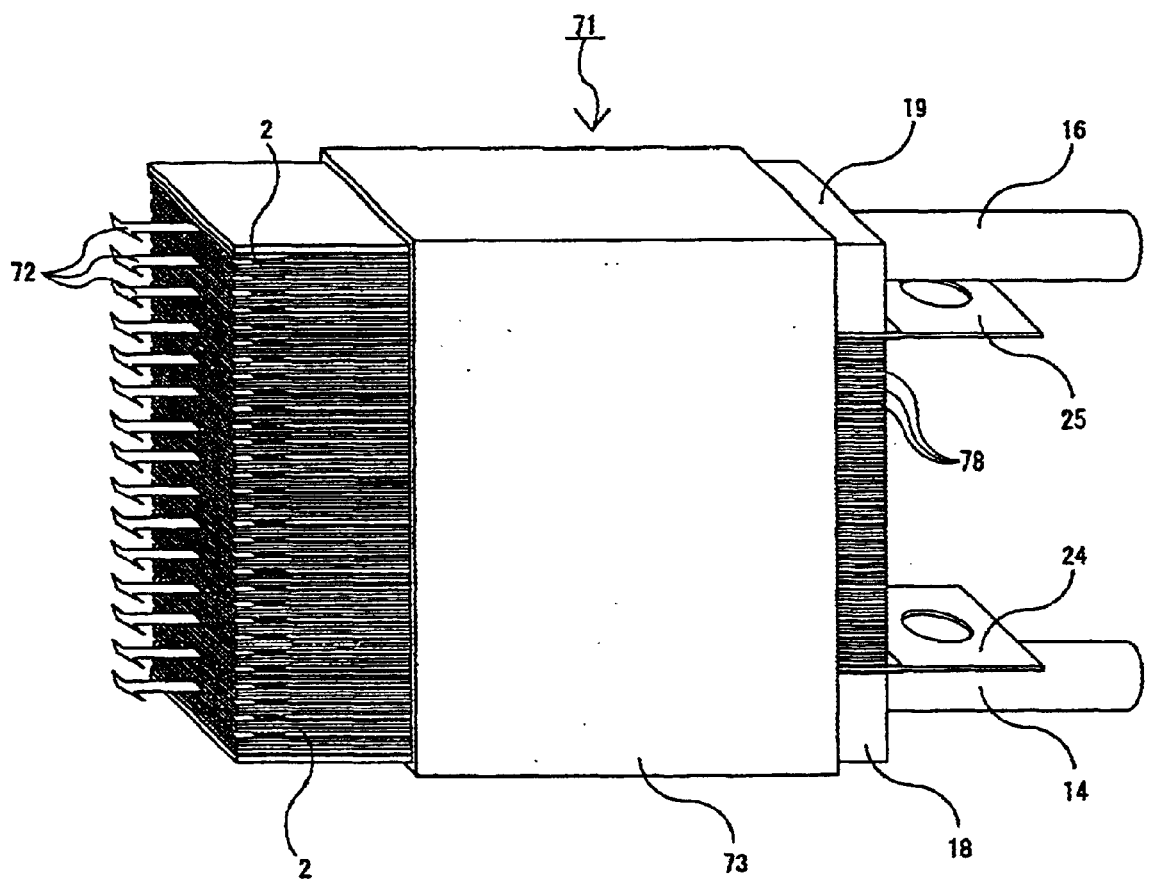
FIG. 27 is a diagonal view of a surface emitting device relating to a ninth embodiment of the present invention.

FIG. 27 is a diagonal view of a surface emitting device 71 relating to this embodiment. In FIG. 27, laser beams 72, which in actuality are output from all of the laser bars across the entire laser bar width, are represented as being output from portions of every other laser bar to make the diagram easier to understand.

In the surface emitting device 71 relating to this embodiment, instead of tightening the stacked cooling units with a tightening bolt 20 (cf. FIG. 5 and FIG. 14), a tightening belt 73 made of steel or the like is used to do that tightening, as shown in FIG. 27, whereby leakage of cooling liquid from between the cooling units is prevented and also the laser bars are electrically connected in series.

In the surface emitting device 52 diagrammed in FIG. 14, for example, the thin portions of the tightening parts 18 and 19 must have some degree of thickness so that they will not be warped by the tightening of the tightening bolt 20. With the surface emitting device 71 relating to this embodiment, however, by using the tightening belt 73, it becomes possible to tighten the cooling units 2 and 78 across a wide width, wherefore the problem of warping is eliminated, and the overall surface emitting device 71 can be made even thinner.

Figure 28A:
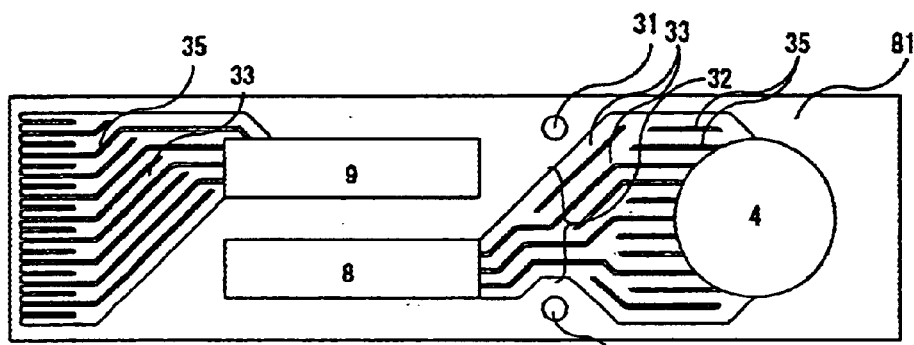
FIGS. 28A to 28C, respectively, are plans of three plate-form members that configure a large cooling unit used in the surface emitting device diagrammed in FIG. 27.
Figure 28B:
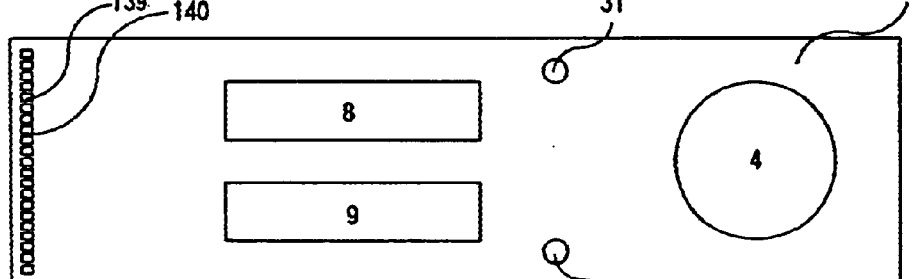
Figure 28C:
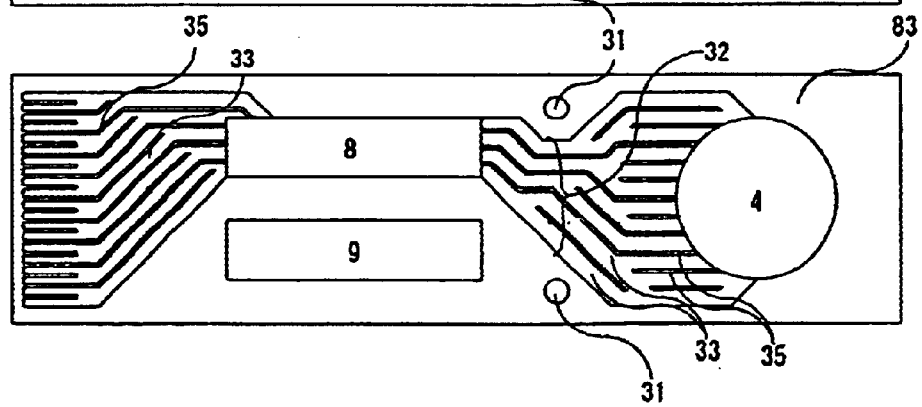

The plate-form members 81, 82, and 83 that configure the large cooling units 78 used in the cooling device that configures the surface emitting device 71 diagrammed in FIG. 27 is now described using FIGS. 28A to 28C.

The large cooling unit 78 is fabricated by mutually joining first and third plate-form members 81 and 83 together so that the surfaces thereof whereon the grooves 33 have been formed contact the upper and lower surfaces, respectively, of a second plate-form member 82.

If this large cooling unit 78 is used with the first plate-form member 81 configuring the same made to be on the upper side, then the opening formed in that first plate-form member 81 will function as the inflow opening 4. If, conversely, the large cooling unit 78 is turned over and used with the first plate-form member 81 made to be on the lower side, then that opening will function as the outflow opening 5.

Furthermore, the structures of the first, second, and third plate-form members 81, 82, and 83 diagrammed in FIGS. 28A, 28B, and 28C, are similar to the structures of the first, second, and third plate-form members 49, 50, and 51 (second embodiment) diagrammed in FIGS. 15A, 15B, and 15C. However, the plate-form members 81, 82, and 83 according to this embodiment differ from the plate-form members 49, 50, and 51 in the second embodiment in that they have no tightening bolt holes 30.

This large cooling unit 78 can be made with a shorter overall length than the large cooling unit 1 described earlier, wherefore the overall length of the surface emitting device 71 can also be made shorter. It is also possible to use the large cooling unit 77 diagrammed in FIGS. 30A and 30B, to be described subsequently, in place of the large cooling unit 78 in the surface emitting device 71.

With the surface emitting device 71 relating to this embodiment, as described in the foregoing, the surface area of the tightening part as seen from the light-emitting surface side (the laser beam 72 output side) can be made smaller, wherefore the surface area of the non-light-emitting part as seen from the light-emitting surface side can be made even smaller.

Tenth Embodiment

A tenth embodiment of the present invention and modification examples thereof are now described with reference to FIGS. 29A to 30B.

Figure 29A:
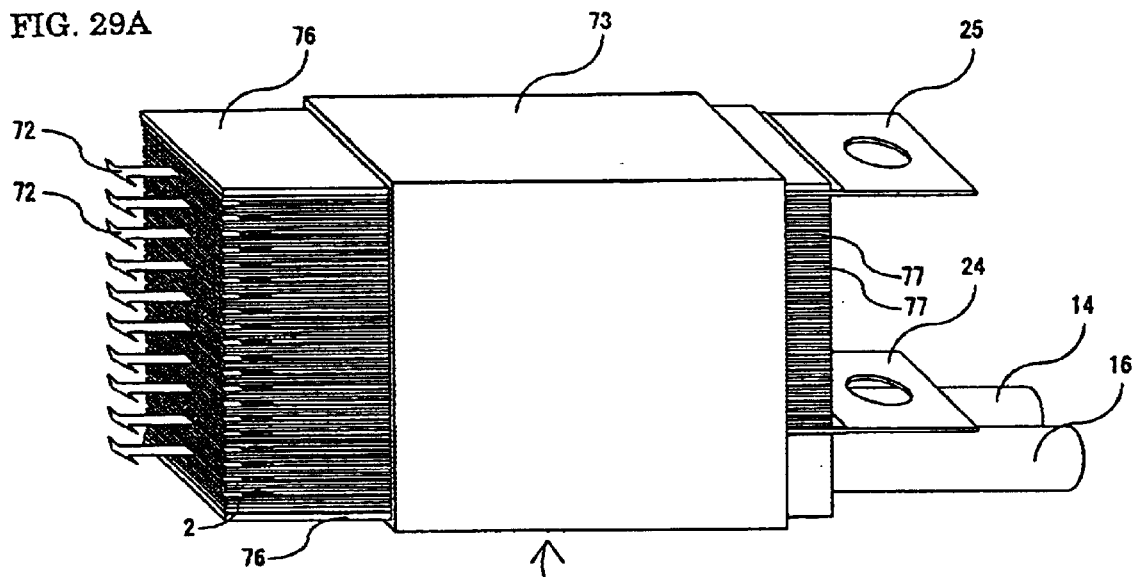
FIGS. 29A and 29B are diagonal views of a surface emitting device, and a modification example thereof, relating to a tenth embodiment of the present invention.

FIG. 29A diagrams a surface emitting device 74 relating to this embodiment. A surface emitting device 75 according to one modification example thereof is diagrammed in FIG. 29B.

Figure 29B:
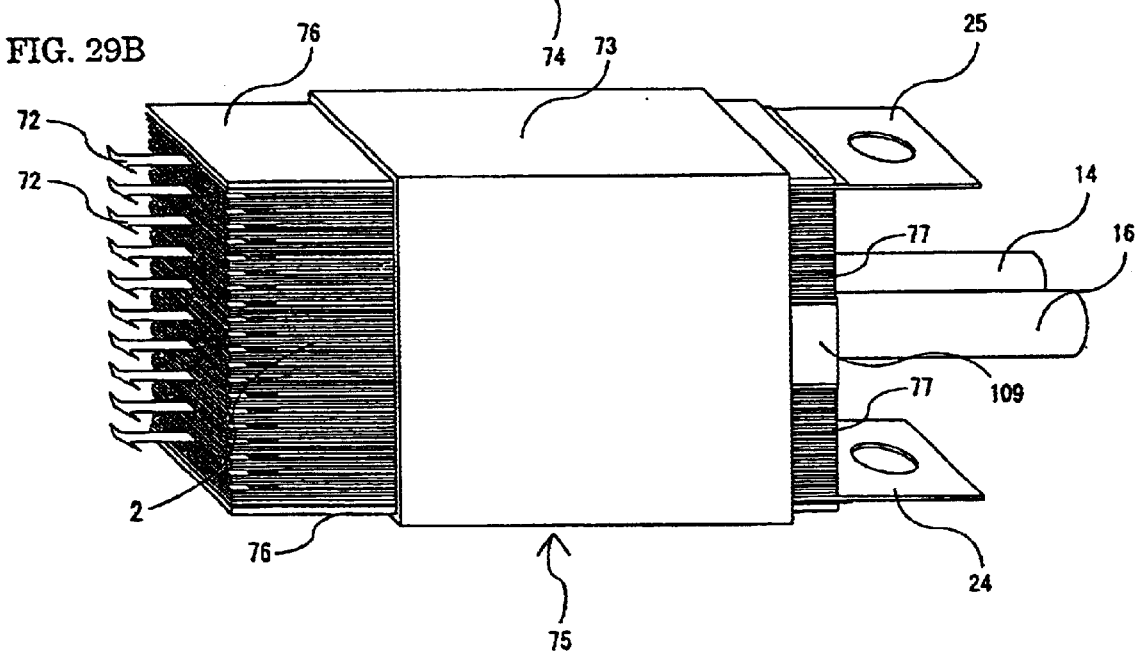

The surface emitting devices 74 and 75 diagrammed in FIG. 29A and 29B employ the tightening belt 73 as the method of tightening the stacked cooling units in the direction of stacking, as in the surface emitting device 71 (cf. FIG. 27) according to the ninth embodiment. Accordingly, since both the tightening bolt 20 and bolt hole therefor are made unnecessary, there is also no need, in a cooling device wherein the cooling units are stacked up, to secure the extra space 13 on the outside in the direction of stacking. As a result, it becomes possible to deploy the large cooling units the farthest outside in the direction of cooling unit stacking, and an arrangement of large cooling units 77 and small cooling units 2 such as in the surface emitting device 74 diagrammed in FIG. 29A and in the surface emitting device 75 diagrammed in FIG. 29B becomes conceivable.

In this embodiment, furthermore, a supplemental tightening plate 76 is used in order to prevent deformation in the cooling units or electrode terminal plates caused by tightening belt 73, but that is not absolutely necessary if the electrode terminal plates are made on the thick side to increase the mechanical strength.

Figure 30A:
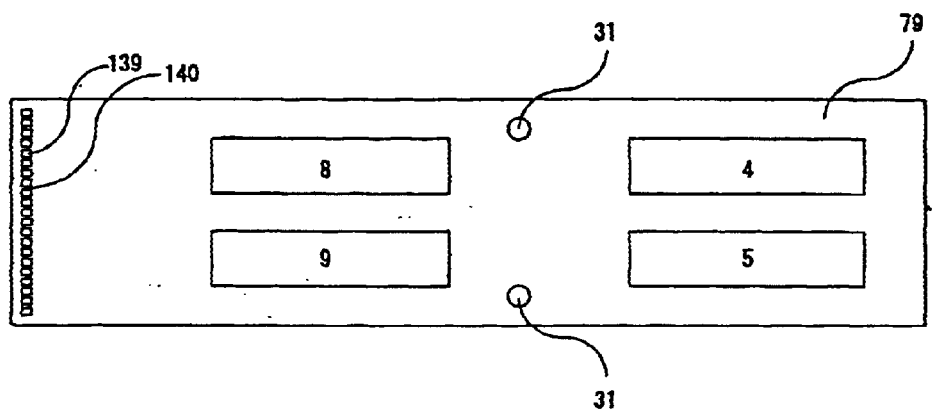
FIGS. 30A and 30B are plans of plate-form members that configure a large cooling unit used in the surface emitting device diagrammed in FIG. 29A or FIG. 29B.
Figure 30B:
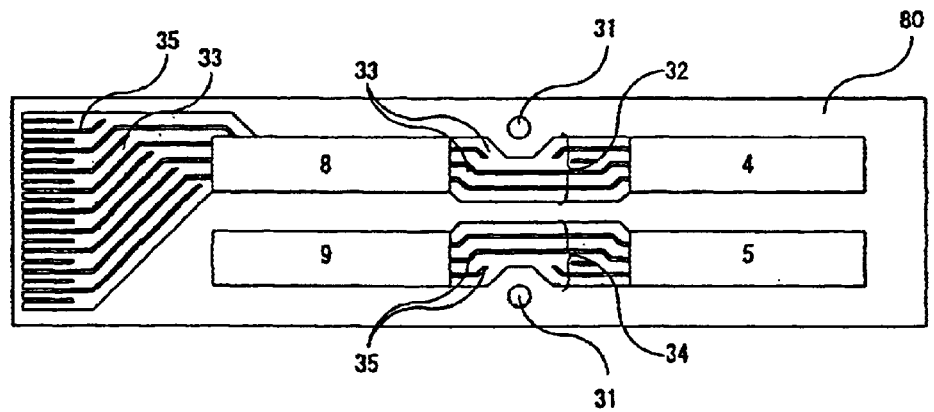

The plate-form members 79 and 80 that configure the large cooling unit 77 are now described using FIGS. 30A and 30B.

The large cooling unit 77 is fabricated by mutually joining two of the plate-form members 80 diagrammed in FIG. 30B together so that the surfaces thereof whereon the grooves 33 have been formed contact the upper and lower surfaces of the second plate-form member 79 diagrammed in FIG. 30A. Accordingly, the plate-form member on the upper side of the large cooling unit 77 and the plate-form member on the lower side thereof are both plate-form members 80 having the same structure.

Furthermore, the structures of the plate-form members 79 and 80 diagrammed in FIGS. 30A and 30B are similar to the structures of the plate-form members 28 and 27 (29) (first embodiment) diagrammed in FIGS. 9A and 9B. However, the plate-form members 79 and 80 according to this embodiment differ from the plate-form members 28 and 27 (29) in the first embodiment in that they have no tightening bolt holes 30.

In this embodiment, cooling unit tightening is done using the tightening belt 73 instead of a tightening bolt, wherefore there is no need to provide a tightening bolt hole in the large cooling units. For that reason, the overall length of the large cooling unit 77 is shorter than that of the large cooling unit 1 described earlier. As noted earlier, the number of cooling units that can be fabricated at one time is roughly inversely proportional to the surface area of the cooling units (cf. FIG. 38), wherefore it is important to make the overall length of the large cooling units as short as possible in the interest of reducing costs.

Also, the large cooling unit 77 comprising the plate-form members 79 and 80 diagrammed in FIGS. 30A and 30B is used in the surface emitting device 74 diagrammed in FIG. 29A, as described in the foregoing. In the surface emitting device 75 diagrammed in FIG. 29B, however, not only that large cooling unit 77, but also the large cooling unit 78 comprising the plate-form members 81, 82, and 83 diagrammed in FIGS. 28A, 28B, and 28C may be used.

In the surface emitting devices 74 and 75 relating to this embodiment, as described in the foregoing, it is no longer necessary to have more than a smaller extra space than in the surface emitting device 26 diagrammed in FIG. 5, wherefore the proportion of large cooling units can be increased, and the overall cooling liquid pressure loss in the inflow water passages 32 and outflow water passages 34 provided inside the large cooling units can be reduced.

It is also easy to apply this embodiment to a surface emitting device wherein the number of stacked layers is comparatively few. Also, because it is no longer necessary to provide holes in either the positive electrode terminal plate 24 or negative electrode terminal plate 25 for the passage of cooling liquid, electrode terminal plates can be deployed with are simple and of low resistance.

11th Embodiment

An 11th embodiment of the present invention is now described with reference to FIGS. 31A to 33C.

FIGS. 31A to 31C, FIGS. 32A to 32C, and FIGS. 33A to 33C, respectively, are plans of three plate-form members that configure different types of large cooling unit.

First, the plate-form members that configure a large cooling unit (hereinafter called the fourth type large cooling unit) are described using FIGS. 31A to 31C.

Figure 31A:
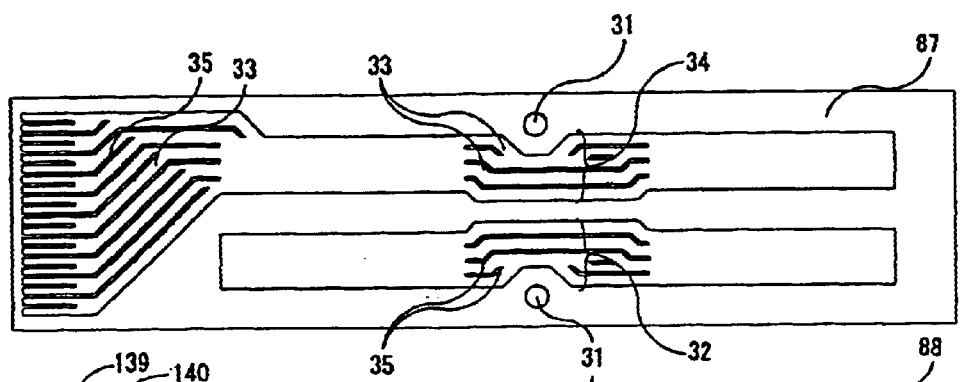
FIGS. 31A to 31C, respectively, are plans of three plate-form members that configure a large cooling unit used in a cooling device relating to an 11th embodiment of the present invention.
Figure 31B:
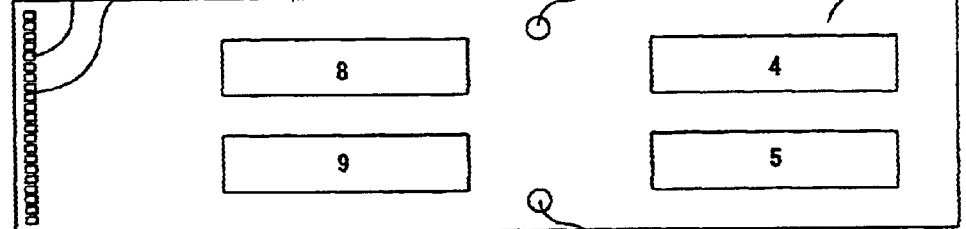
Figure 31C:
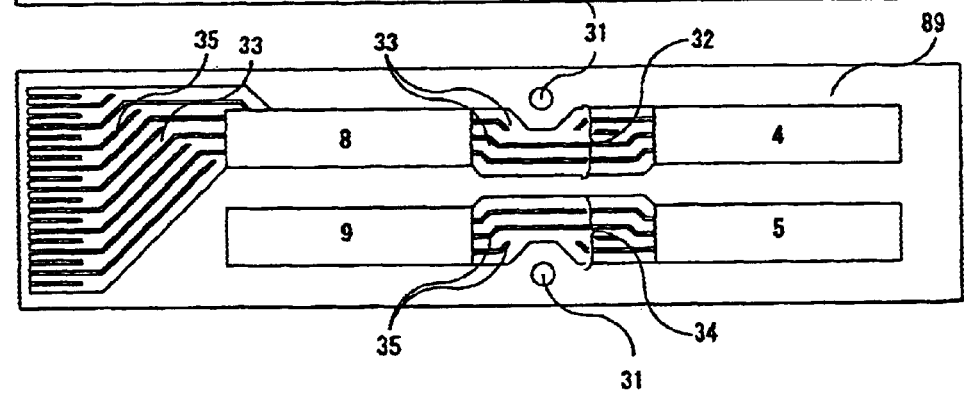

In a first plate-form member 87, as diagrammed in FIG. 31A, no inflow opening, outflow opening, intake opening, or outlet opening is provided. A second plate-form member 88, as diagrammed in FIG. 31B, has the same structure as the first plate-form member 79 (tenth embodiment) diagrammed in FIG. 30A. And a third plate-form member 89, as diagrammed in FIG. 31C, has the same structure as the second plate-form member 80 diagrammed in FIG. 30B.

The fourth type of large cooling unit is fabricated by mutually joining the first and third plate-form members 87 and 89 together so that the surfaces thereof whereon the grooves 33 have been formed contact the upper and lower surfaces, respectively, of the second plate-form member 88. In the large cooling unit formed by these plate-form members 87, 88, and 89, there is no inflow opening 4, outflow opening 5, intake opening 8, or outlet opening 9 that passes all the way through.

Next, the plate-form members that configure a large cooling unit (hereinafter called the fifth type large cooling unit) are described using FIGS. 32A to 32C.

Figure 32A:
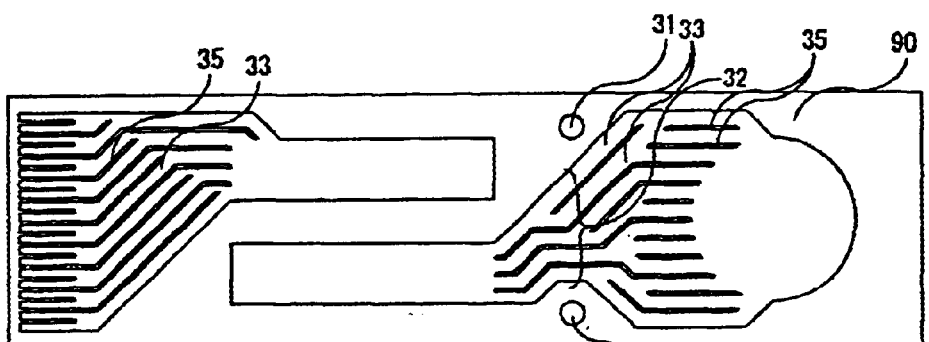
FIGS. 32A to 32C, respectively, are plans of plate-form members that are a different type than the plate-form members diagrammed in FIGS. 31A to 31C.
Figure 32B:
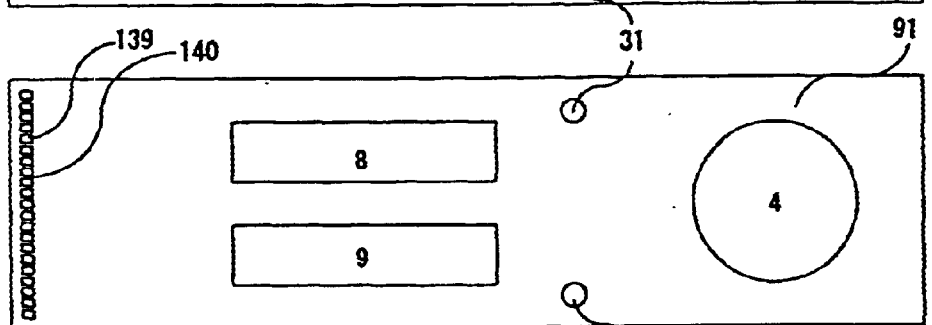
Figure 32C:
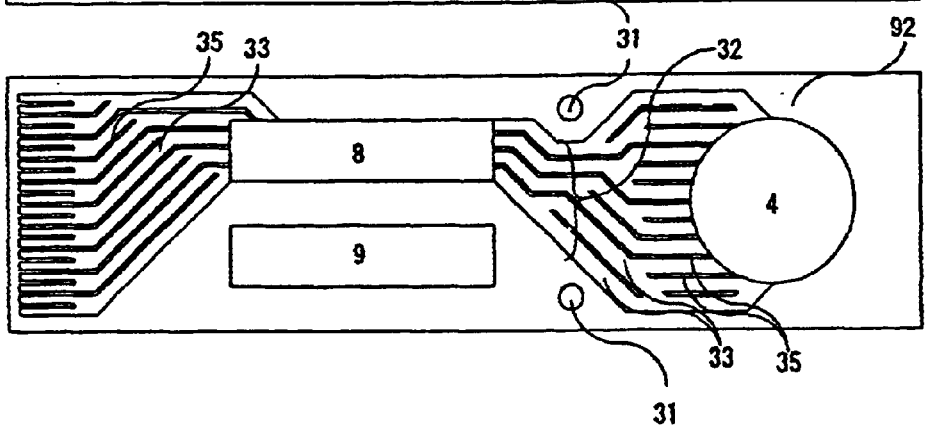

In a first plate-form member 90, as diagrammed in FIG. 32A, no inflow opening, outflow opening, intake opening, or outlet opening is provided. A second plate-form member 91, as diagrammed in FIG. 32B, has the same structure as the second plate-form member 82 (tenth embodiment) diagrammed in FIG. 28B. And a third plate-form member 92, as diagrammed in FIG. 32C, has the same structure as the third plate-form member 83 diagrammed in FIG. 28C.

The fifth type large cooling unit is fabricated by mutually joining the first and third plate-form members 90 and 92 together so that the surfaces thereof whereon the grooves 33 have been formed contact the upper and lower surfaces, respectively, of the second plate-form member 91. In the large cooling unit formed by these plate-form members 90, 91, and 92, there is no inflow opening 4, outflow opening 5, intake opening 8, or outlet opening 9 that passes all the way through.

Next, the plate-form members that configure a large cooling unit (hereinafter called the sixth type large cooling unit) are described using FIGS. 33A to 33C.

Figure 33A:
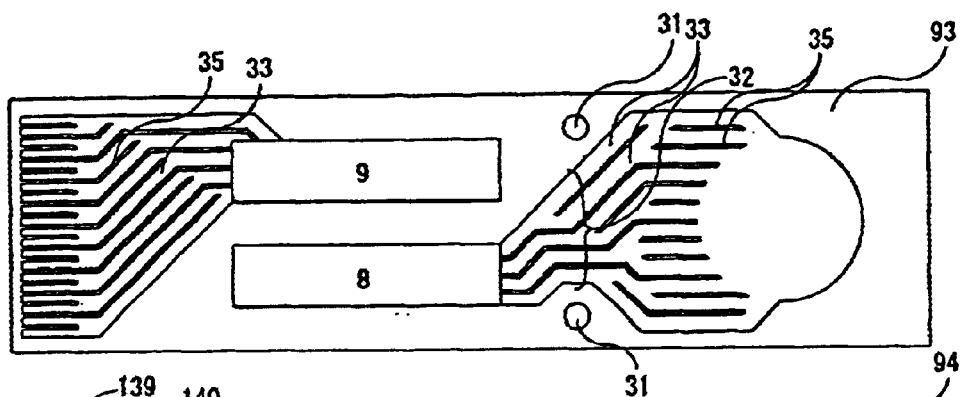
FIGS. 33A to 33C, respectively, are plans of plate-form members that are another different type than the plate-form members diagrammed in FIGS. 31A to 31C.
Figure 33B:
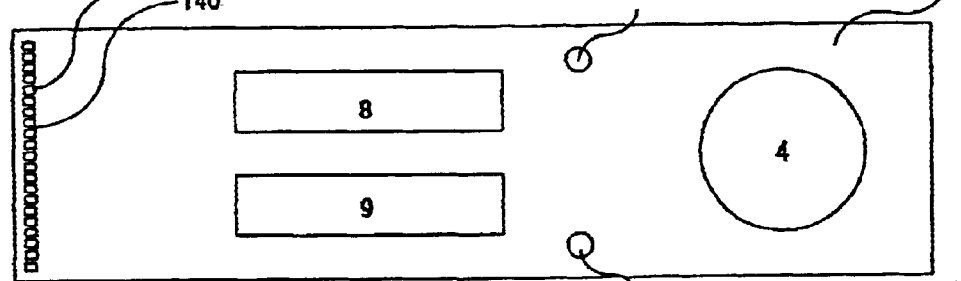
Figure 33C:
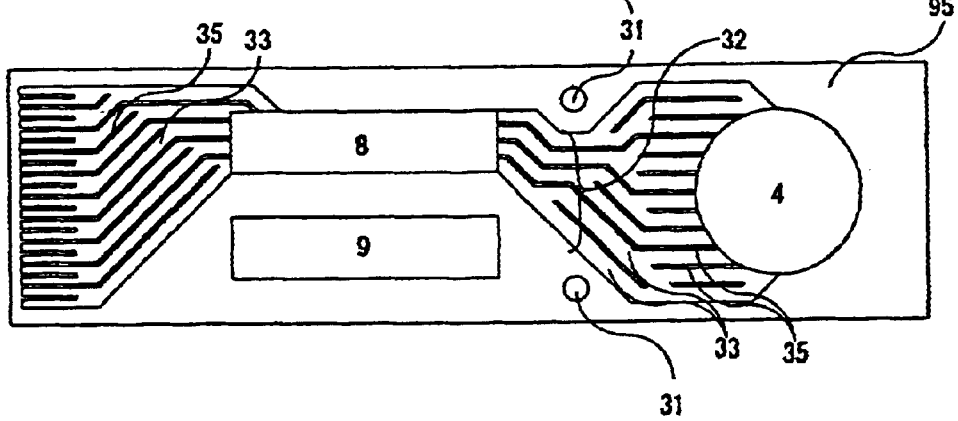

In a first plate-form member 93, as diagrammed in FIG. 33A, no inflow opening or outflow opening is provided. A second plate-form member 94, as diagrammed in FIG. 33B, has the same structure as the second plate-form member 82 (ninth embodiment) diagrammed in FIG. 28B. And a third plate-form member 95, as diagrammed in FIG. 33C, has the same structure as the third plate-form member 83 diagrammed in FIG. 28C.

The sixth type large cooling unit is fabricated by mutually joining the first and third plate-form members 93 and 95 together so that the surfaces thereof whereon the grooves 33 have been formed contact the upper and lower surfaces, respectively, of the second plate-form member 94. In the large cooling unit formed by these plate-form members 93, 94, and 95, there is no inflow opening 4 or outflow opening 5 that passes all the way through.

The fourth type large cooling unit (cf. FIGS. 31A to 31C) described in the foregoing is used in a combination with the large cooling unit diagrammed in FIGS. 30A and 30B. The fifth and sixth types of large cooling unit (cf. FIGS. 32A to 32C and FIGS. 33A to 33C) indicated above, on the other hand, are used in combinations with the large cooling unit diagrammed in FIGS. 28A to 28C. These fourth, fifth, and sixth types of large cooling units are like the large cooling unit diagrammed in FIGS. 28A to 28C and FIGS. 30A and 30B in that they have no tightening bolt holes and in that the overall lengths thereof, respectively, are shorter.

The fourth type large cooling unit (cf. FIGS. 31A to 31C) can be used as the uppermost cooling device in the surface emitting device 74 diagrammed in FIG. 29A. In that case, the first plate-form member 87 (cf. FIG. 31A) configuring this large cooling unit will be on the upper side. The fourth type large cooling unit, furthermore, can also be used as the uppermost cooling unit (whereupon the first plate-form member 87 will be on the upper side) and as the lowermost cooling unit (whereupon the first plate-form member 87 will be on the lower side) in the surface emitting device 75 diagrammed in FIG. 29B.

The fifth type of large cooling unit (cf. FIGS. 32A to 32C) can be used in the surface emitting device 75 diagrammed in FIG. 29B as the uppermost cooling unit (whereupon the first plate-form member 90 will be on the upper side) and as the lowermost cooling device (whereupon the first plate-form member 90 will be on the lower side).

These fourth type and fifth type large cooling units are deployed the farthest to the outside of the stacked cooling units, and more completely prevent cooling liquid leakage.

The sixth type large cooling unit (cf. FIGS. 33A to 33C) can be used in the surface emitting device 71 diagrammed in FIG. 27 (ninth embodiment), whereupon, by being deployed in similar positions as the large cooling unit 53 diagrammed in FIG. 17, the inflow passages and outflow passages are definitely separated.

Here, when two of the sixth type of large cooling units are deployed adjacently, a large cooling unit having the first plate-form member 93 on the lower side is deployed on a large cooling unit having the first plate-form member 93 on the upper side.

As based on the cooling device relating to this embodiment, while holding down increases in the number of parts that constitutes a cause of increased costs to a minimum, more complete cooling liquid leakage protection is realized by using cooling units wherein unnecessary openings are closed, and it becomes possible to more definitely separate the inflow passages from the outflow passages, so that operational reliability is enhanced.

12th Embodiment

A 12th embodiment of the present invention is now described with reference to FIGS. 34A and 34B.

Figure 34A:
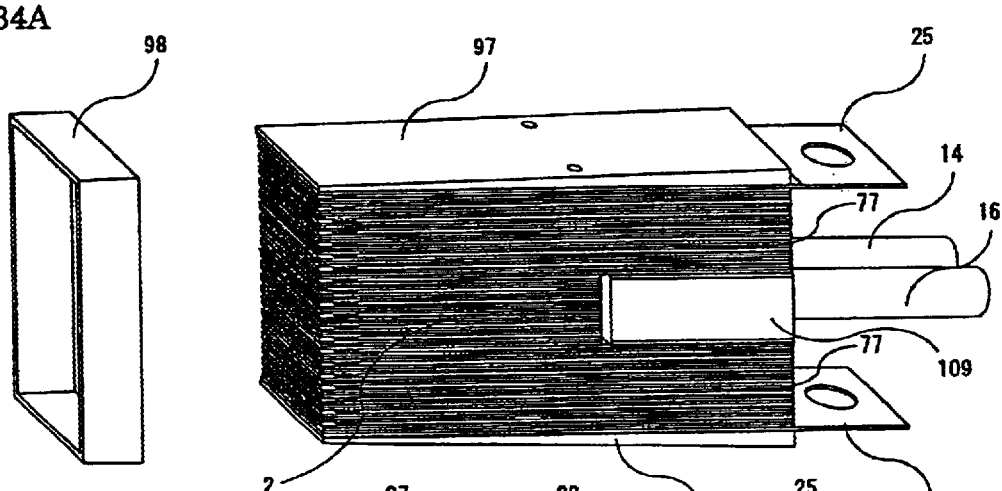
FIGS. 34A and 34B, respectively, are diagrams of a surface emitting device in a 12th embodiment of the present invention, showing the condition thereof both before assembly and after assembly.
Figure 34B:
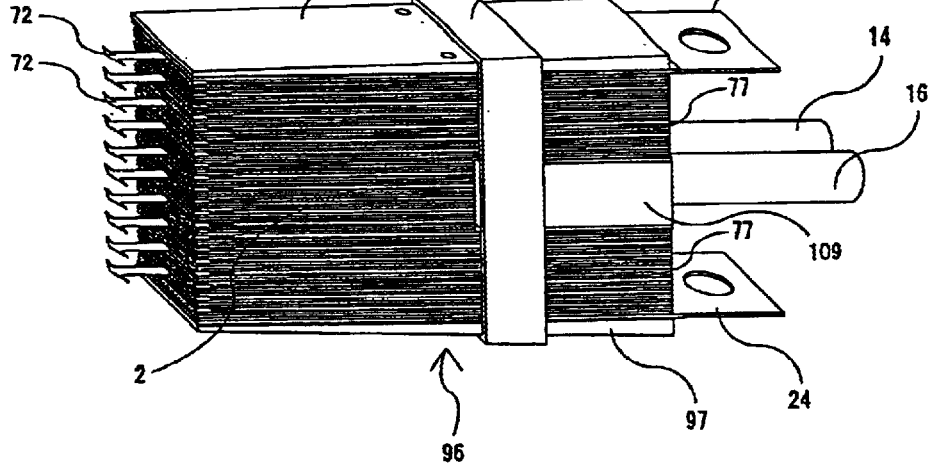

FIG. 34A represents the condition of a surface emitting device 96 according to this embodiment prior to assembly, while FIG. 34B represents that surface emitting device 96 after it has been assembled.

A supplemental tightening plate 97 used in the surface emitting device 96 is machined to a tapered shape so that it becomes slightly thinner toward the light-emitting surface side (the left side in FIG. 34B). The cooling device comprised by stacking together a plurality of the cooling units is subjected to a load in the direction of stacking by a weight applying device (not shown) and, in that loaded condition, the cooling device is pushed into a ring-shaped tightening belt 98 such as that diagrammed in FIG. 34A. After that, even when the weight of the weight applying device is removed, the cooling units that are stacked up in a plurality to configure the cooling device are held in a condition wherein pressure continues to be applied in the direction of stacking by the tightening belt 98.

As a result, leakage of the cooling liquid from between the cooling units is prevented, the laser bars are electrically connected in series, and the surface emitting device is realized. When a metal material is used for the tightening belt 98, spacer parts 109 may be deployed on the inside side surfaces thereof as diagrammed in FIGS. 34A and 34B.

With this embodiment, tightening of the required intensity can easily be brought to bear on a cooling device made up of a plurality of stacked cooling units without any tightening bolt, and a surface emitting device can be effected that has few non-light-emitting parts as seen from the light-emitting surface side.

13th Embodiment

A 13th embodiment of the present invention is now described with reference to FIGS. 35A and 35B.

Figure 35A:
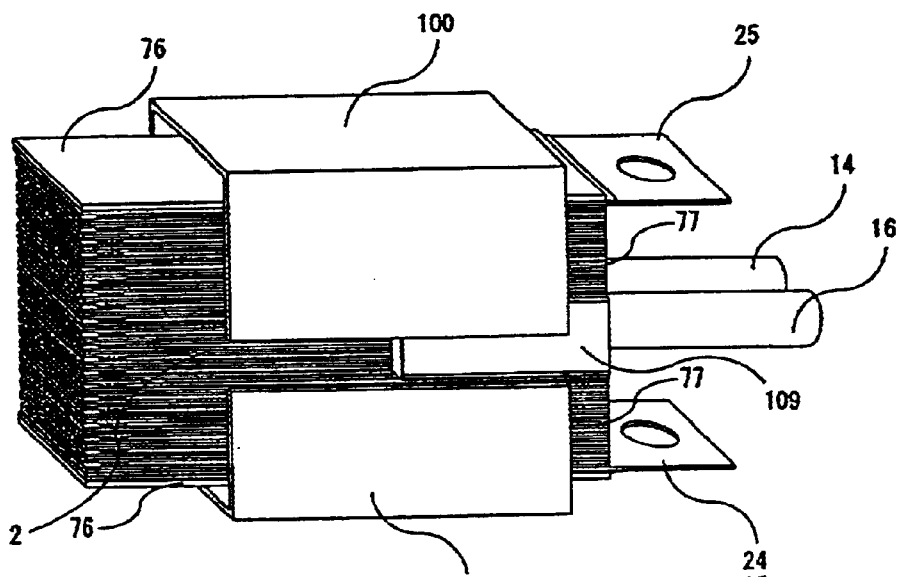
FIGS. 35A and 35B, respectively, are diagrams of a surface emitting device in a 13th embodiment of the present invention, showing the condition thereof both before assembly and after assembly.
Figure 35B:
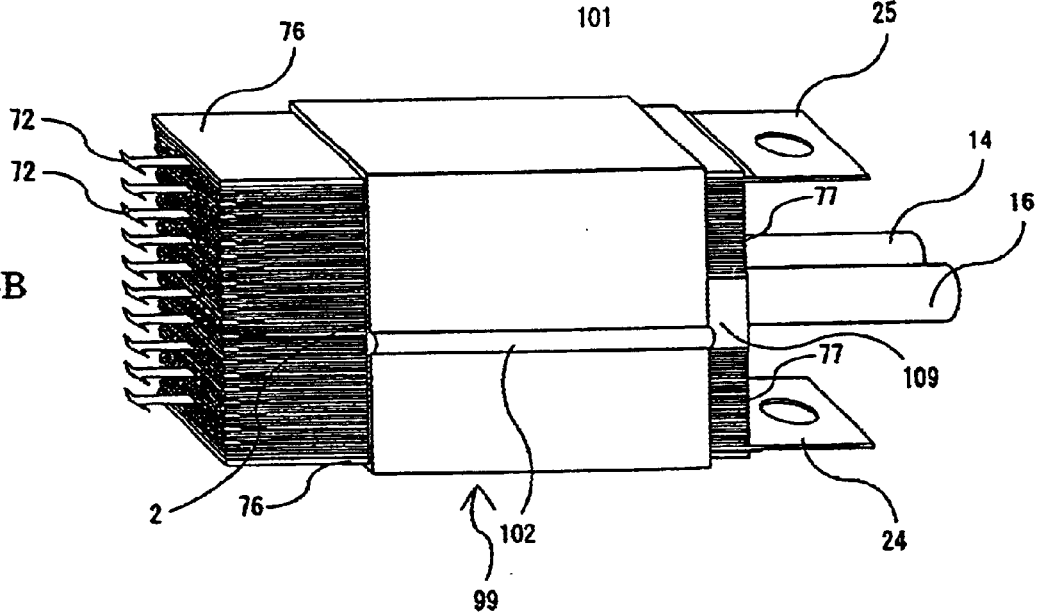

FIG. 35A represents the condition of a surface emitting device 99 according to this embodiment prior to assembly, while FIG. 35B represents that surface emitting device 99 after it has been assembled.

With the surface emitting device 99 relating to this embodiment, two tightening belts 100 and 101 of a divided type having shapes corresponding to the outer shape of the cooling device are attached to the cooling device, which cooling device is made up of a plurality of stacked cooling units, and then that cooling device is subjected to a load in the direction of cooling unit stacking by a weight applying device (not shown). While the load is being placed on the cooling device by the weight applying device, the one tightening belt 100 and the other tightening belt 101 are mutually joined to form a ring shape. As a result, even after the load applied by the weight applying device is removed, the stacked cooling units will be held in a condition wherein pressure is applied in the stacking direction by the tightening belts 100 and 101 formed into the ring shape.

When the belt material is metal, the one tightening belt 100 and the other tightening belt 101 can be mutually joined by a method such as laser welding or electric welding, and when the belt material is a non-metal, an instantaneously acting bonding agent or the like can be used. In FIG. 35B, the metal belts 101 and 101 are joined by welding (cf. weld 102).

In this embodiment, as in the 12th embodiment, the required intensity of tightening on a cooling device made up of stacked cooling units is easily obtained without a tightening bolt, and a surface emitting device having few non-light-emitting parts as seen from the light-emitting surface side can be realized. However, the same tightening belts can be used for cooling devices of slightly different height, and a load can be placed on the entire surface of the cooling device by the weight applying device, wherefore very workable and reliable assembly operations are possible.

14th Embodiment

A 14th embodiment of the present invention is now described with reference to FIGS. 36A and 36B.

Figure 36A:
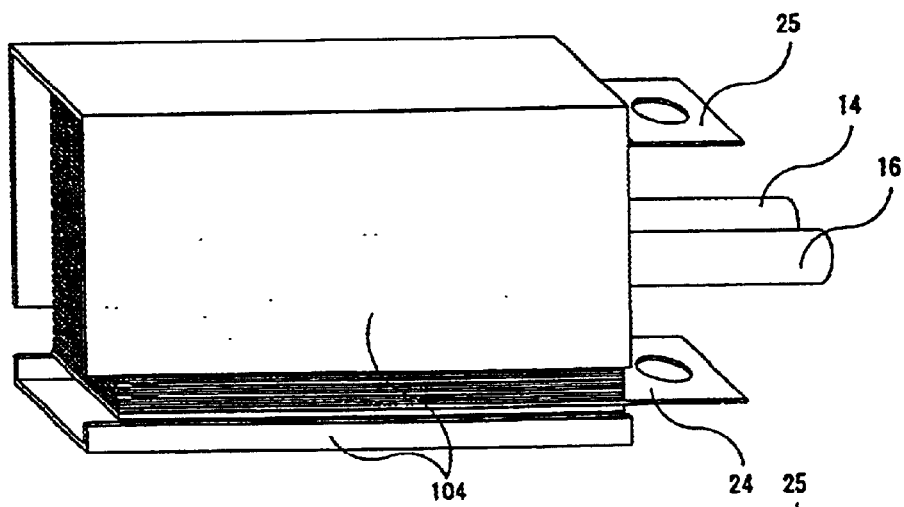
FIGS. 36A and 36B, respectively, are diagrams of a surface emitting device in a 14th embodiment of the present invention, showing the condition thereof both before assembly and after assembly.
Figure 36B:
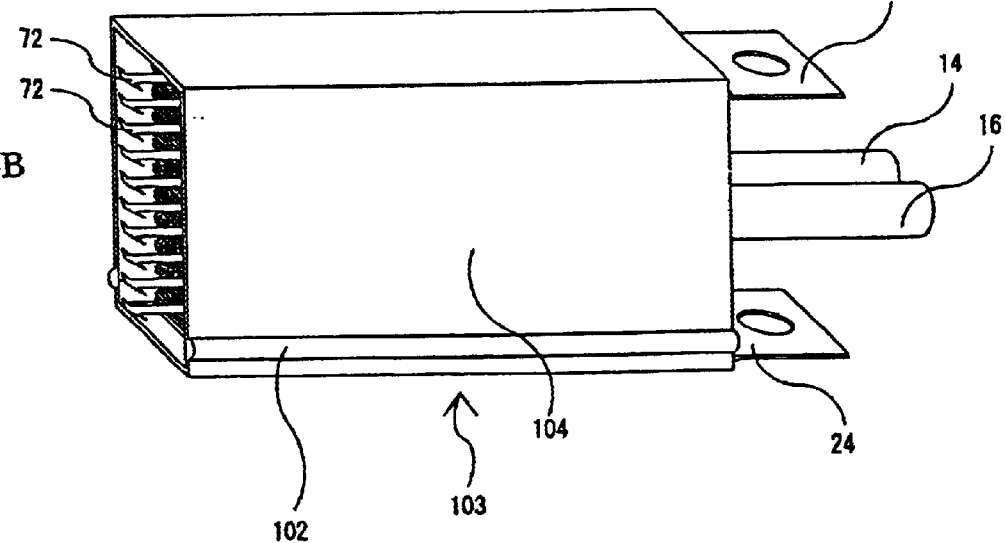

FIG. 36A represents the condition of a surface emitting device 103 according to this embodiment prior to assembly, while FIG. 36B represents that surface emitting device 103 after it has been assembled.

In this embodiment, an outer protective container 104 having a width made even wider than the width of the divided type tightening belts 100 and 101 used in the embodiment diagrammed in FIGS. 35A and 35B is used. This outer protective container 104 is provided, in the surface emitting device, on the light-emitting surface side, so that it sticks out further to the outside than that light-emitting surface. When this outer protective container 104 is made to double as a case, the weld 102 should be made near the bottom side of the surface emitting device for the sake of appearance.

With this embodiment, by making the divided fastening belts to double as an outer protective container for protecting the light-emitting element components, especially the laser bars, a surface emitting device having few non-light-emitting parts as seen from the light-emitting surface side, inclusive of the outer protective container, can be realized while reducing the danger of inadvertent damage during maintenance, etc. As compared to the case where the surface emitting device is mounted in a separately prepared outer protective container, a surface-emitting light source equipped with an outer protective container can be obtained at lower cost.

15th Embodiment

A 15th embodiment of the present invention is now described with reference to FIGS. 37A and 37B.

Figure 37A:
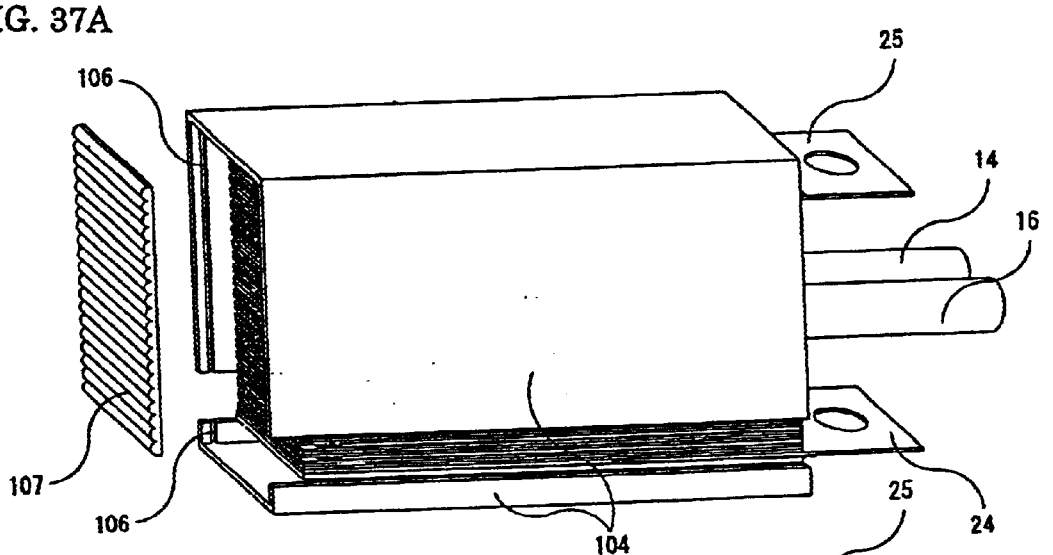
FIGS. 37A and 37B, respectively, are diagrams of a surface emitting device in a 15th embodiment of the present invention, showing the condition thereof both before assembly and after assembly.
Figure 37B:
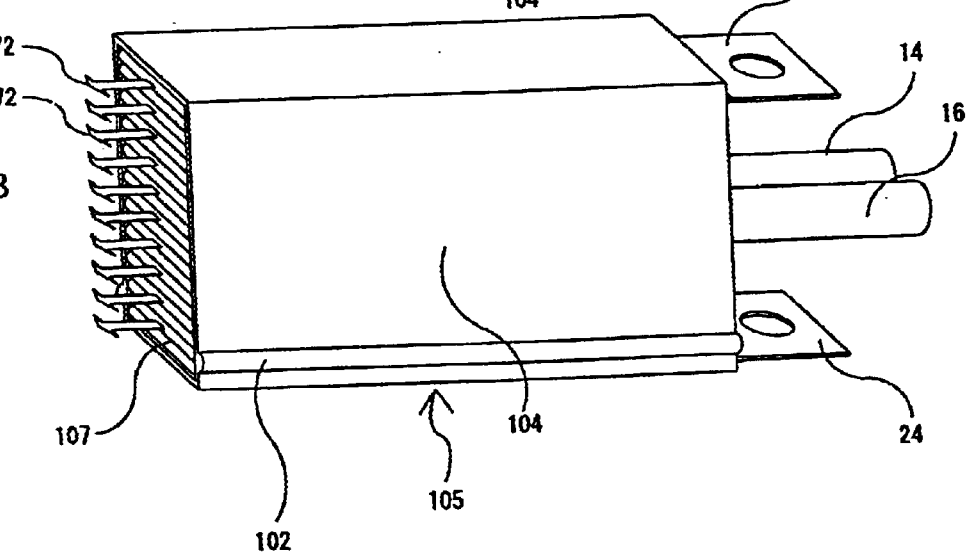

FIG. 37A represents the condition of a surface emitting device 105 according to this embodiment prior to assembly, while FIG. 37B represents that surface emitting device 105 after it has been assembled.

With this embodiment, as diagrammed in FIG. 37A, grooves 106 are provided beforehand on the inside of the portion of the outer protective container 104 (14th embodiment) diagrammed in FIG. 36B that stick out further to the outside from the light-emitting surface of the surface emitting device. Then, using those grooves 106, when assembling the outer protective container 104, an optical member (cylindrical lens array 107) for collimating the first axes of the laser beams emitted from the plurality of laser bars into parallel light is mounted in front of the light-emitting surface, with good positional precision relative to the laser bars.

With this embodiment, an optical member for collimating the laser beams from the laser bars and converting them to parallel light can be installed with good positional precision by tightening belts that double as an outer protective container, whereupon a surface emitting device comprising a collimating optical system can be realized at low cost.

[Large Cooling Unit Manufacturing Method]

A method of manufacturing both the large cooling units used in the 1st, 2nd, 3rd, 6th, 9th, 10th, and 11th embodiments described in the foregoing and the plate-form members configuring those large cooling units is now described.

All of the plate-form members that configure the large cooling units of the present invention have areas where the surface of the raw material metal plate remains unchanged, areas wherein holes such as inflow openings 4, outflow openings 5, tightening bolt holes 30, and guide pin holes 31, etc., are made to pass through, inclusive of the peripheries thereof, and areas where roughly half of the thickness of the plate-form members is dug out, such as for the inflow water passages 32 and outflow water passages 34.

Accordingly, after applying a photoresist to the entirety of the plate-form member, the photoresist is removed from both sides of the plate-form member in those areas where the member is to be completely done away with, while the photoresist is removed from only one side in those areas where roughly half of the thickness is to be dug out, then that plate-form member is immersed in an etching solution, whereupon, if the etching is terminated at a point in time where the etching depth has slightly exceeded the thickness of the plate-form member, a large cooling unit can be obtained with ease. Because of the size of the patterns, moreover, there is no need to perform special etching, and ordinary chemical etching of low process cost can be done.

In FIGS. 38A to 38D are diagrammed plate-form members in the process of being manufactured, and cooling devices to which plate-form members are joined, taking as examples the cooling unit diagrammed in FIGS. 8A to 8D and the large cooling unit diagrammed in FIGS. 9A and 9B.

Many plate-form members are formed from a metal plate constituting the raw material, in a condition wherein they are connected by plate-form member supporting bridges 108. These are stacked as they are, as diagrammed in FIG. 38D, heat and pressure are applied thereto, and they are joined together by diffusion welding or the like to yield a large cooling unit.

Thereupon, if the plate-form member supporting bridges 108 are cut away, the large cooling unit will be complete. Here, however, the connecting metal plates and patterned insulating tapes may be mounted on the large cooling unit diagrammed in FIG. 38D, still connected to the stock plate by bridges with the same pitch, whereupon, after light-emitting element components are packaged and completed, all of the bridges may be cut away simultaneously.

By such a method as this, the large cooling units relating to the embodiments of the present invention can be manufactured in large volume at one time by ordinary chemical etching for which processing costs are low, making it possible to realize cost reductions in cooling devices and in surface emitting devices wherein such cooling devices are used.

In the foregoing, preferred embodiments of the present invention are described, but the present invention is subject to various modifications and alterations within the scope of the gist of the invention.

Now, last of all, the gist of the present invention is stated below.

(1) A cooling unit is connected thermally to an object to be cooled, and comprises a stack structure wherein a plurality of plate-form members are stacked. Cooling liquid flows in from a cooling liquid intake provided in the stack structure, passes through cooling water channels inside the stack structure deployed to the vicinity of the object to be cooled, and is discharged from a cooling liquid outlet provided in the stack structure. The object to be cooled is cooled by the cooling liquid that flows in this manner through the cooling water channels. This cooling unit is stacked in multiple stages, whereupon a cooling device is configured that will cool a plurality of objects to be cooled. For these cooling units that configure this cooling device, two or more types of cooling unit are used wherein the sizes other than the thickness, such as the length in the distance direction from the position where the object to be cooled is supported, differ.

(2) When two types of cooling device of different size are stacked in multiple stages, additional space is formed in the large cooling units because the large cooling units stick out farther than the small cooling units. Also, at least one large cooling unit, in the additional area of which is formed an inflow opening for the cooling liquid, and also at least one large cooling unit, in the additional area of which is formed an outflow opening for the cooling liquid, are used in the cooling device of (1) above.

(3) At least one large cooling unit, in the additional space of which are formed an inflow opening and an outflow opening, is used in the cooling device of (1) above.

(4) At least two large cooling units, in the additional spaces of which are formed either an inflow opening or an outflow opening or both, are used adjacently in the cooling device of (1) above. When such large cooling units are stacked in a plural number, an inflow passage for the cooling liquid and/or an outflow passage for the cooling liquid is formed by having the respective inflow openings and/or outflow openings be in the same corresponding position.

(5) In the small cooling unit are formed an intake opening that is connected to the cooling liquid intake, and an outlet opening that is connected to the cooling liquid outlet. When this small cooling unit is stacked in a plural number, an intake opening connected to the cooling liquid intake and an outlet opening connected to the cooling liquid outlet are formed by having the intake openings and outlet openings be in the same corresponding positions.

(6) By combining and stacking the small cooling units and the large cooling units described above, an intake passage and an outlet passage for the cooling liquid are formed, respectively, by the intake openings and outlet openings provided at corresponding positions in those respective cooling units.

(7) In order to combine and stack the small cooling units and the large cooling units, at least one guide pin hole is provided at corresponding positions in those respective cooling units.

(8) At least one large cooling unit, wherein an inflow opening formed in the additional area of the large cooling unit and an intake opening formed in correspondence to the position of an intake opening formed in a small cooling unit are connected by an inflow water channel provided inside that large cooling unit, is used in the cooling device of (1) above.

(9) At least one large cooling unit, wherein an outflow opening formed in the additional area of the large cooling unit and an outlet opening formed in correspondence to the position of an outlet opening formed in a small cooling unit are connected by an outflow water channel provided inside that large cooling unit, is used in the cooling device of (1) above.

(10) At least one large cooling unit, wherein at least one or the other of the inflow water passage and the outflow water passage of the large cooling unit is formed by a plurality of grooves separated by ridges provided in the plate-form members configuring that large cooling unit, is used in the cooling device of (1) above.

(11) At least one of the grooves provided as an inflow water passage and an outflow water passage in the plate-form members configuring the large cooling unit branches somewhere along the way.

(12) One large cooling unit is configured of a plural number of plate-form members, in at least one whereof is provided grooves each constituting an inflow water passage or an outflow water passage.

(13) At least one of the ridges provided in the plate-form members configuring the large cooling unit is joined to one other plate-form member stacked thereon.

(14) In configuring one cooling unit by a stack structure wherein a plurality of plate-form members is stacked, each of the plate-form members configuring that stack structure is configured of an electrically conductive metal material having a coefficient of thermal conductivity of 1.5 W/cm/K or higher.

(15) Of the multiple plate-form members configuring the stack structure, there are at least two having the same structure, one whereof is stacked in a condition wherein it is turned over relative to the other.

(16) Of the plurality of large cooling units configuring a cooling device, there are at least two having the same structure, one whereof is incorporated into the cooling device in a condition wherein it is turned over relative to the other.

(17) Small cooling units are deployed so as to sandwich at least one large cooling unit, with at least one small cooling unit respectively deployed on each of the two sides thereof. Thereupon, while additional area is formed in that large cooling unit, at the back thereof, in the small cooling units, at positions corresponding to the additional area in the large cooling unit, extra space is formed, respectively. Thereupon, first and second tightening parts are deployed in those extra spaces.

In the first tightening part are formed a cooling liquid induction port connected to an induction pipeline for inducting cooling liquid from a cooling liquid supply unit, and a cooling liquid discharge port connected to a discharge pipeline for returning the cooling liquid back to the cooling liquid supply unit. Also, in the first tightening part that occupies at least part of the extra space noted earlier, the cooling liquid induction port corresponds to the inflow openings in the large cooling units, and the cooling liquid discharge port corresponds to the outflow openings in the large cooling units.

Also, the first tightening part and the second tightening part tighten the plurality of stacked cooling units, so that the gaps between the cooling units are reduced, with elastic spacer members interposed, so that cooling liquid does not leak from between the cooling units.

(18) Small cooling units are deployed so as to sandwich at least one large cooling unit, with at least one small cooling unit, respectively, deployed on each of the two sides thereof. Thereupon, an additional area is formed in that large cooling unit, at the back thereof, while, in the small cooling units, at positions corresponding to the additional area in the large cooling unit, extra space is formed, respectively. Thereupon, first and second tightening parts are deployed in those extra spaces.

In this first tightening part is provided a cooling liquid induction port that is connected to the induction pipeline. And, in this first tightening part, which occupies at least some of the extra space noted above, the cooling liquid induction port therein corresponds to the inflow openings in the large cooling units.

In the second tightening part, on the other hand, is provided a cooling liquid discharge port that is connected to the discharge pipeline. And, in this second tightening part, which occupies at least some of the extra space noted above, the cooling liquid discharge port therein corresponds to the outflow openings in the large cooling units.

Also, the first tightening part and the second tightening part tighten the plurality of stacked cooling units, so that the gaps between the cooling units are reduced, with elastic spacer members interposed, so that cooling liquid does not leak from between the cooling units.

(19) In at least one of either the first or second tightening part in (17) or (18) above the thickness of the portion deployed outside of the small cooling units is made thinner than the portion deployed in the extra space noted above.

(20) In at least one of the large cooling units in (17) or (18) above, at least one or other of the inflow opening or outflow opening does not pass all the way through in the direction of the thickness of that large cooling unit.

(21) One large cooling unit that is a large cooling unit in (20) above, wherein is formed an inflow opening that does not pass all the way through in the thickness direction, is used as a large cooling unit wherein is formed an outflow opening that does not pass all the way through in the thickness direction, by being turned over.

(22) In at least one of the small cooling units stacked and deployed farthest to the outside, either an intake opening or outlet opening provided therein does not pass all the way through in the direction of the thickness of that small cooling unit.

(23) In a first small cooling unit stacked and deployed farthest to the outside, either an intake opening or outlet opening provided therein does not pass all the way through in the direction of the thickness of that small cooling unit. A second small cooling unit stacked and deployed farthest to the outside on the other end is one having the same structure as the first small cooling unit but which has been turned over.

(24) In either a first tightening part or a second tightening part is provided at least one or other of a cooling liquid induction port that is connected to the induction pipeline and a cooling liquid discharge port that is connected to the discharge pipeline. That first tightening part or second tightening part is, moreover, deployed so that a cooling liquid induction port or cooling liquid discharge port therein corresponds to the inflow openings or outflow openings in all of the large cooling units that have been arranged in parallel in multiple stages.

(25) By means of a first tightening part and a second tightening part, a plurality of stacked cooling units is tightened so as to reduce the gaps between the cooling units, with elastic spacer materials interposed, so that the cooling liquid does not leak from between the cooling units. A tightening belt or belts are used for this tightening.

(26) Large cooling units are deployed so as to sandwich at least one small cooling unit, with at least one of those large cooling units deployed on each side of that small cooling unit. When this is done, additional area is formed in the large cooling units, at the back thereof, while extra space is formed in the small cooling units, at positions corresponding to those additional areas in those large cooling units, respectively. Thereupon, spacer parts are deployed in those extra spaces. In these spacer parts are provided cooling liquid induction ports that connect to the induction pipeline and cooling liquid discharge ports connected to the discharge pipeline. In the spacer parts that occupy some of those extra spaces, the cooling liquid induction ports thereof correspond to the inflow ports of the large cooling units and the cooling liquid discharge ports thereof correspond to the outflow ports of the large cooling units.

Also, tightening is done by a tightening belt from the outside of the plurality of stacked cooling units so that the gaps between the cooling units are reduced, with elastic spacer members interposed, so that the cooling liquid does not leak out from between those stacked cooling units.

(27) In at least one of the large cooling units stacked and deployed farthest to the outside, at least one opening out of the inflow opening, outflow opening, intake opening, and outlet opening does not pass all the way through in the direction of the thickness of that large cooling unit.

(28) In a first large cooling unit stacked and deployed farthest to the outside, the inflow opening, outflow opening, intake opening, and outlet opening therein do not pass all the way through in the direction of the thickness of that large cooling unit. Also, the second large cooling unit stacked and deployed farthest to the outside at the other end has the same structure as the first large cooling unit but has been turned over.

(29) A tightening belt is in a ring shape, and a plurality of stacked cooling units is pushed inside that tightening belt.

(30) A plurality of stacked cooling units is pushed down on so that it is compressed, so that the gaps between the cooling units are reduced, with elastic spacer members interposed, so that the cooling liquid does not leak out from between those stacked cooling units. Then a tightening belt piece is wrapped around that pressed-down plurality of stacked cooling units, and the two end edges of that tightening belt piece are joined by welding or bonding to form a ring shape. As a result, the condition wherein the cooling units are tightened so that the gaps therebetween are reduced is maintained even after the force pressing against those stacked cooling units so as to compress them has been removed.

(31) The cooling unit is thermally connected to the object to be cooled, and comprises a stack structure wherein a plurality of plate-form members is stacked. Cooling liquid flows in from a cooling liquid intake provided in the stack structure, passes through cooling water passages provided as far as the vicinity of the object to be cooled, inside the stack structure, and is discharged from a cooling liquid discharge port provided in the stack structure. The object to be cooled is thus cooled by the cooling liquid that flows through the cooling water passages. This cooling unit is stacked in multiple stages, whereupon a cooling device is configured which cools a plurality of objects to be cooled. For these cooling units that configure this cooling device, two or more types of cooling unit are used wherein the sizes other than the thickness, such as the length in the distance direction from the position where the object to be cooled is supported, differ.

In the plate-form parts that configure the large cooling units, inflow openings and outflow openings for the cooling liquid, and grooves for inflow water channels and grooves for outflow water channels connected, respectively, to those inflow openings and outflow openings, are formed by a chemical etching method wherein resist patterns are used.

(32) In forming the plurality of plate-form members that configure the large cooling units, the same process steps are applied as for forming the plurality of plate-form members that configure the small cooling units, except in that different resist patterns are used for those plate-form members, respectively.

(33) A surface emitting device is configured from the cooling device indicated from (1) to (30) above, and from laser diode arrays each comprising a plurality of laser diodes as the plurality of objects to be cooled.

(34) The laser diode arrays supported by small cooling units and the laser diode arrays supported by large cooling units are one-dimensional laser diode arrays. These laser diode arrays are supported at positions proximate to the outer circumference of the cooling units, and, in a condition wherein a plurality of cooling units is stacked together, they are deployed roughly mutually in parallel roughly within one plane, and a light-emitting surface is formed that emits laser light in a direction toward the outside of the cooling device wherein the cooling units are stacked.

(35) In the one-dimensional laser diode array, electrical and thermal contact is effected on the plate-form members that, of the plurality of plate-form members configuring the cooling unit, are on the outside. On the upper surface of each of these outside plate-form members, in the portions where the one-dimensional laser diode array is deployed, an intake opening, outlet opening, inflow opening, and outflow opening, and, in the area from which the peripheral portions thereof have been removed, a connecting metal plate are bonded, with an intervening patterned insulating tape on both sides whereof a bonding agent is applied and which has roughly the same pattern as the connecting metal plate. Then, an electrode on the opposite side from that whereon the one-dimensional laser diode array contacts the plate-form members noted above is connected to that connecting metal plate. In a condition wherein cooling units are stacked, moreover, the next cooling unit deployed adjacent to the connecting metal plate and that connecting metal plate are electrically connected.

(36) Elastic spacer members are deployed in the portions for the respective intake openings, outlet openings, and peripheries thereof, and in the portions for the respective inflow openings, outflow openings, and peripheries thereof, that are not covered by the connecting metal plate and the patterned insulating tape. These elastic spacer members are made slightly thicker than the sum of the thicknesses of the connecting metal plate and the patterned insulating tape, and are provided with openings corresponding to the aforementioned openings. By deploying these elastic members, cooling liquid is prevented from leaking out from between the cooling units resulting from the stacking of the plurality of cooling units.

(37) The individual large cooling units and the individual large cooling units all have roughly the same thickness, the thicknesses of the connecting metal plates bonded to each of the cooling units are mutually the same, the thicknesses of the patterned insulating tapes noted above which are used in each of the cooling units are mutually the same, and the one-dimensional laser diode arrays supported by each of the cooling units are deployed with roughly the same pitch.

(38) A surface emitting device is configured by the cooling device described in (30) above and one-dimensional laser diode arrays comprising a plurality of laser diodes. A tightening belt is also provided such that it sticks out from the light-emitting surface.

(39) A cylindrical lens array that is for collimating the first axis of the laser beams emitted from the one-dimensional laser diode arrays is deployed on the outside of the light-emitting surface, and that cylindrical lens array is supported by the portion of the tightening belt that sticks out from the light-emitting surface.

What is claimed is:

1. A cooling device wherein planar cooling units, on which heat-generating electronic parts to be cooled are mounted, are stacked parallel from a first end to a second end along an axis, said cooling units comprising first cooling units and second cooling units, wherein each of said first cooling units includes,
at least one first opening which opens to a first cooling liquid supply passage passing through a first portion transverse of the axis of at least two of said stacked cooling units to supply cooling liquid to each of said parts to be cooled, and
at least one second opening which opens to a first cooling liquid discharge passage passing through a second different transverse portion of at least two of said stacked cooling units to discharge to outside of the cooling device said cooling liquid that has cooled each of said parts, wherein each of said second cooling units includes,
at least one third opening which opens to the first cooling liquid supply passage,
at least one fourth opening which opens to the first cooling liquid discharge passage, and
at least one fifth opening which opens to a second cooling liquid supply passage which is different from said first cooling liquid supply passage and which passes through a third different transverse portion of at least two of said stacked cooling units and is in fluid communication with said first cooling liquid supply passage, and through which the cooling liquid is supplied from outside of the cooling device, and wherein a length of said second cooling unit is greater than a corresponding length of said first cooling unit, so that said second cooling unit has an extended portion which extends beyond said first cooling unit.

2. The cooling device according to claim 1, wherein said at least one fifth opening which opens to said second cooling liquid supply passage is provided in said extended portion of the second cooling unit.

3. The cooling device according to claim 2, wherein said first cooling liquid supply passage is in fluid communication with said second cooling liquid supply passage via a plurality of flow passages partitioned by ridges.

4. The cooling device according to claim 2, further comprising pressure bonding means for pressure bonding said stacked cooling units.

5. The cooling device according to claim 4, wherein said pressure bonding means is a belt or belts that securely tighten said stacked cooling units.

6. The cooling device according to claim 1, further comprising a cooling liquid induction pipeline that is connected to said second cooling liquid supply passage.

7. The cooling device according to claim 1, wherein said extended portion of the second cooling unit is formed with at least one sixth opening which opens to a second cooling liquid discharge passage which is different from said first cooling liquid discharge passage, and passes through a fourth different transverse portion of at least two of the stacked cooling units through which said cooling liquid is discharged to the outside of the cooling device.

8. The cooling device according to claim 1, further comprising:
third cooling units, each of which has sixth, seventh and eighth openings which open, respectively, to said first cooling liquid supply passage, said first cooling liquid discharge passage and to a second cooling liquid discharge passage, which is in a fourth different transverse portion of at least two of the stacked cooling units and is in fluid communication with the first cooling liquid discharge passage, wherein a length of said third cooling unit is greater than a corresponding length of said first cooling unit, and less than or equal to the length of the second cooling units so that said third cooling unit has an extended portion which extends beyond said first cooling unit, and wherein the third cooling units are located adjacent at least one of the first and second cooling units, wherein the eighth opening which opens to said second liquid cooling discharge passage is provided in the extended portion of the third cooling units.

9. The cooling device according to claim 8, further comprising a cooling liquid discharge line that is connected to said second cooling liquid discharge passage.

10. The cooling device according to claim 1, wherein the parts to be cooled are laser diode arrays.

11. A surface light emitting device wherein planar laser diode arrays to be cooled are mounted on cooling units and are stacked parallel from a first end to a second end along an axis, said cooling units comprising:

first cooling units and second cooling units,
wherein each of said first cooling units includes,
at least one first opening which opens to a first cooling liquid supply passage passing through a first portion transverse of the axis of at least two of the stacked cooling units to supply cooling liquid to each of said laser diode arrays to be cooled, and
at least one second opening which opens to a first cooling liquid discharge passage passing through a second different transverse portion of at least two of said cooling units to discharge to outside of the cooling device said cooling liquid that has cooled each of said laser diode arrays, wherein each of said second cooling units includes,
at least one third opening which opens to the first cooling liquid supply passage,
at least one fourth opening which opens to the cooling liquid discharge passage, and
at least one fifth opening which opens to a second cooling liquid supply passage which is different from said first cooling liquid supply passage and which passes through a third different transverse portion of at least two of the stacked cooling units and is in fluid communication with said first cooling liquid supply passage, and through which the cooling liquid is supplied from outside of the cooling device, and wherein a length of said second cooling unit is greater than a corresponding length of said first cooling unit, so that said second cooling unit has an extended portion which extends beyond said first cooling unit.

12. The surface emitting device according to claim 11, further comprising a belt or belts that securely tighten said stacked cooling units.

13. The surface emitting device according to claim 12, further comprising lenses deployed in opposition to a surface formed by said stacked laser diode arrays and held by said belt or belts.

14. A surface emitting device comprising the cooling device recited in claim 1.

15. A surface emitting device comprising the cooling device recited in claim 2.

16. A surface emitting device comprising the cooling device recited in claim 2.

* * * * *

UNITED STATES PATENT AND TRADEMARK OFFICE
CERTIFICATE OF CORRECTION

PATENT NO.   : 6,643,302 B1
DATED        : November 4, 2003
INVENTOR(S)  : Yuji Nishikawa et al.

It is certified that error appears in the above-identified patent and that said Letters Patent is hereby corrected as shown below:

Title page,
Item [57], ABSTRACT,
Please delete the ABSTRACT in its entirety and replace with the following:

--ABSTRACT OF THE DISCLOSURE

A cooling device includes stacked cooling units on which laser diode arrays are mounted. Intake openings pass through first portions in the cooling units to conduct cooling liquid about the peripheries of each of the laser diode arrays. Outlet openings pass through second portions of the cooling units to discharge to the outside of the cooling device the cooling liquid that has cooled each of the laser diode arrays. Inflow openings pass through third portions in the cooling units, and are connected to the intake openings, and through which cooling liquid is supplied from the outside.--

Column 2,
Line 42, change "opening 9" to -- opening 8 --

Col;umn 19,
Line 18, change "The second" to -- Similarity, the second --

Signed and Sealed this

First Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,643,302 B1
DATED : November 4, 2003
INVENTOR(S) : Yuji Nishikawa et al.

It is certified that error appears in the above-identified patent and that said Letters Patent is hereby corrected as shown below:

Column 40,
Line 65, change "claim 2" to -- claim 7 --

Signed and Sealed this

Twenty-fifth Day of January, 2005

JON W. DUDAS
*Director of the United States Patent and Trademark Office*